(12) United States Patent
Moriya et al.

(10) Patent No.: US 8,502,708 B2
(45) Date of Patent: Aug. 6, 2013

(54) ENCODING METHOD AND DECODING METHOD, AND DEVICES, PROGRAM AND RECORDING MEDIUM FOR THE SAME

(75) Inventors: Takehiro Moriya, Kanagawa (JP); Noboru Harada, Kanagawa (JP); Yutaka Kamamoto, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 140 days.

(21) Appl. No.: 13/132,418

(22) PCT Filed: Dec. 8, 2009

(86) PCT No.: PCT/JP2009/070550
§ 371 (c)(1),
(2), (4) Date: Jul. 5, 2011

(87) PCT Pub. No.: WO2010/067799
PCT Pub. Date: Jun. 17, 2010

(65) Prior Publication Data
US 2011/0254713 A1    Oct. 20, 2011

(30) Foreign Application Priority Data

Dec. 9, 2008    (JP) .................................. 2008-313582

(51) Int. Cl.
*H03M 7/34*    (2006.01)
(52) U.S. Cl.
USPC .................. 341/51; 341/59; 341/63; 341/65; 341/70; 382/238; 382/239; 382/323; 382/244; 704/205; 704/222; 704/221; 704/219; 375/259; 375/285; 375/240.13; 375/240.23; 375/240.02
(58) Field of Classification Search
USPC .................. 341/50–90; 375/240.13, 240.02, 375/240.23, 240.12, E7.243, E7.144, E7.126, 375/E7.027, 259, 285; 382/238, 239, 232, 382/244; 704/205, 222, 221, 219
See application file for complete search history.

(56) References Cited

U.S. PATENT DOCUMENTS 4,727,421 A * 2/1988 Koga ........................ 375/240.14
5,245,428 A * 9/1993 De With et al. .......... 375/240.24
(Continued)

FOREIGN PATENT DOCUMENTS

JP    2000 503510    3/2000
JP    2007 279393    10/2007
(Continued)

OTHER PUBLICATIONS

U.S. Appl. No. 13/202,335, filed Aug. 19, 2011, Moriya, et al.
(Continued)

*Primary Examiner* — Lam T Mai
(74) *Attorney, Agent, or Firm* — Oblon, Spivak, McClelland, Maier & Neustadt, L.L.P.

(57) ABSTRACT

Information that includes first information identifying integer quotients obtained by divisions using prediction residuals or integers not smaller than 0 that increase monotonically with increases in the amplitude of the prediction residuals, as dividends, and a separation parameter decided for a time segment corresponding to the prediction residuals or a mapped integer value of the separation parameter, as a modulus, and second information identifying the remainders obtained when the dividends are divided by the modulus is generated as a code corresponding to the prediction residuals, and each piece of side information that includes the separation parameter is subjected to variable length coding.

28 Claims, 44 Drawing Sheets

(56) References Cited

U.S. PATENT DOCUMENTS

| | | | | |
|---|---|---|---|---|
| 5,592,228 | A * | 1/1997 | Dachiku et al. | 348/416.1 |
| 5,796,435 | A * | 8/1998 | Nonomura et al. | 375/240.03 |
| 6,041,302 | A | 3/2000 | Bruckers | |
| 6,466,625 | B1 * | 10/2002 | Kobayashi et al. | 375/240.29 |
| 6,549,676 | B1 * | 4/2003 | Nakayama et al. | 382/246 |
| 6,556,625 | B2 * | 4/2003 | Haskell et al. | 375/240.2 |
| 7,689,051 | B2 * | 3/2010 | Mukerjee | 382/244 |
| 7,783,119 | B2 * | 8/2010 | Kajiwara | 382/238 |
| 7,860,709 | B2 * | 12/2010 | Makinen | 704/219 |
| 7,903,891 | B2 * | 3/2011 | Sugimoto et al. | 382/238 |
| 8,160,157 | B2 * | 4/2012 | Lamy-Bergot et al. | 375/240.26 |
| 8,285,062 | B2 * | 10/2012 | Liu et al. | 382/239 |

FOREIGN PATENT DOCUMENTS

| | | |
|---|---|---|
| JP | 2007 286146 | 11/2007 |
| JP | 2007 286200 | 11/2007 |
| JP | 2007 318691 | 12/2007 |
| JP | 2008 026460 | 2/2008 |

OTHER PUBLICATIONS

Liebchen, T.; et al. "MPEG-4 ALS: an Emerging Standard for Lossless Audio Coding." Proceedings of the Data Compression Conference. pp. 439-448 (2004).

Kamamoto, Y.; et al. "Improvement of Lossless Audio Coding MPEG-4 ALS." NTT GIJUTSU Journal, vol. 20, No. 2. pp. 11-18. (2008). (With partial English translation).

Liebchen, T. "An Introduction to MPEG-4 Audio Lossless Coding." Acoustics, Speech, and Signal Processing, vol. 3. pp. III-1012-III-1015 (2004).

Hans, M.; et al. "Lossless Compression of Digital Audio." IEEE Signal Processing Magazine, vol. 18, No. 4, pp. 21-32 (Jul. 2001).

Information technology—Coding of audio visual objects—Part 3: Audio. "Amendment 2: Audio Lossless Coding (ALS), new audio profiles and BSAC extensions." ISO-IEC 14496-3:2005 FDAM 2. pp. 1-83 (2005).

General Aspects of Digital Transmission Systems—Terminal Equipments. "Pulse Code Modulation (PCM) of Voice Frequencies." ITU-T Recommendation G.711. pp. 1-10 (1988).

Kamamoto, Y.; et al. "Lossless Compression of Multi-channel Signals Using Inter-channel Correlation." IPSJ Journal, vol. 46, No. 5. pp. 1118-1128. (May 2005). (With partial English translation).

Kamamoto, Y.; et al. "Intra- and Inter-Channel Long-Term Prediction in ISO/IEC MPEG-4 Audio Lossless Coding (ALS)." The IEICE Transactions on Communications, vol. J89-B, No. 2. pp. 214-222, total pages: 6. (Feb. 2006). (With partial English translation).

International Search Report Issued Feb. 23, 2010 in PCT/JP09/70550 filed Dec. 8, 2009.

Office Action issued Jul. 5, 2011, in Japanese Patent Application No. 2010-542107 with English translation.

\* cited by examiner

FIG.10A

| s\h | 0 | 1 | 2 | 3 | 4 | OTHERS |
|---|---|---|---|---|---|---|
| 0 | T[0,0] | T[0,1] | T[0,2] | T[0,3] | T[0,4] | T[0,E] |
| 1 | T[1,0] | T[1,1] | T[1,2] | T[1,3] | T[1,4] | T[1,E] |
| 2 | T[2,0] | T[2,1] | T[2,2] | T[2,3] | T[2,4] | T[2,E] |
| 3 | T[3,0] | T[3,1] | T[3,2] | T[3,3] | T[3,4] | T[3,E] |
| 4 | T[4,0] | T[4,1] | T[4,2] | T[4,3] | T[4,4] | T[4,E] |

FIG.10B

| s\h | 0 | 1 | 2 | 3 | 4 | OTHERS |
|---|---|---|---|---|---|---|
| 0 | △ | △ | ◎ | ◎ | ○ | △ |
| 1 | △ | △ | ◎ | ◎ | △ | △ |
| 2 | ○ | ○ | ○ | ◎ | △ | △ |
| 3 | ○ | ○ | ○ | ○ | △ | △ |
| 4 | △ | △ | ○ | ○ | △ | △ |

| INPUT VALUE | CODE | NUMBER OF BITS |
|---|---|---|
| 0 | 0 | 1 |
| 1 | 10 | 2 |
| 2 | 110 | 3 |
| 3 | 1110 | 4 |
| 4 | 11110 | 5 |
| 5 | 111110 | 6 |
| 6 | 1111110 | 7 |
| 7 | 11111110 | 8 |

| INPUT VALUE | CODE | NUMBER OF BITS |
|---|---|---|
| 0 | 0 | 1 |
| 1 | 10 | 2 |
| 2 | 110 | 3 |
| 3 | 1110 | 4 |
| 4 | 11110 | 4 |
| 5 | 111110 | 6 |
| 6 | 1111110 | 7 |
| 7 | 1111111 | 7 |

| INPUT VALUE | CODE | NUMBER OF BITS |
|---|---|---|
| 0 | 01 | 2 |
| 1 | 1 | 1 |
| 2 | 001 | 3 |
| 3 | 0010 | 4 |
| 4 | 00110 | 5 |
| 5 | 001110 | 6 |
| 6 | 0011110 | 7 |
| 7 | 0011111 | 7 |

FIG.12

| [h,s] | CODE |
|---|---|
| [0,2] | 0 |
| [0,3] | 10 |
| [1,2] | 110 |
| [1,3] | 1110 |
| [2,2] | 11110 |
| [2,3] | 111110 |
| [2,0] | 1111111 |
| [2,1] | 11111100 |
| [3,2] | 111111010 |
| ⋮ | ⋮ |
| [4,E] | 111111...10 |

FIG.23A

| h \ s | 0 | 2 | 4 | OTHERS |
|---|---|---|---|---|
| 0 | T[0,0] | T[0,2] | T[0,4] | T[0,E] |
| 1 | × | T[1,2] | T[1,4] | T[1,E] |
| 2 | × | T[2,2] | × | × |
| 3 | × | T[3,2] | × | × |
| 4 | × | T[4,2] | × | × |

FIG.23B

| h \ s | 0 | 2 | 4 | OTHERS |
|---|---|---|---|---|
| 0 | △ | ◎ | △ | △ |
| 1 | × | ◎ | △ | △ |
| 2 | × | ○ | × | × |
| 3 | × | ○ | × | × |
| 4 | × | ○ | × | × |

FIG.24A

| h \ s | ALL |
|---|---|
| 0 | T[0,A] |
| 1 | T[1,A] |
| 2 | T[2,A] |
| 3 | T[3,A] |
| 4 | T[4,A] |

FIG.24B

| h \ s | ALL |
|---|---|
| 0 | ◎ |
| 1 | ◎ |
| 2 | ○ |
| 3 | ○ |
| 4 | △ |

FIG.24C

| h \ s | 0 | 1 | 2 | 3 | 4 | OTHERS |
|---|---|---|---|---|---|---|
| 0 | T[0,0] | T[0,1] | T[0,2] | T[0,3] | T[0,4] | T[0,E] |

FIG.24D

| h \ s | 0 | 1 | 2 | 3 | 4 | OTHERS |
|---|---|---|---|---|---|---|
| 0 | △ | △ | ◎ | ◎ | △ | △ |

FIG.27A

| h \ s | 0 | 1 | 2 (LOWER) | 2 (UPPER) | 3 (LOWER) | 3 (UPPER) | 4 | OTHERS |
|---|---|---|---|---|---|---|---|---|
| 0 | T[0,0] | T[0,1] | T[0,2,L] | T[0,2,U] | T[0,3,L] | T[0,3,U] | T[0,4] | T[0,E] |
| 1 | × | T[1,1] | T[1,2,L] | T[1,2,U] | T[1,3,L] | T[1,3,U] | T[1,4] | T[1,E] |
| 2 | × | T[2,1] | T[2,2,L] | T[2,2,U] | T[2,3,L] | T[2,3,U] | × | × |
| 3 | × | T[3,1] | T[3,2,L] | T[3,2,U] | T[3,3,L] | T[3,3,U] | × | × |
| 4 | × | × | T[4,2,L] | T[4,2,U] | T[4,3,L] | T[4,3,U] | × | × |

FIG.27B

| h \ s | 0 | 1 | 2 (LOWER) | 2 (UPPER) | 3 (LOWER) | 3 (UPPER) | 4 | OTHERS |
|---|---|---|---|---|---|---|---|---|
| 0 | △ | ○ | ◎ | ◎ | ◎ | ◎ | △ | △ |
| 1 | × | ○ | ◎ | ◎ | ◎ | ◎ | △ | △ |
| 2 | × | △ | ○ | ○ | ○ | ○ | × | × |
| 3 | × | △ | △ | △ | ○ | △ | × | × |
| 4 | × | × | △ | △ | ○ | △ | × | × |

FIG.28A

| T[0,2,L] | | |
|---|---|---|
| INPUT VALUE | CODE | NUMBER OF BITS |
| 0 | 0 | 1 |
| 1 | 10 | 2 |
| 2 | 110 | 3 |
| 3 | 1110 | 4 |
| 4 | 11110 | 5 |
| 5 | 111110 | 6 |
| 6 | 1111110 | 7 |
| 7 | 11111110 | 8 |

FIG.28B

| T[0,2,U] | | |
|---|---|---|
| INPUT VALUE | CODE | NUMBER OF BITS |
| 0 | 0 | 1 |
| 1 | 10 | 2 |
| 2 | 110 | 3 |
| 3 | 1110 | 4 |
| 4 | 11110 | 4 |
| 5 | 111110 | 6 |
| 6 | 1111110 | 7 |
| 7 | 1111111 | 7 |

FIG.29

| [h,s,add] | CODE |
|---|---|
| [0,2,L] | 0 |
| [0,3,L] | 10 |
| [0,2,U] | 110 |
| [0,3,U] | 1110 |
| [1,2,L] | 11110 |
| [1,2,U] | 111110 |
| [1,3,L] | 1111111 |
| [1,3,U] | 11111100 |
| [2,2] | 111111010 |
| ⋮ | ⋮ |
| [4,1] | 111111...10 |

FIG.32

| H=h₁|h₂ \ s | 0 | 2 | 4 |
|---|---|---|---|
| 00 | ○ | ◎ | ○ |
| 01 | ○ | ◎ | ○ |
| 02 | △ | ○ | △ |
| 03 | △ | ○ | △ |
| 10 | ○ | ◎ | ○ |
| 11 | ○ | ◎ | ○ |
| 12 | △ | ○ | ○ |
| 13 | △ | ○ | △ |
| 20 | × | ○ | △ |
| 21 | × | ○ | △ |
| 22 | × | △ | △ |
| 23 | × | △ | △ |
| 30 | × | ○ | △ |
| 31 | × | △ | × |
| 32 | × | △ | × |
| 33 | × | △ | × |

FIG.37

| S=s₁|s₂ \ h | 00 | 01 | 02 | 10 | 11 | 12 | 20 | 21 | 22 |
|---|---|---|---|---|---|---|---|---|---|
| 0 | ◁ | ◁ | ◎ | ◁ | ◁ | ◎ | ◎ | ◎ | ◎ |
| 1 | × | ◁ | ○ | × | ◁ | ○ | ○ | ○ | ◎ |
| 2 | × | ◁ | ○ | × | ◁ | ○ | ○ | ○ | ○ |
| 3 | × | ◁ | ○ | × | ◁ | ○ | ◁ | ◁ | ○ |

FIG.42

| S=s₁|s₂ <br> H=h₁|h₂ | 00 | 01 | 02 | 10 | 11 | 12 | 20 | 21 | 22 |
|---|---|---|---|---|---|---|---|---|---|
| 00 | × | ◁ | ◎ | ◁ | ◁ | ◎ | ◎ | ◎ | ◎ |
| 01 | × | ◁ | ○ | × | ◁ | ○ | ○ | ◎ | ◎ |
| 02 | × | ◁ | ◁ | × | ◁ | ○ | ○ | ○ | ◎ |
| 03 | × | × | ◁ | × | ◁ | ○ | ○ | ○ | ◎ |
| ⋮ |  |  |  |  |  |  |  |  |  |
| 32 | × | ◁ | ○ | × | ◁ | ◁ | ◁ | ○ | ○ |
| 33 | × | ◁ | ○ | × | ◁ | ◁ | ◁ | ◁ | ○ |

ENCODING METHOD AND DECODING METHOD, AND DEVICES, PROGRAM AND RECORDING MEDIUM FOR THE SAME

TECHNICAL FIELD

The present invention relates to a technology for encoding time-series signals by performing prediction analysis, and more specifically, to encoding methods of prediction residuals and decoding methods, and devices, programs and recording media for the same.

BACKGROUND ART

When time-series signals such as audio signals and video information are transmitted on a communication channel or recorded on an information recording medium, it is effective in terms of transmission efficiency or recording efficiency to transmit or record the time-series signals after they are converted to compressed codes. In recent years, increasing use of broadband access and increasing capacity of storage devices have caused greater importance to lossless compression encoding methods that allow the original signal to be reproduced losslessly, rather than lossy compression encoding methods that place the highest priority on high compression rates (refer to non-patent literature 1, for example). In those circumstances, a technology for performing lossless compression encoding of audio signals by using element technologies such as linear prediction analysis has been approved by the Moving Picture Expert Group (MPEG) as an international standard named MPEG-4 ALS (refer to non-patent literature 2, for example).

FIG. 1 is a block diagram illustrating the functional configuration of an encoder 2100 using a conventional lossless compression encoding method. FIG. 2 is a block diagram illustrating the functional configuration of a residual encoding unit 2120 shown in FIG. 1. FIG. 3 is a block diagram illustrating the functional configuration of a decoder 2200 using the conventional lossless compression encoding method. FIG. 4 is a block diagram illustrating the functional configuration of a residual decoding unit 2220 shown in FIG. 3.

The conventional lossless compression encoding method will be described next with reference to those figures.

<Encoding Method>

A frame buffer 2111 of the encoder 2100 receives time-series signals $x(n)$ which are sampled and quantized in the form of pulse code modulation (PCM) (n is an index indicating discrete time). The frame buffer 2111 buffers the time-series signals $x(n)$ ($n=1, \ldots, N$, N is a positive integer) of a predetermined time segment (hereinafter called a frame). The buffered time-series signals $x(n)$ ($n=1, \ldots, N$) of a single frame are sent to a linear prediction analysis unit 2112 of a prediction encoding unit 2110, and the linear prediction analysis unit 2112 calculates PARCOR coefficients $k(m)$ ($m=1, 2, \ldots, M$) of the first to M-th order by linear prediction analysis and outputs the coefficients.

The linear prediction analysis assumes that a linear combination between the time-series signal $x(n)$ at a time n, values obtained by weighting the time-series signals $x(n-1)$, $x(n-2), \ldots, x(n-M)$ at M points $n-1, n-2, \ldots, n-M$ (M is a positive integer and is referred to as a prediction order) preceding the time n by corresponding coefficients $\alpha(m)$ ($m=1, \ldots, M$) (linear prediction coefficients), and a prediction residual $e(n)$ (sometimes referred to as prediction error), is held. A linear prediction model based on this assumption is given below. In the linear prediction analysis, linear prediction coefficients $\alpha(m)$ ($m=1, \ldots, M$) that minimize the power of the prediction residuals $e(n)$ ($n=1, \ldots, N$), or PARCOR coefficients $k(m)$ ($m=1, \ldots, M$) or other coefficients that can be converted to the linear prediction coefficients are calculated with respect to the input time-series signals $x(n)$ ($n=1, \ldots, N$).

$$e(n)=x(n)+\alpha(1)\cdot x(n-1)+\alpha(2)\cdot x(n-2)+ \ldots +\alpha(M)\cdot x(n-M)$$

Linear prediction analysis methods include sequential methods such as the Levinson-Durbin method and the Burg method, as well as methods of solving each simultaneous equation of each prediction order (the simultaneous equation whose solutions are linear prediction coefficients that minimizes the prediction residual) such as the autocorrelation method and the covariance method.

A linear finite impulse response (FIR) filter that estimates a time-series signal $y(n)$ at a time n by using the time-series signals $x(n-1)$, $x(n-2), \ldots, x(n-M)$ at M points $n-1, n-2, \ldots, n-M$ preceding the time n in accordance with the equation given below is called a linear prediction filter.

$$y(n)=-\{\alpha(1)\cdot x(n-1)+\alpha(2)\cdot x(n-2)+ \ldots +\alpha(M)\cdot x(n-M)\}$$

The calculated PARCOR coefficients $k(m)$ ($m=1, \ldots, M$) are sent to a quantizer 2113, where they are quantized to quantized PARCOR coefficients $i(m)$ ($m=1, \ldots, M$). The quantized PARCOR coefficients may be the quantized values of the PARCOR coefficients or may be indices assigned to the quantized values of the PARCOR coefficients. The quantized PARCOR coefficients $i(m)$ ($m=1, \ldots, M$) are sent to a coefficient encoding unit 2114, where they are subjected to variable length coding. The quantized PARCOR coefficients $i(m)$ ($m=1, \ldots, M$) are also sent to a linear prediction coefficient converter 2115, and by using them, the linear prediction coefficient converter 2115 calculates linear prediction coefficients $\alpha(m)$ ($m=1, 2, \ldots, M$). A linear prediction unit 2016 generates linear prediction values $y(n)$ ($n=1, \ldots, N$) from the time-series signals $x(n)$ ($n=1, \ldots, N$) of a single frame and the corresponding linear prediction coefficients $\alpha(m)$ ($m=1, \ldots, M$), by using the linear prediction filter, and a subtractor 2117 calculates prediction residuals $e(n)$ by subtracting the linear prediction values $y(n)$ from the time-series signals $x(n)$ (prediction filter processing).

The calculated prediction residuals $e(n)$ are integers within a predetermined range. For example, if the input time-series signals $x(n)$ are represented by integers with a finite number of bits and if the linear prediction values $y(n)$ are the output values of a linear prediction filter where the filter coefficients are integer linear prediction coefficients obtained, for example, by rounding off decimal places, the prediction residuals $e(n)$ in integer representation with a finite number of bits (represented by integers within a predetermined range) can be obtained by subtracting the linear prediction values $y(n)$ from the time-series signals $x(n)$. If the time-series signals $x(n)$ and the linear prediction values $y(n)$ are not represented by integers, the prediction residuals $e(n)$ may be obtained by expressing the differences calculated by subtracting the linear prediction values $y(n)$ from the time-series signals $x(n)$, with integers having a finite number of bits. The residual encoding unit 2120 performs Golomb-Rice coding of the prediction residuals $e(n)$ ($n=1, \ldots, N$) in integer representation. In Golomb-Rice coding, a Rice parameter calculator 2121 generates an integer Rice parameter s from the input prediction residuals $e(n)$ ($n=1, \ldots, N$). The optimum value of the Rice parameter s depends on the amplitude of the input prediction residuals $e(n)$ (depends on the average amplitude of one or more prediction residuals e(n) corresponding to a given time segment, for example), as described below. The Rice parameter s may be generated for each frame or for each subframe, which is a time segment obtained by subdividing the frame.

The prediction residuals e(n) (n=1, ..., N) and the Rice parameter s are input to a separation calculator 2122a of a Golomb-Rice coding unit 2122. By performing predetermined divisions using them, the separation calculator 2122a obtains integer quotients q(n) and information sub(n) identifying the corresponding remainders. The divisions are basically operations to divide the prediction residuals e(n) by a modulus $2^s$. Because of the necessity of distinguishing between positive and negative values of the prediction residuals e(n), reduction of the code length, and so on, some modifications may be added to the operations to divide the prediction residuals e(n) simply by the modulus $2^s$. If the modulus is a power of 2 and if the dividends are integers in binary representation, the divisions are the processing of deleting the low-order bits from the dividends represented by a plurality of bits, the quotients are the high-order bits of the dividends represented by the plurality of bits, and the remainders are the low-order bits of the dividends represented by the plurality of bits, respectively.

An alpha coding unit 2122b performs Alpha coding (sometimes referred to as Unary coding) of the quotients q(n) and generates information prefix(n). The generated information prefix(n) and the information sub(n) are input to a combining unit 2122c, and the combining unit 2122c outputs their respective connected bits prefix(n)|sub(n) as residual codes $C_e$ corresponding to the prediction residuals e(n). The residual encoding unit 2120 outputs the residual codes $C_e$ and a complementary code $C_c$ for identifying the Rice parameter s. If the Rice parameter s is generated in each frame, for example, information indicating that the frame is not divided into subframes and the Rice parameter s itself are output as the complementary code $C_c$. If the Rice parameter s is generated in each subframe, the Rice parameter s generated for the first subframe, difference codes $C_d$ obtained by performing Golomb-Rice coding of the differences between the Rice parameters s generated for adjacent subframes, and flag information indicating that the Rice parameter s is generated in each subframe are output as the complementary code C.

The coefficient code $C_k$ generated in the prediction encoding unit 2110 and the residual codes $C_e$ and the complementary code $C_c$ generated in the residual encoding unit 2120 are sent to a combining unit 2130, where the codes are combined to form a code $C_g$.

<Decoding Method>

The code $C_g$ input to the decoder 2200 is separated to the coefficient code $C_k$, the residual codes $C_e$, and the complementary code $C_c$ by a separator 2210. The coefficient code $C_k$ is input to a prediction decoding unit 2230, and the residual codes $C_e$ and the complementary code $C_c$ are input to the residual decoding unit 2220.

The residual decoding unit 2220 obtains the Rice parameter s from the input complementary code $C_c$. If the complementary code $C_c$ includes the flag information, for example, a Rice parameter restoration unit 2222 first restores the differences between the Rice parameters s generated for adjacent subframes, from the difference codes $C_d$ included in the complementary code $C_c$. The Rice parameter restoration unit 2222 then restores the Rice parameters s of the second and subsequent subframes by using the differences and the Rice parameter s of the first subframe included in the complementary code $C_c$. If the complementary code $C_c$ includes information indicating that the frame is not divided into subframes, for example, the Rice parameter s included in the complementary code $C_c$ is the Rice parameter s of the frame corresponding to the complementary code $C_c$. A Golomb-Rice decoding unit 2221 of the residual decoding unit 2220 separates the input residual codes $C_e$ into information prefix (n) and information sub(n). The separated information prefix (n) is decoded to generate quotients q(n) by an alpha decoding unit 2221c. A combination calculator 2221b is given the information sub(n), the quotients q(n), and the Rice parameter s, and by using them, the combination calculator 2221b decodes the prediction residuals e(n).

The coefficient code $C_k$ input to the prediction decoding unit 2230 is decoded to generate quantized PARCOR coefficients i(m) (m=1, ..., M) by a coefficient decoding unit 2231. The quantized PARCOR coefficients i(m) (m=1, ..., M) are sent to a linear prediction coefficient converter 2232, and by using them, the linear prediction coefficient converter 2232 calculates linear prediction coefficients α(m) (m=1, ..., M) of a linear prediction filter of M-th prediction order. In a linear prediction unit 2233, a linear prediction filter generates linear prediction values y(n) (n=1, ..., N) by using the calculated linear prediction coefficients α(m) (m=1, ..., M) and the time-series signals x(n) (n=1, ..., N) output earlier from an adder 2234. The adder 2234 generates time-series signals x(n) (n=1, ..., N) by adding the linear prediction values y(n) and the prediction residuals e(n) decoded by the residual decoding unit 2220 (inverse prediction filtering).

PRIOR ART LITERATURE

Non-Patent Literature

Non-patent literature 1: Mat Hans and Ronald W. Schafer, "Lossless Compression of Digital Audio," IEEE Signal Processing Magazine, July 2001, pp. 21-32.

Non-patent literature 2: ISO/IEC 14496-3 AMENDMENT 2: Audio Lossless Coding (ALS), New Audio Profiles and BSAC Extensions.

SUMMARY OF THE INVENTION

Problems to be Solved by the Invention

An object of the present invention is to improve the encoding compression rate concerning encoding of prediction residuals.

Means to Solve the Problems

A modified Golomb-Rice coding scheme may encode the quotients by performing encoding other than Alpha coding (unknown). Parameters identifying a modulus for calculating the quotients are generically referred to as separation parameters. According to the present invention, variable length coding of side information that includes such a separation parameter is performed when prediction residuals in integer representation are encoded. This improves the encoding compression rate of the separation parameter. When a code corresponding to the prediction residuals are decoded, the code obtained by performing variable length coding of the side information that includes the separation parameter is decoded to generate the separation parameter, and the separation parameter is used to decode the code corresponding to the prediction residuals.

Effects of the Invention

According to the present invention, the encoding compression rate concerning encoding of prediction residuals is improved.

BRIEF DESCRIPTION OF THE DRAWINGS

FIG. 10A is a correspondence table showing an example of a correspondence relationship among code tables stored in a code table memory in the residual encoding unit and a code table memory in the residual decoding unit, separation parameters, and indices;

FIG. 10B is a diagram illustrating an example of the relationship among frequencies at which the code tables listed in FIG. 10A are selected, separation parameters s, and indices h;

FIGS. 11A to 11C are views showing examples of code tables listed in the correspondence table in FIG. 10A;

FIG. 12 is an example code table corresponding to variable length coding performed by a variable length coding unit in the residual encoding unit and decoding performed by a variable length decoding unit in the residual decoding unit;

FIG. 23A is a correspondence table showing an example of the correspondence relationship among code tables T[h, s] stored in a code table memory, separation parameters s, and indices h;

FIG. 23B is a table showing an example of the relationship among frequencies at which the code tables included in the correspondence table in FIG. 23A are selected, separation parameters s, and indices h.

FIGS. 24A and 24C are correspondence tables showing examples of the correspondence relationship among code tables T[h, s] stored in the code table memory, separation parameters s, and indices h;

FIGS. 24B and 24D are tables showing examples of the relationship among frequencies at which the code tables included in the correspondence tables in FIGS. 24A and 24C are selected, separation parameters s, and indices h;

FIG. 27A is a correspondence table showing an example of the correspondence relationship among code tables stored in the code table memory of the residual encoding unit and the code table memory of the residual decoding unit, separation parameters, and indices;

FIG. 27B is a view showing an example of the relationship among frequencies at which the code tables listed in the correspondence table shown in FIG. 27A are selected, separation parameters s (upper and lower), and indices h;

FIGS. 28A and 28B are views showing examples of code tables listed in the correspondence table shown in FIG. 27A;

FIG. 29 shows an example of a code table corresponding to variable length coding performed by a variable length coding unit in the residual encoding unit and decoding performed by a variable length decoding unit in the residual decoding unit;

FIG. 32 is a view showing an example of the relationship among a separation parameter s, indices $h_i$, and frequencies at which code tables for performing variable length coding of quotients q(n), the code tables being selected for subframes respectively by a code table selector in the residual encoding unit;

FIG. 37 is a view showing an example of the relationship among separation parameters $s_i$, an index h, and frequencies at which code tables for performing variable length coding of quotients q(n), the code tables being selected for subframes respectively by a code table selector in the residual encoding unit;

FIG. 42 is a view showing an example of the relationship among separation parameters $s_i$, indices $h_i$, and frequencies at which code tables for performing variable length coding of quotients q(n), the code tables being selected for subframes respectively by a code table selector of the residual encoding unit;

DETAILED DESCRIPTION OF THE EMBODIMENTS

Figure 1:
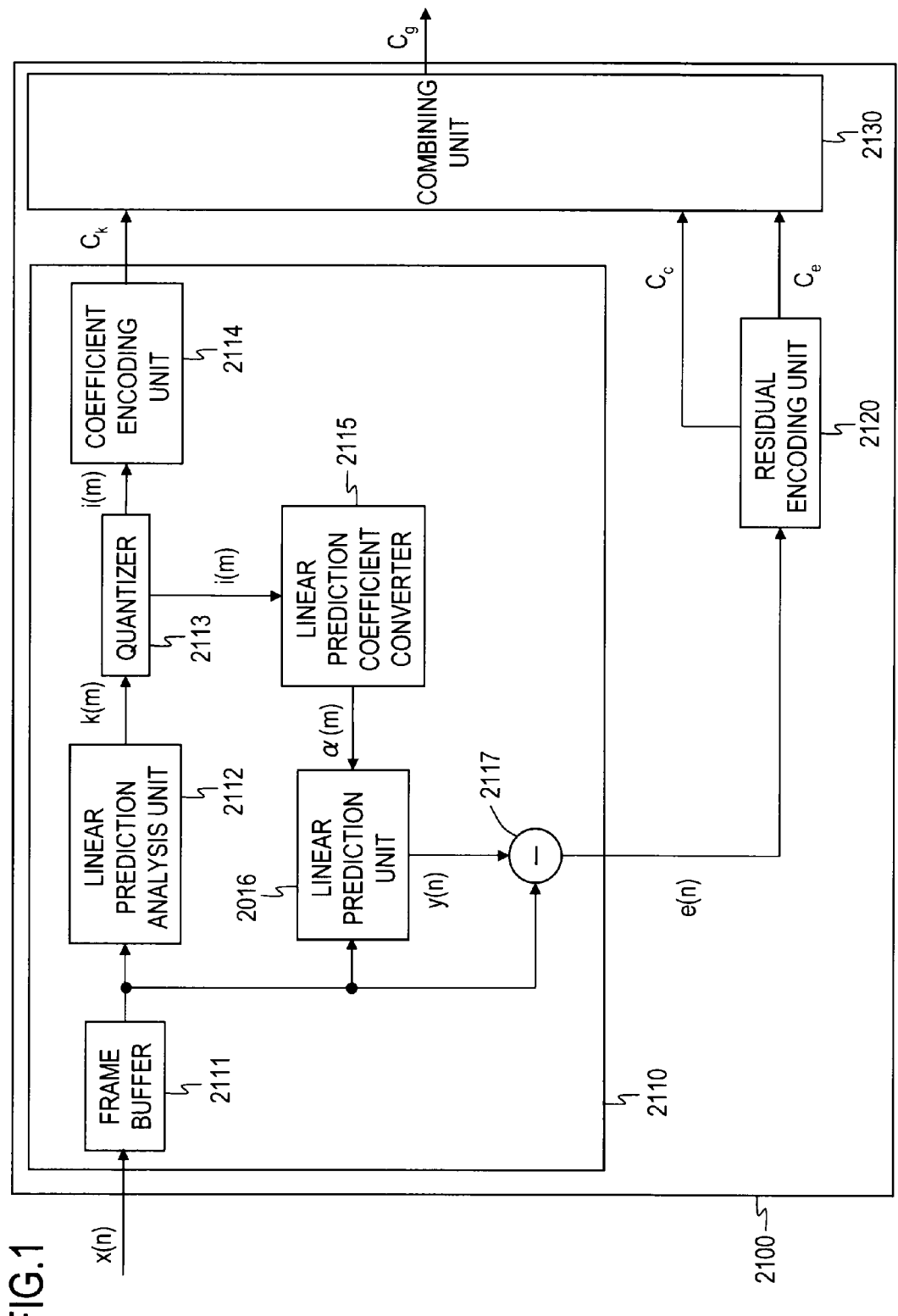
FIG. 1 is a block diagram illustrating the functional configuration of an encoder using a conventional lossless compression encoding method.
Figure 2:
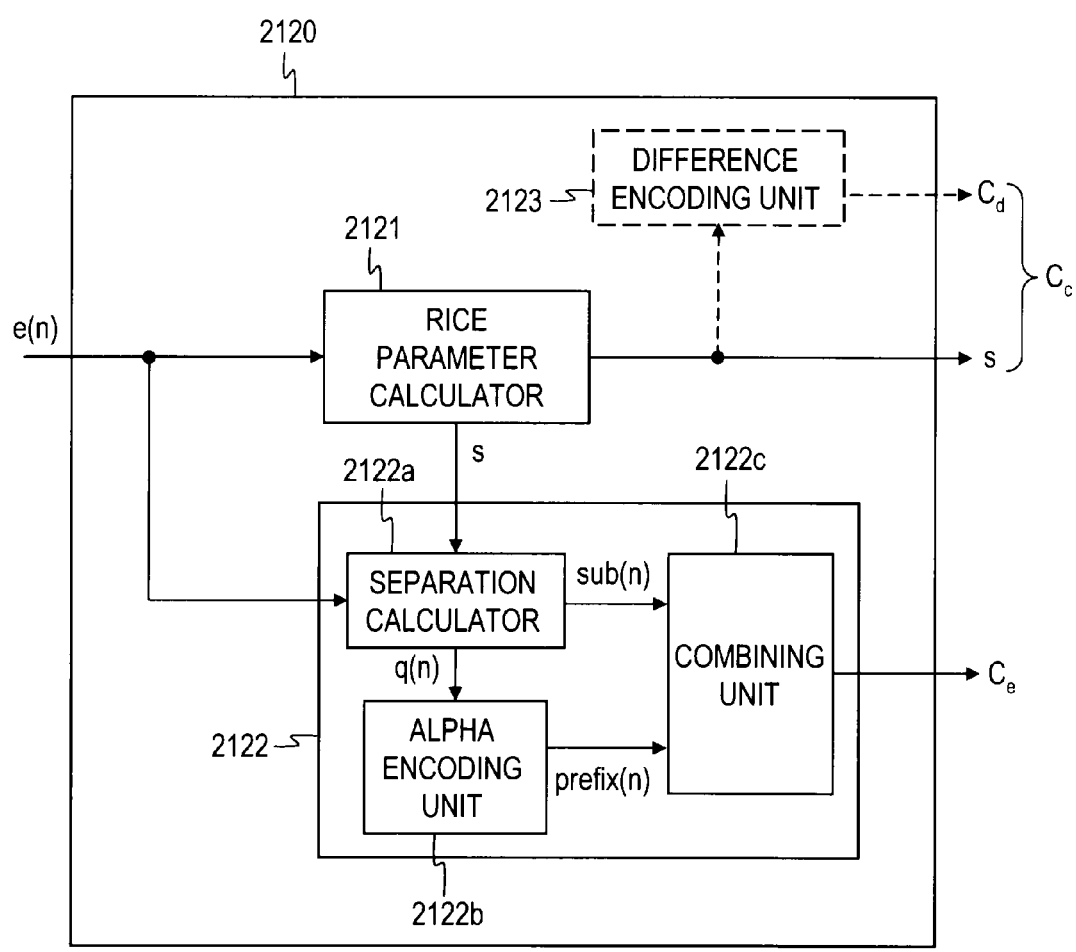
FIG. 2 is a block diagram illustrating the functional configuration of a residual encoding unit shown in FIG. 1.
Figure 3:
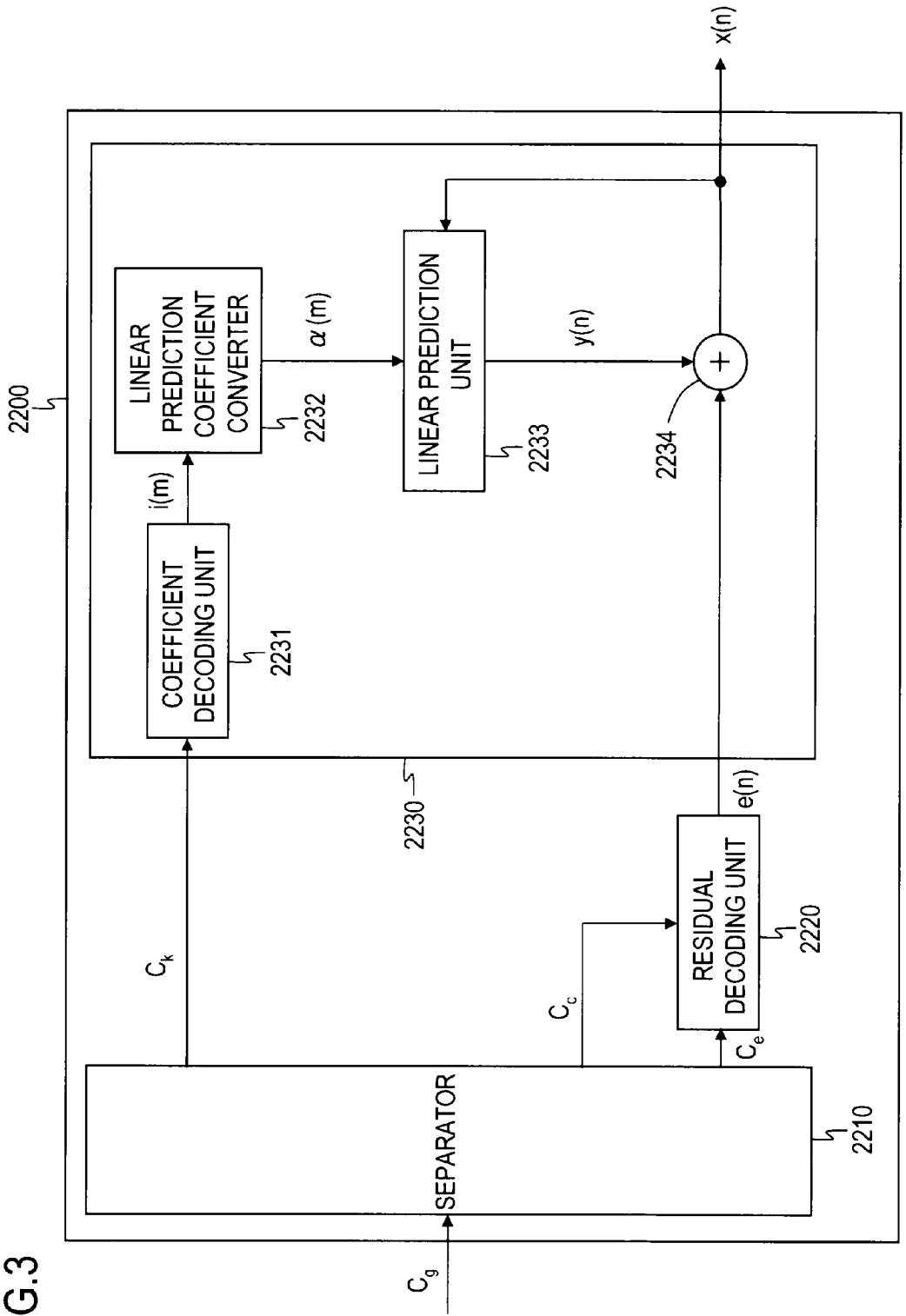
FIG. 3 is a block diagram illustrating the functional configuration of a decoder using the conventional lossless compression encoding method.
Figure 4:
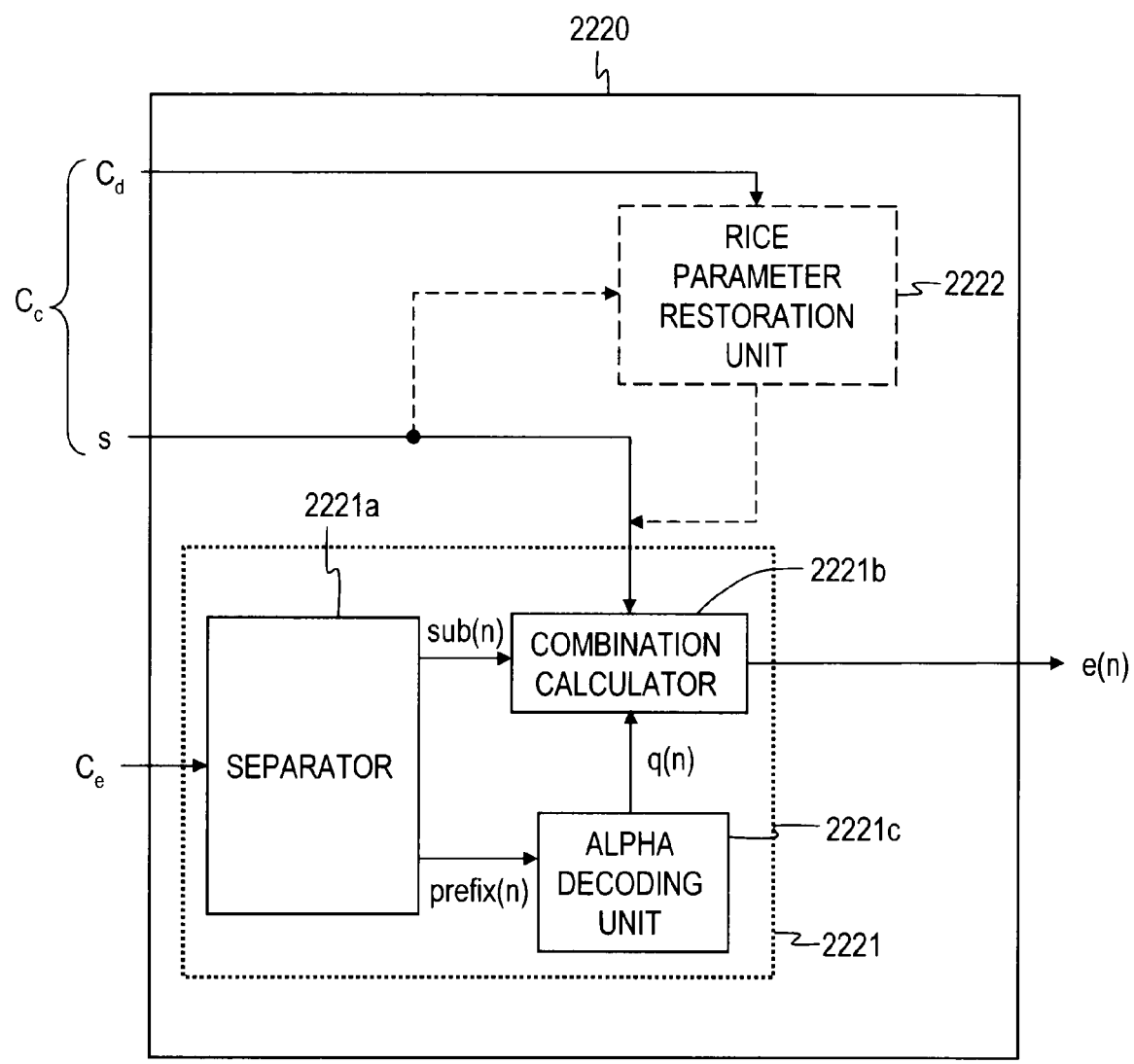
FIG. 4 is a block diagram illustrating the functional configuration of a residual decoding unit shown in FIG. 3.

The principles will be described next, and then embodiments of the present invention will be described.

[Principle 1]

If prediction residuals are obtained by applying prediction analysis, such as linear prediction analysis (sometimes called short-term prediction analysis), long-term prediction analysis, and multi-channel prediction analysis, to time-series signals, such as audio signals, video information, biological signals, and seismic signals, the prediction residuals have unique unevenness in the amplitude (unknown). The separation parameter depends on the amplitude of the prediction residuals (depends on the average amplitude of one or more prediction residuals corresponding to a given time segment, for example), and therefore, the frequency distribution of the separation parameter becomes uneven in a unique manner (unknown). These characteristics are used to perform variable length coding of side information that includes the separation parameter. This principle will be described next.

The prediction residuals in integer representation obtained from the result of prediction analysis of the time-series signals are encoded by the Golomb-Rice coding scheme or a modified Golomb-Rice coding scheme. The method of encoding the prediction residuals includes (A) a step of deciding an integer separation parameter for each predetermined time segment and (B) a step of outputting information containing first information and second information as a code corresponding to at least some of the prediction residuals. The first information identifies integer quotients obtained by divisions. The dividends of the divisions are prediction residuals or integers not smaller than 0 that monotonically increase with increases in the amplitude of the prediction residuals. The modulus of the divisions is an integer dependent on the separation parameter decided for the time segment corresponding to the prediction residuals (the separation parameter or an integer mapped value of the separation parameter). The second information identifies the remainders obtained when the dividends are divided by the modulus. The code corresponding to any of the prediction residuals may include only the first information but not include the second information. Integers not smaller than 0 that increase monotonically with increases in the amplitude of the prediction residuals mean integers not smaller than 0 that increase monotonically with increases in the absolute values of the prediction residuals, integers not smaller than 0 that monotonically increase with decreases in negative prediction residuals (such as those obtained by Equation (2) or (4) given below), or integers not smaller than 0 that increase monotonically with increases in the power of the prediction residuals, for example.

The quotients obtained by the divisions in step (B) decrease and get closer to zero as the modulus increases, and the quotients are distributed more widely in a range dependent on the amplitude of the dividends as the modulus decreases. The remainders corresponding to the quotients show increasing unevenness and are distributed around smaller value as the modulus decreases, and the remainders show decreasing unevenness and are distributed more widely as the modulus increases. This represents the trend that as the modulus increases, the amount of the first information identifying the quotients decreases, but the amount of the second information identifying the remainders increases. To decrease the code amount (sometimes called the code length) of the prediction residual codes, an appropriate modulus must be used in accordance with the amplitude of the prediction residuals, that is, an appropriate separation parameter must be used in accordance with the amplitude of the prediction residuals. The separation parameter depends on the amplitude of the prediction residuals, and since the prediction residuals have unique unevenness in the amplitude, the frequency distribution of the separation parameter becomes uniquely uneven (unknown).

The encoding method further includes (C) a step of performing variable length coding of each piece of side information that includes the separation parameter. This improves the encoding compression rate of the separation parameter. Examples of variable length coding include Alpha coding, Delta coding, Huffman coding, Golomb-Rice coding, Golomb coding, and other entropy coding.

It is assumed that Condition 1 or 2 given below is satisfied, for example.

[Condition 1]

The separation parameter is an integer that weakly increases (increases or non-decreases) with an increase in the amplitude of the prediction residuals, and the modulus is an integer that increases monotonically with an increase in the separation parameter.

[Condition 2]

The separation parameter is an integer that weakly decreases with an increase in the amplitude of the prediction residuals, and the modulus is an integer that increases monotonically with a decrease in the separation parameter.

An example of Condition 1 is that the separation parameter is an integer that weakly increases with an increase in the average amplitude of the prediction residuals in a given time segment, and the modulus is an integer that increases monotonically with an increase in the separation parameter.

An example of Condition 2 is that the separation parameter is an integer that weakly decreases with an increase in the average amplitude of the prediction residuals in a given time segment, and the modulus is an integer that increases monotonically with a decrease in the separation parameter.

These conditions are satisfied, for example, when the separation parameter is a Rice parameter in Golomb-Rice coding, a mapped value of the Rice parameter, or an integer that minimizes the total amount of a code of prediction residuals in a predetermined time segment and when the modulus is a power of two having the separation parameter or a mapped value of the separation parameter as the exponent. An example of the mapped value of the Rice parameter is the sum of the Rice parameter and a positive or negative integer constant. If encoding other than Alpha coding is allowed as a method of encoding the quotients, it is preferred that, in view of the resulting increased flexibility, the sum of the Rice parameter and a negative integer constant (such as "−1") be decided as the separation parameter. In that case, the separation parameter is a mapped value of the Rice parameter, and it is preferred that, in at least some time segments, the separation parameter decided in each of the time segments be smaller than the Rice parameter for performing Golomb-Rice coding of the prediction residuals corresponding to the time segment or of mapped values of the prediction residuals. Minimizing a value is not just bring the value to the lowest possible level in the strict sense, and the concepts include bringing the value to such a level that the value can be approximated to the lowest possible value and bringing the value to or lower than a predetermined threshold.

On that assumption, the frequency at which a separation parameter whose distance from a predetermined specific value is a first distance is selected becomes higher than the frequency at which a different separation parameter whose distance from the predetermined specific value is a second distance is selected, the second distance being greater than the first distance.

The predetermined specific value is within the possible range of the value of the separation parameter that can bring the modulus in step (B) to a value not smaller than 1 and not greater than the maximum value of the dividends, excluding the lower limit value $s_{min}$ and the upper limit value $s_{max}$ of the possible range ($s_{min}$ to $s_{max}$ both inclusive) of the separation parameter. For example, if the dividends are integers not smaller than 0 and smaller than $2^B$ (B is an integer not smaller than 3), the predetermined specific value is an integer not smaller than 1 and not greater than B−2. In other words, for example, the predetermined specific value is within the possible range of the value of the separation parameter that brings the modulus in step (B) to not smaller than 1 and not greater than the maximum value of the dividends, and the value is closer to the intermediate value $(s_{min}+s_{max})/2$ between the lower limit value $s_{min}$ and the upper limit value $s_{max}$ of the possible range ($s_{min}$ to $s_{max}$ both inclusive) of the separation parameter rather than the lower limit value $s_{min}$ or the upper limit value $s_{max}$. If the dividends are integers not smaller than 0 and smaller than $2^B$ (B is an integer not smaller than 3), for example, the predetermined specific value is closer to (B−1)/2 rather than 0 or B−1. In a specific example where the separation parameter can range from 0 to 7 both inclusive, the predetermined specific value is, for example, 2 or 3. In the frequency distribution of the separation parameter, the frequency at which the separation parameter takes a value close to the center of the possible range is higher than the frequency at which the separation parameter takes a value close to the lower limit or the upper limit of the range.

On that assumption, such a variable length coding scheme in which the code length of a first code being shorter than the code length of a second code is more frequent than the code length of the first code being longer than the code length of the second code is used to perform variable length coding of the side information in step (C). The first code is assigned to side information that includes a separation parameter whose distance from a predetermined specific value is a first distance. The second code is assigned to side information that includes a separation parameter whose distance from the predetermined specific value is a second distance. The second distance is greater than the first distance.

<Example of Rice Parameter>

The foregoing description will be explained below in a case when the separation parameter is a Rice parameter of Golomb-Rice coding.

[Golomb-Rice Coding]

In Golomb-Rice coding, a code corresponding to prediction residuals is generated as described below, for example. Let e(n) be prediction residuals, q(n) be integer quotients, prefix(n) be first information obtained by performing variable length coding of the quotients, sub(n) be second information identifying the remainders, s be a separation parameter (Rice parameter here), and floor(x) be the maximum integer not greater than x.

When the separation parameter s is greater than 0, the quotients q(n) are generated in step (B) as follows.

$$q(n)=\text{floor}(e(n)/2^{s-1}) \text{ (for } e(n) \geq 0) \quad (1)$$

$$q(n)=\text{floor}\{(-e(n)-1)/2^{s-1}\} \text{ (for } e(n)<0) \quad (2)$$

When the separation parameter s equals 0, the quotients q(n) are generated in step (B) as follows.

$$q(n)=2 \cdot e(n) \text{ (for } e(n) \geq 0) \quad (3)$$

$$q(n)=-2 \cdot e(n)-1 \text{ (for } e(n)<0) \quad (4)$$

When the separation parameter s is greater than 0, the second information sub(n) for identifying the remainders used in step (B) is identified as follows.

$$\text{sub}(n)=e(n)-2^{s-1} \cdot q(n)+2^{s-1} \text{ (for } e(n) \geq 0) \quad (5)$$

$$\text{sub}(n)=(-e(n)-1)-2^{s-1} \cdot q(n) \text{ (for } e(n)<0) \quad (6)$$

When the separation parameter s equals 0, the second information sub(n) for identifying the remainders is not present (sub(n)=null).

[Method of Generating Separation Parameter s]

An integer that minimizes the total amount of a code corresponding to the prediction residuals e(n) in a given time segment is the separation parameter s. For example, an integer that minimizes the total amount of the code corresponding to the prediction residuals e(n) (n=1, ..., N) in each frame may be decided as the separation parameter s of the frame. An integer that minimizes the total amount of the code corresponding to the prediction residuals e(n) (n=SFS, ..., SFE) (SFS SFE, SFS, SFE∈{1, ..., N}) in each subframe may be decided as the separation parameter s of the subframe. In the description given below, an integer that minimizes the total amount of the code corresponding to the prediction residuals e(n) (n=1, ..., N) in each frame is decided as the separation parameter s of the frame.

Equations (1) to (4) can be collectively indicated by the equation given below to express the quotients q(n), where |x| represents the absolute value of x.

$$q(n)=\text{floor}\{(2 \cdot |e(n)|-z)/2^s\} \text{ } (z=0 \text{ or } 1 \text{ or } 2) \quad (7)$$

In Golomb-Rice coding, the prefix(n) includes codes obtained by performing Alpha coding of the quotients q(n), and its code length can be expressed as follows by using Equation (7).

$$\text{floor}\{(2 \cdot |e(n)|-z)/2^s\}+1 \quad (8)$$

In Golomb-Rice coding, the second information sub(n) that identifies the remainders of Equations (5) and (6) are expressed by s bits. Therefore, the code length C(s, e(n), N) of the Golomb-Rice code per frame (N samples) can be expressed as follows.

$$C(s, e(n), N) = \sum_{n=1}^{N} [\text{floor}\{(2 \cdot |e(n)| - z)/2^s\} + 1 + s] \quad (9)$$

By approximating $\text{floor}\{(2 \cdot |e(n)|-z)/2^s\}=\{(2 \cdot |e(n)|-z)/2^s$, Equation (9) can be approximated as given below.

$$C(s, e(n), N) = 2^{-S}(2 \cdot D - z \cdot N) + (1+s) \cdot N \quad (10)$$

$$D = \sum_{n=1}^{N} |e(n)|$$

The value s that brings the result of partial differentiation of s in Equation (10) to 0 is obtained as follows. The value s minimizes the total amount of the code corresponding to the prediction residuals e(n) (n=1, ..., N) in the frame.

$$s = \log_2\{\ln 2 \cdot (2 \cdot D/N - z)\} \quad (11)$$

Here, if D/N is sufficiently greater than z, Equation (11) can be approximated by the equation given below.

$$s = \log_2\{\ln 2 \cdot (2 \cdot D/N)\} \quad (12)$$

Since the value s obtained by Equation (12) is not an integer value but a continuous value, the value s obtained by Equation (12) is quantized to an integer and decided as the separation parameter s.

[Frequency Distribution of Separation Parameter s]

As indicated by Equation (12), the separation parameter s depends on the amplitude of the prediction residuals e(n), and the value of the separation parameter s weakly increases with increases in the amplitude of the prediction residuals e(n). The frequency distribution of the separation parameter s has unique unevenness.

Figure 5A:
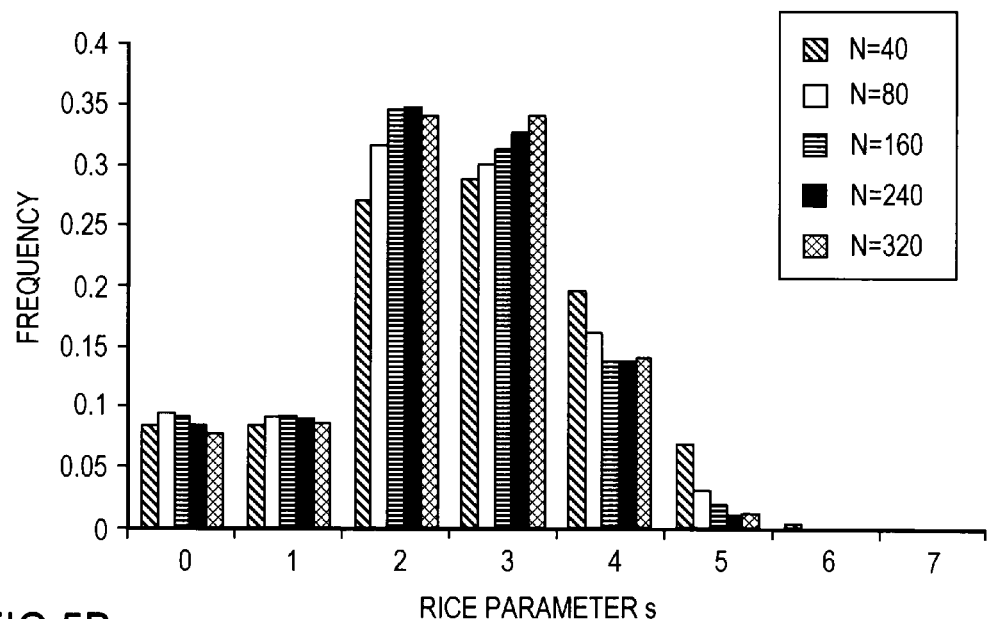
FIG. 5A is a view showing an example frequency distribution of a separation parameter (Rice parameter) of Golomb-Rice coding.

FIG. 5A is a view showing an example of the frequency distribution of a separation parameter (Rice parameter) of Golomb-Rice coding. In FIG. 5A, the horizontal axis represents the separation parameter s, and the vertical axis represents the frequency of the separation parameter s when N=40, 80, 160, 240, 302. The vertical axis is normalized so that the sum of the frequency values of the separation parameter s is 1. FIG. 5A shows the frequency distribution of the separation parameter s calculated when the prediction residuals e(n) obtained from the result of linear prediction analysis of audio signals or integers not smaller than 0 that monotonically increase with increases in the amplitude of the prediction residuals e(n), serving as dividends, are integers not smaller than 0 but smaller than $2^8$.

When the dividends are integers (expressed by eight bits) not smaller than 0 but smaller than $2^8$ and when the modulus is $2^s$, the value of the separation parameter s becomes an integer within the range of 0 to 7 both inclusive. As shown in FIG. 5A, the frequency distribution of the separation parameter s has unique unevenness. More specifically, the frequency at which a separation parameter at a first distance from a predetermined specific value is selected is higher than the frequency at which a different separation parameter at a second distance from the predetermined specific value is selected, the second distance being greater than the first distance.

Accordingly, in the example of Golomb-Rice coding, the first code is assigned to side information that includes the separation parameter s at the first distance from the predetermined specific value. The second code is assigned to side information that includes the separation parameter s at the second distance (second distance>first distance) from the predetermined specific value. In step (C), a variable length coding scheme in which the code length of the first code being shorter than the code length of the second code is more frequent than the code length of the first code being longer than the code length of the second code is used to perform variable length coding of the side information.

The predetermined specific value in this example of Golomb-Rice coding is a value within the possible range of 0 to 7 both inclusive of the separation parameter and is a value excluding the lower limit value 0 and the upper limit value 7 of the possible range of the separation parameter. In other words, the predetermined specific value in this example ranges from 1 to 6 both inclusive, and the value is, for example, closer to 7/2=3.5 rather than to 0 or 7. The frequency at which a separation parameter s close to the center of the possible range of 0 to 7 both inclusive of the separation parameter s is selected becomes higher than the frequency at which a separation parameter s close to the lower limit value or the higher limit value of the range is selected. More specifically, in the frequency distribution shown in FIG. 5A, the predetermined specific value is 2 or 3, for example (end of description of Example of Golomb-Rice coding).

[Principle 2]

The encoding compression rate concerning encoding of prediction residuals is improved further by adopting Principle 2, which will be described later, in addition to Principle 1 described earlier.

Figure 5B:
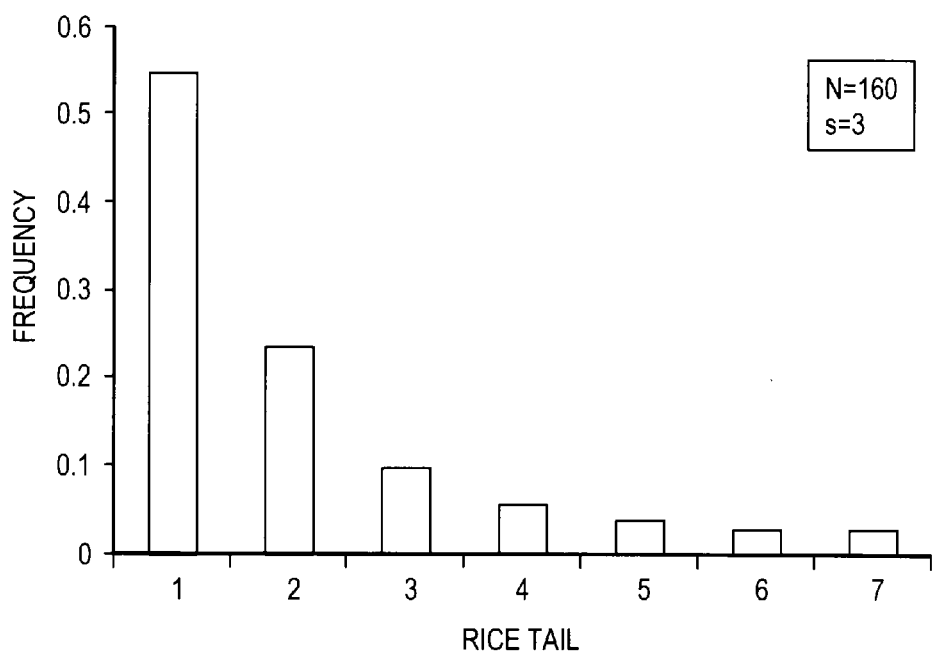
FIG. 5B is a view showing an example frequency distribution of the Rice tail.

The Golomb-Rice coding scheme performs Alpha coding of the integer quotients q(n) calculated as described above (quotients q(n) given by the equations (1) to (4), for example) to generate information prefix(n), which is a part of the code corresponding to the prediction residuals e(n). Here, the code length (bit length including the stop bit) of the Alpha code corresponding to the integer quotients q(n) (quotients q(n) given by Equations (1) to (4), for example) calculated in Golomb-Rice coding is called a Rice tail. More specifically, q(n)+1 is referred to as the Rice tail. FIG. 5B is a view showing an example of the frequency distribution of the Rice tail. In FIG. 5B, the horizontal axis represents the Rice tail, and the vertical axis represents the frequency of the Rice tail when the separation parameter s is 3. In the figure, the frequencies of the Rice tail are normalized so that the sum of the frequencies of the Rice tail is 1.

In Golomb-Rice coding, the integer quotients q(n) are encoded to generate Alpha codes. If the integer quotients q(n) have a Laplace distribution, encoding of the integer quotients q(n) to generate Alpha codes is optimum variable length coding. If the integer quotients q(n) do not have a Laplace distribution, however, a different variable length coding may provide an improved encoding compression rate. In Principle 2, a plurality of variable length coding schemes are provided to perform variable length coding of the integer quotients q(n), and an optimum variable length coding scheme is selected from them. Here, the first information includes codes obtained by performing variable length coding of the quotients. Step (B) includes (B-1) step of obtaining the quotients, (B-2) step of selecting a variable length coding scheme for performing variable length coding of the quotients for each predetermined time segment, and (B-3) step of performing variable length coding of the quotients by using the variable length coding scheme selected for the time segment to which the prediction residuals corresponding to the quotients belong and generating the first information. Examples of variable length coding include Alpha coding, Delta coding, Huffman coding, Golomb-Rice coding, Golomb coding, and other entropy coding. The plurality of variable length coding schemes provided as possible choices include variable length coding schemes other than Alpha coding. For example, a plurality of types of Huffman tables are prepared for Huffman coding of the integer quotients q(n), and an optimum Huffman table is selected from them for encoding. The Huffman tables may include a code table for performing encoding identical to Alpha coding. If a coding scheme that can perform encoding without using a code table, like the Alpha coding scheme or Delta coding scheme, is given as a possible choice, the system may be configured to select an encoding function rather than a code table.

If the encoder selects an optimum variable length coding scheme to encode the quotients q(n), a decoder can perform appropriate decoding when the decoder can identify the variable length coding scheme. Accordingly, the encoder generates a code corresponding to the side information that includes the index indicating the variable length coding scheme selected for the quotients q(n) and sends the code to the decoder. Principle 2 improves the encoding compression rate by improving the method of encoding the side information that includes the index.

The quotients q(n) (n=1, ..., N) calculated in step (B-1) are reduced into the proximity of zero as the modulus increases. The distribution of the quotients q(n) (n=1, ..., N) widens in a range dependent on the amplitude of the dividends as the modulus decreases. Therefore, as the modulus increases, the frequency distribution of the quotients q(n) (n=1, ..., N) approaches a Laplace distribution increases. Under the rule of minimizing the total amount of a code in a given time segment, the frequency at which a variable length coding scheme (including Alpha coding scheme) close to the Alpha coding scheme is selected as a variable length coding scheme for the quotients q(n) increases as the modulus increases (unknown). If variable length coding of the side information that includes the index is performed by using this characteristic, the encoding compression rate can be improved.

An optimum variable length coding scheme for encoding side information that includes the index indicating a variable length coding scheme for the quotients q(n) has Characteristics 1 and 2 given below.

[Characteristic 1]

A code of a shorter code length is assigned to side information that includes the index indicating a variable length coding scheme of higher selection frequency for the quotients q(n).

[Characteristic 2]

A code of a longer code length is assigned to side information that includes the index indicating a variable length coding scheme of lower selection frequency for the quotients q(n).

It is preferred that variable length coding of a plurality of pieces of side information that includes the separation parameter of an identical value be performed by using, for example, the specific variable length coding scheme described below.

[Specific Variable Length Coding Scheme]

This variable length coding scheme assigns a code having the shortest code length of the codes that are assigned respectively to side information that includes the separation parameter of an identical value, to specific side information that includes the separation parameter of the identical value. The specific side information includes an index for identifying a variable length coding scheme for performing Alpha coding or variable length coding closest to Alpha coding.

Alternatively, variable length coding of the side information that includes the index may be performed by using a variable length coding scheme in which the code length of a third code being shorter than the code length of a fourth code is more frequent than the code length of the third code being longer than the code length of the fourth code. The fourth code is assigned to the side information that includes the index for identifying a first coding scheme for performing first variable length coding differing from Alpha coding. The third code is assigned to the side information that includes the index for identifying a second coding scheme for performing second variable length coding closer to Alpha coding than the first variable length coding.

As the modulus increases, the frequency at which the distribution of the quotients q(n) approximates a Laplace distribution increases. Accordingly, if the separation parameter causes the modulus to be not smaller than a predetermined threshold, that type of variable length coding scheme may be used to perform variable length coding of the side information. In other words, whether to use the variable length coding scheme in which the code length of the third code being shorter than the code length of the fourth code is more frequent than the code length of the third code being longer than the code length of the fourth code may be determined in accordance with the amplitude of the separation parameter that identifies the modulus.

More specifically, if the modulus monotonically increases with an increase in the separation parameter, for example, that type of variable length coding scheme should be used when the separation parameter is not smaller than the predetermined threshold. The predetermined threshold is within the possible range of the value of the separation parameter that brings the modulus in step (B) to a value not smaller than 1 and not greater than the maximum value of the dividends.

If the modulus monotonically decreases with an increase in the separation parameter, that type of variable length coding scheme should be used when the separation parameter is not greater than the predetermined threshold. The predetermined threshold is within the possible range of the value of the separation parameter that brings the modulus in step (B) to a value not smaller than 1 and not greater than the maximum value of the dividends.

The distance between two variable length coding schemes can be defined as described below, for example.

Let the bit length of a code assigned to a value k to be encoded by a variable length coding scheme U be bu(k) and the bit length of a code assigned to the value k to be encoded by a variable length coding scheme X be bx(k). The frequencies of the value k to be encoded by the variable length coding schemes U and X are approximated as $fu(k)=0.5^{bu(k)}$ and $fx(k)=0.5^{bx(k)}$. The sum of $(bu(k)-bx(k))(fu(k)-fx(k))$ corresponding to values k to be encoded, respectively, $$E=\Sigma(bu(k)-bx(k))(fu(k)-fx(k)), \quad (13)$$

is defined as the distance between the variable length coding scheme U and the variable length coding scheme X. A smaller value of the distance E means that the variable length coding scheme U and the variable length coding scheme X are closer to each other and have a higher level of similarity.

The separation parameter and the index indicating the selected coding scheme may be encoded separately, but since the separation parameter and the index have the correlation described above, the separation parameter and the index may be combined and each piece of the side information containing them may be subjected to variable length coding. This means that the side information may contain the separation parameter generated in step (A) and the index for identifying the coding scheme selected in step (B-2).

Alternatively, information that includes connected separation parameters corresponding to subframes may be subjected to variable length coding. In other words, the prediction residuals may be obtained from the result of prediction analysis of the time-series signals in each frame, which is a predetermined time segment; step (A) may be a step of deciding respective separation parameters in respective subframes, which are time segments subdivided from the frame; step (B) may be a step of generating a code containing first information and second information; and step (C) may a step of performing variable length coding of each piece of the side information that includes a connected parameter formed by connecting the separation parameters decided for subframes included in the same frame. In that case, the first information identifies integer quotients obtained by divisions using prediction residuals or integers not smaller than 0 that increase monotonically with increases in the amplitude of the prediction residuals, as the dividends, and an integer dependent on the separation parameter decided for the subframe corresponding to the prediction residuals (the separation parameter or an integer mapped value of the separation parameter), as the modulus. The second information identifies the remainders obtained when the dividends are divided by the modulus.

Information that includes connected indices corresponding to subframes may also be subjected to variable length coding. This means that the prediction residuals may be obtained from the result of prediction analysis of the time-series signals in each frame, which is a predetermined time segment; step (B-2) may be a step of selecting a variable length coding scheme in each subframe, which is a time segment subdivided from the frame; step (B-3) may be a step of generating first information through variable length coding of the quotients by using the variable length coding scheme decided for the subframe to which the prediction residuals corresponding to the quotients belong; and the side information may contain a combination of the separation parameter and a connected index formed by connecting indices for identifying coding schemes selected for the subframes included in the same frame.

First Embodiment

A first embodiment of the present invention will next be described.

<Configuration>

Figure 6:
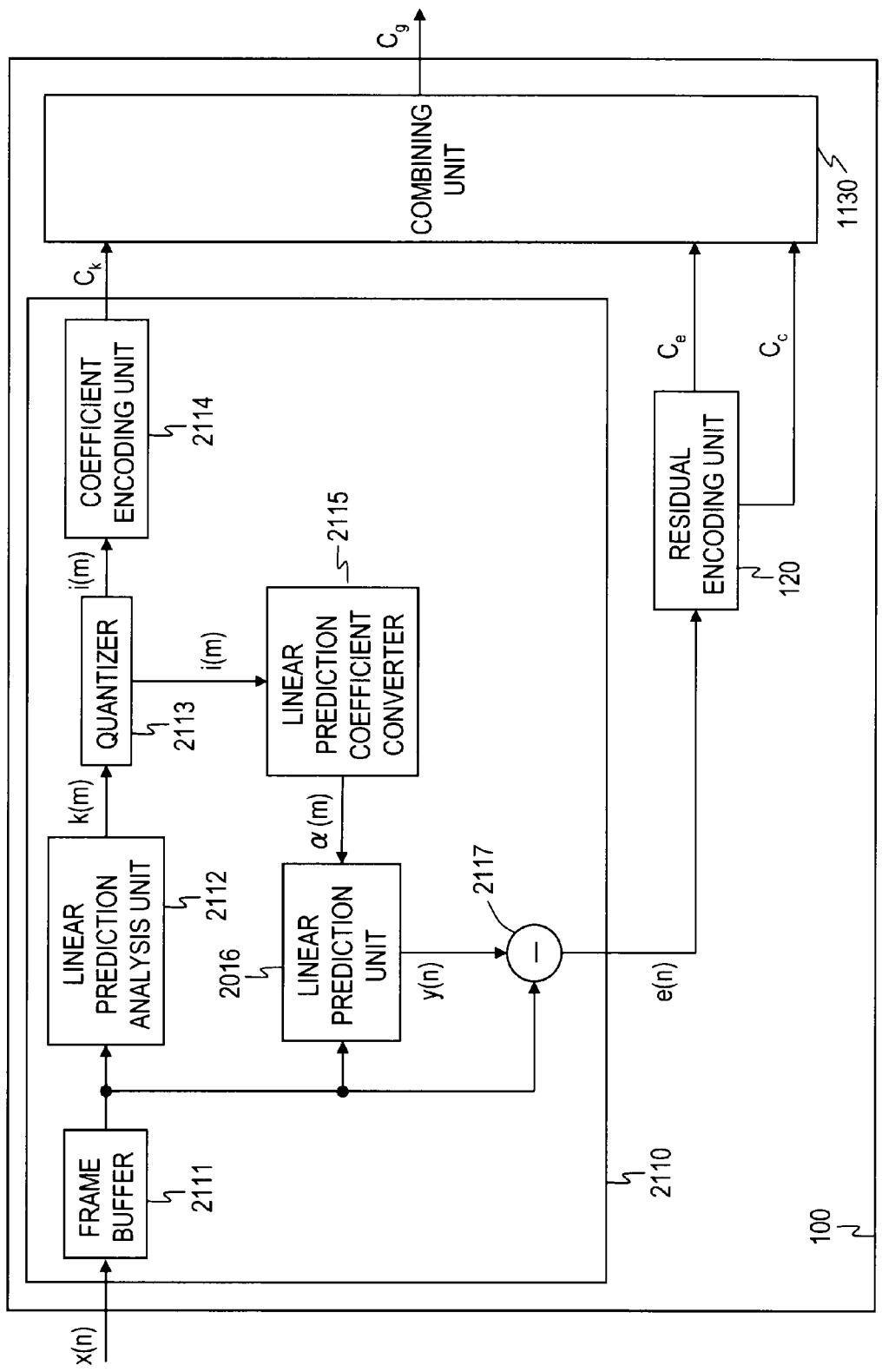
FIG. 6 is a block diagram illustrating the functional configuration of an encoder according to a first embodiment.
Figure 7:
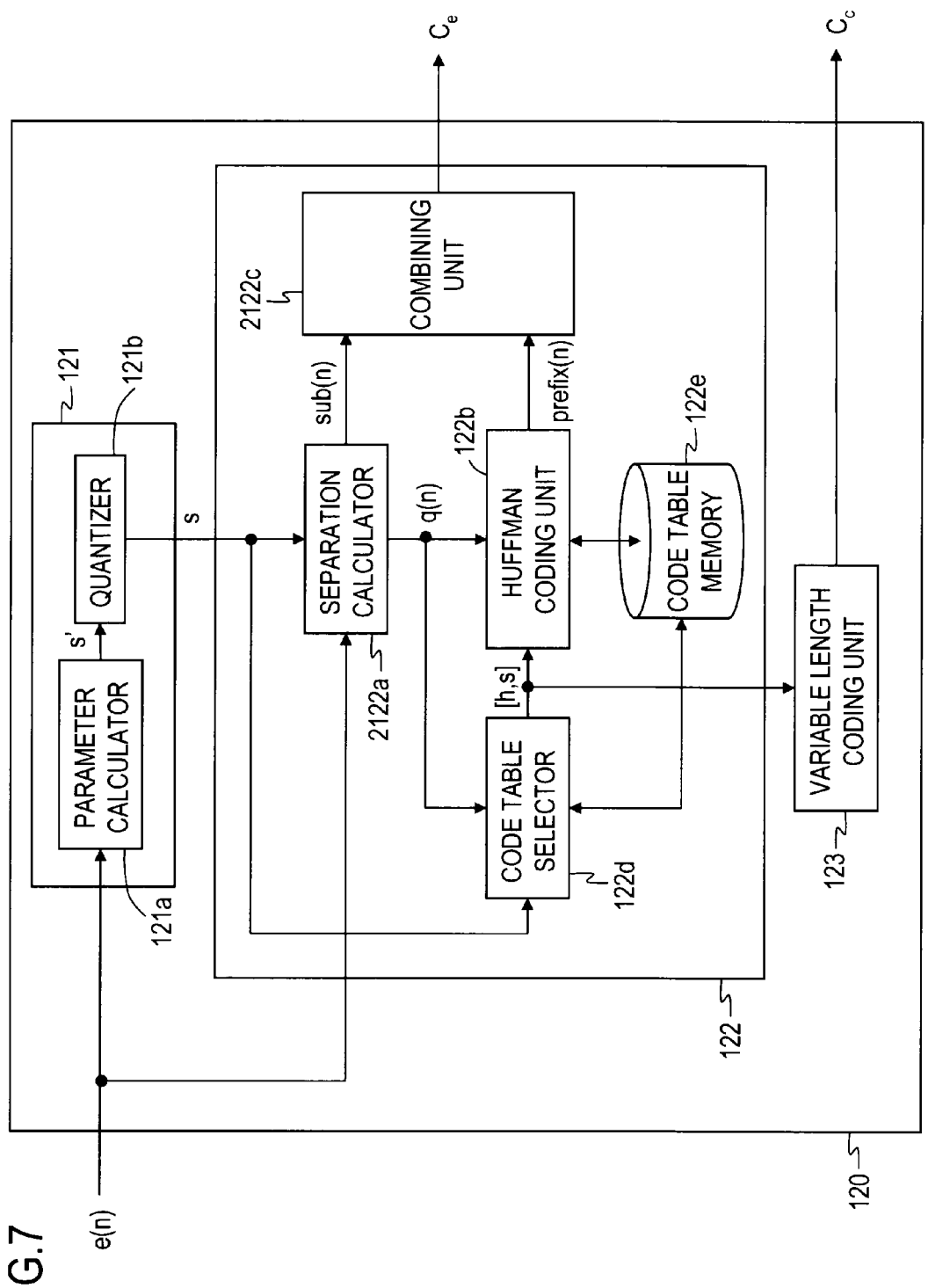
FIG. 7 is a block diagram illustrating the functional configuration of a residual encoding unit shown in FIG. 6.
Figure 8:
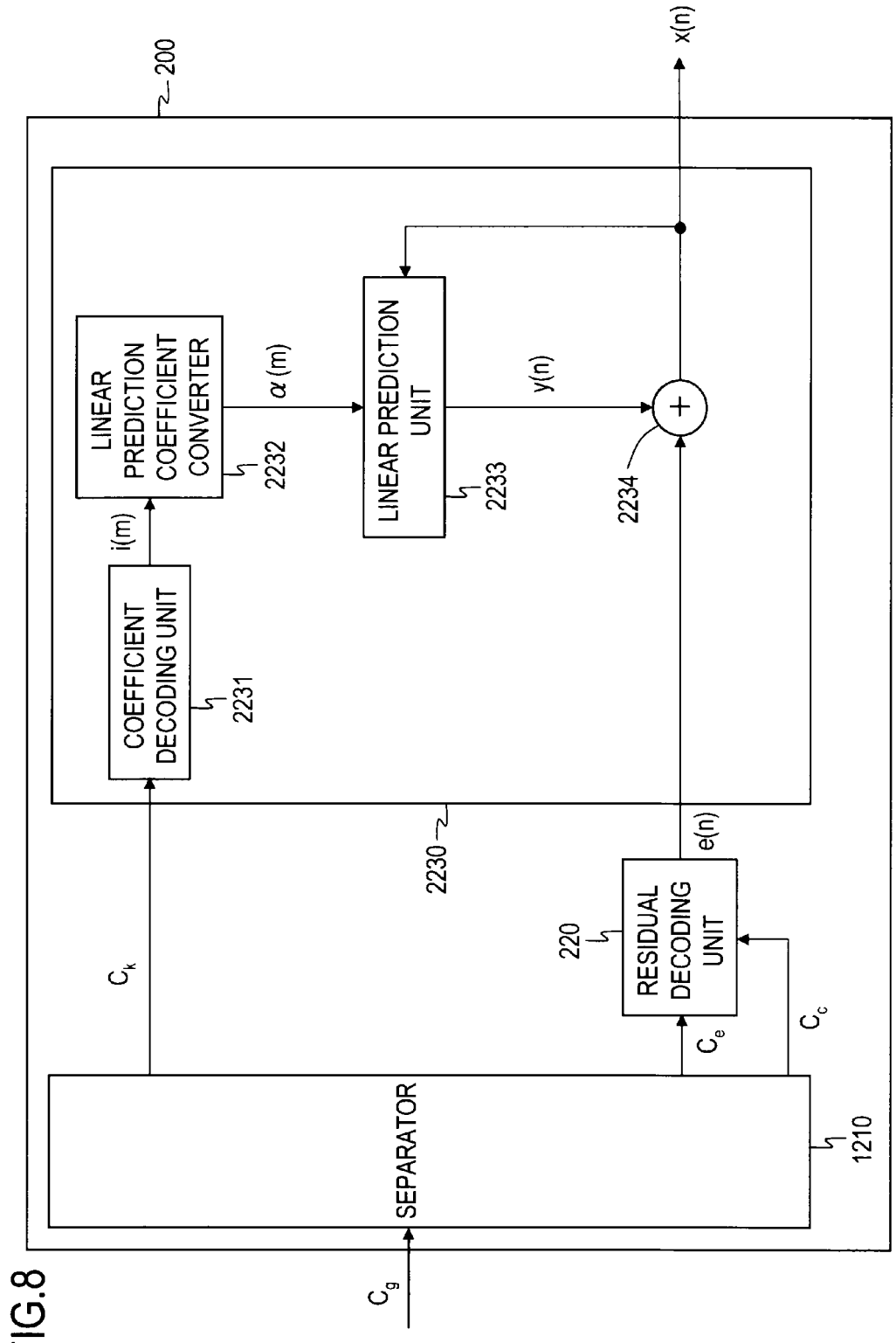
FIG. 8 is a block diagram illustrating the functional configuration of a decoder according to the first embodiment.
Figure 9:
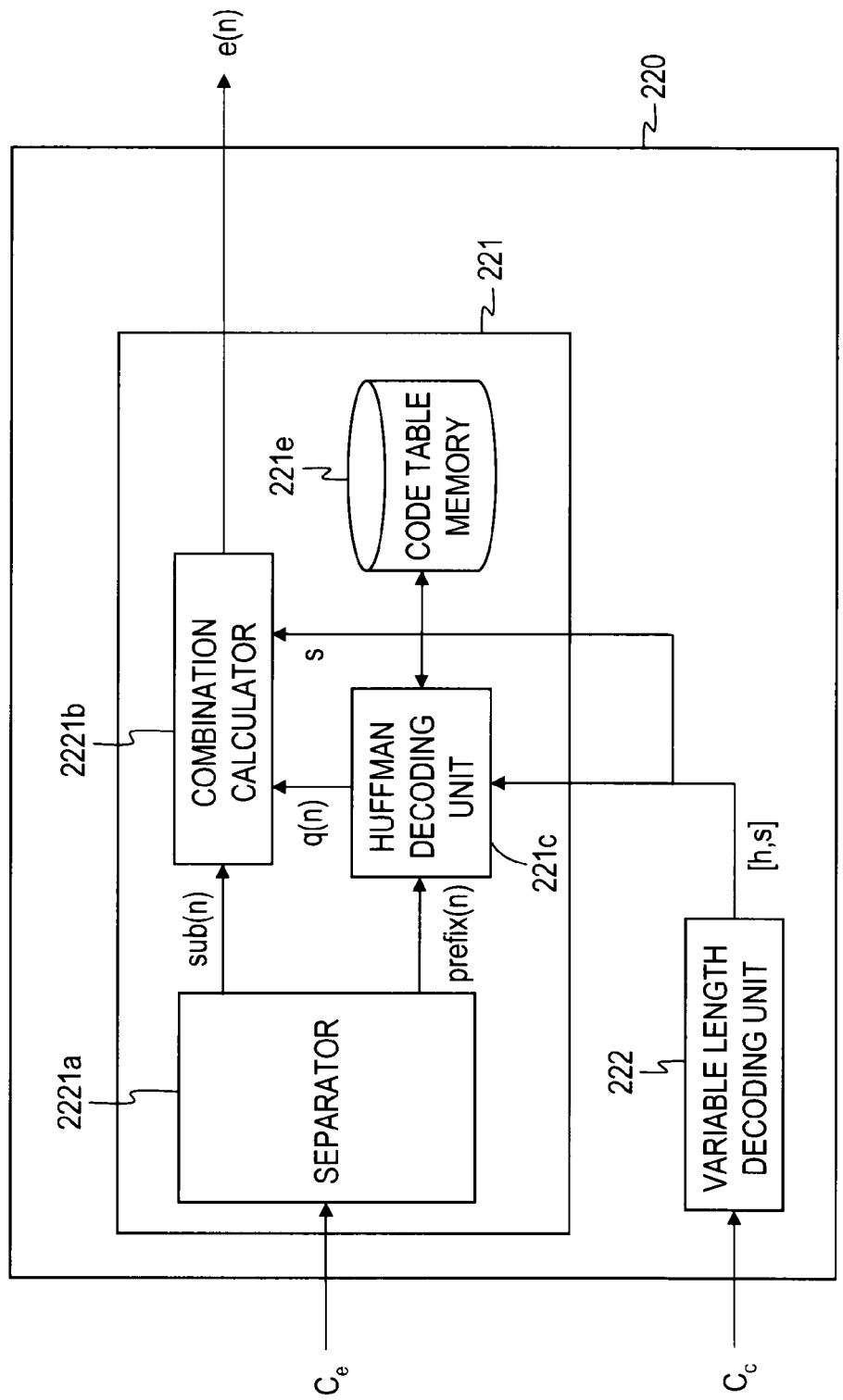
FIG. 9 is a block diagram illustrating the functional configuration of a residual decoding unit shown in FIG. 8.

FIG. 6 is a block diagram illustrating the functional configuration of an encoder 100 in the first embodiment, and FIG. 7 is a block diagram illustrating the functional configuration of a residual encoding unit 120 shown in FIG. 6. FIG. 8 is a block diagram illustrating the functional configuration of a decoder 200 in the first embodiment, and FIG. 9 is a block diagram illustrating the functional configuration of a residual decoding unit 220 shown in FIG. 8. In those diagrams, components identical to those in FIGS. 1 to 4 are denoted by the same reference numerals as used in FIGS. 1 to 4, and a description of those components will be omitted.

As shown in FIG. 6, the encoder 100 of this embodiment includes a prediction encoding unit 2110, a residual encoding unit 120, and a combining unit 1130. As shown in FIG. 7, the residual encoding unit 120 includes a separation parameter generator 121, an encoding unit 122, and a variable length coding unit 123. The separation parameter generator 121 includes a parameter calculator 121a and a quantizer 121b, and the encoding unit 122 includes a separation calculator 2122a, a combining unit 2122c, a Huffman coding unit 122b, a code table selector 122d, and a code table memory 122e.

As shown in FIG. 8, the decoder 200 in this embodiment includes a separator 1210, a residual decoding unit 220, and a prediction decoding unit 2230. As shown in FIG. 9, the residual decoding unit 220 includes a decoding unit 221 and a variable length decoding unit 222. The decoding unit 221 includes a separator 2221a, a combination calculator 2221b, a Huffman decoding unit 221c, and a code table memory 221e.

The encoder 100 and the decoder 200 in this embodiment are a special device implemented when a given program read into a known or special computer that includes a central processing unit (CPU), a random-access memory (RAM), a read-only memory (ROM), and the like is executed by the CPU. A frame buffer 2111 and the code table memories 122e and 221e are RAMs, cache memories, registers, or a different type of memories, and other processing units are configured when the CPU executes corresponding programs, for example. At least some of the processing units may be configured by electronic circuits such as an integrated circuit. The encoder 100 or the decoder 200 may include a temporary memory where data output after processing in each processing unit is stored or data is read for processing in the processing unit. This method of implementing the processing unit is used in subsequent embodiments and modifications thereof.

<Pre-Processing>

FIG. 10A is a correspondence table showing an example of a correspondence relationship among code tables stored in the code table memory 122e in the residual encoding unit 120 and the code table memory 221e in the residual decoding unit 220, separation parameters, and indices. FIG. 10B is a diagram illustrating an example of a relationship among frequencies at which the code tables listed in FIG. 10A are selected, separation parameters s, and indices h. FIGS. 11A to 11C are views showing examples of code tables listed in the correspondence table in FIG. 10A. In the code tables, an input value to be encoded, a corresponding code, and the bit length of the code are associated with each other. FIG. 12 lists examples of code tables corresponding to variable length coding performed by the variable length coding unit 123 in the residual encoding unit 120 and decoding performed by the variable length decoding unit 222 in the residual decoding unit 220.

In the processing preceding encoding and decoding, code tables T[h, s] indicating a plurality of variable length coding schemes for encoding a quotient q(n) are stored in the code table memory 122e in the residual encoding unit 120 (FIG. 7) and the code table memory 221e in the residual decoding unit 220 (FIG. 9). M(s) code tables T[h, s] (M(s) is an integer not smaller than 1) are set for each separation parameter s, and each code table T[h, s] is given an index h for identifying itself. Each code table T[h, s] may have a different index h, but different indices h assigned to different code tables T[h, s] of an identical separation parameter s would be sufficient since the code tables T[h, s] in this embodiment are specified for respective separation parameters s. Accordingly, in this embodiment, each code table T[h, s] is identified by a combination of a separation parameter s and an index h. FIG. 10A shows an example when M(s)=5, where five code tables T[h, s] (index h=0 to 4) are set for each separation parameter s. Each code table T[h, s] is associated with a combination of a separation parameter s and an index h, and a single code table T[h, s] is identified by specifying a combination of the separation parameter s and the index h. The code table T[h, s] identified by the combination of the separation parameter s and the index h in the code table memory 122e is the same as the code table T[h, s] identified by the combination of the separation parameter s and the index h in the code table memory 221e.

An example of code tabled T[h, s] stored in the code table memory 122e or the code table memory 221e is Huffman tables for Huffman coding, and may include a Huffman table for performing encoding identical to Alpha coding. In the example shown in FIGS. 11A to 11C, a Huffman table for performing encoding identical to Alpha coding is decided as the code table T[0, 3] (FIG. 11A), and Huffman tables for performing Huffman coding differing from Alpha coding are decided as the code table T[1, 3] and the code table T[2, 3] (FIGS. 11B and 11C).

While the encoder 100 selects an optimum separation parameter s and an index h for identifying the variable length coding scheme of the quotient, the frequency distribution of the separation parameters s and the indexes h to be selected is uneven, as described earlier. This embodiment assumes the following, for example: the dividends are integers (integers expressed by eight bits) not smaller than 0 but smaller than $2^8$; the separation parameter s can range from 0 to 7 both inclusive; the frequency at which the separation parameter s at a first distance from 3 is selected is higher than the frequency at which the separation parameter s at a second distance from 3 is selected, the second distance being greater than the first distance. The value of the index h in this embodiment decreases as the corresponding code table T[h, s] gets closer to a code table for performing variable length coding identical to Alpha coding, and the value increases as the corresponding table gets farther away from a code table for performing variable length coding identical to Alpha coding. The correspondence between the amplitude of the index h and the code table T[h, s] described here is an example. A code table T[h, s] closer to a code table for performing variable length coding identical to Alpha coding may be given an index h of a greater value or an index h closer to a specific value. In this embodiment, the modulus increases as the separation parameter s increases. Consequently, as the separation parameter s increases, the quotient q(n) obtained in step (B), described below, decreases toward 0, and the approximation to the Laplace distribution occurs more frequently.

FIG. 10B shows examples of frequencies at which code tables T[h, s] are selected. A double circle indicates the highest level of selection frequency; a single circle indicates the next highest level of selection frequency; a triangle indicates a lower level of selection frequency. In the examples shown, a separation parameter s close to 3 is selected at a highest frequency, and an index h close to 0 (close to Alpha coding) is selected at a high frequency when the separation parameter s is not smaller than 2.

That type of frequency distribution is trained in advance, and code tables for optimum variable length coding schemes for encoding side information [h, s] are set in the variable length coding unit 123 and the variable length decoding unit 222, in accordance with the frequency distribution of the side information [h, s] that includes the combination of the separation parameter s and the index h (see the example shown in FIG. 12). In the example shown in FIG. 12, the side information [h, s] and the assigned code have a one-to-one correspondence.

The optimum variable length coding scheme for encoding the side information [h, s] assigns a shorter code to side information [h, s] identifying a code table T[h, s] to be selected at a higher frequency and assigns a longer code to side information [h, s] identifying a code table T[h, s] to be selected at a lower frequency. In the situation described earlier, that type of coding scheme should be a variable length coding scheme having two characteristics, as described below.

The code length of a first code being shorter than the code length of a second code is more frequent than the code length of the first code being longer than the code length of the second code. The first code in this example is assigned to side information [h, s] that includes the separation parameter s at a first distance from 3 (corresponding to a predetermined specific value). The second code in this example is assigned to side information [h, s] that includes the separation parameter s at a second distance from 3 (corresponding to the predetermined specific value). The second distance is greater than the first distance.

When the separation parameter s is 2 or greater (corresponding to when the modulus is not smaller than a predetermined threshold), the code length of a third code being shorter than the code length of a fourth code is more frequent than the code length of the third code being longer than the code length of the fourth code. The fourth code is assigned to side information [h, s] that includes an index h for identifying a first coding scheme for performing first variable length coding that differs from Alpha coding. The third code is assigned to side information [h, s] that includes an index h for identifying a second coding scheme for performing second variable length coding that is closer to Alpha coding than the first variable length coding. As in the example shown by Equation (13), the variable length coding gets closer to Alpha coding as the sum of (bu(k)−bx(k))(fu(k)−fx(k)) corresponding to values k to be encoded decreases, where bu(k) is the bit length of the code assigned to the value k to be encoded by Alpha coding; bx(k) is the bit length of the code assigned to the value k to be encoded by variable length coding; $fu(k)=0.5^{bu(k)}$; and $fx(k)=0.5^{bx(k)}$.

<Encoding Method>

Figure 13:
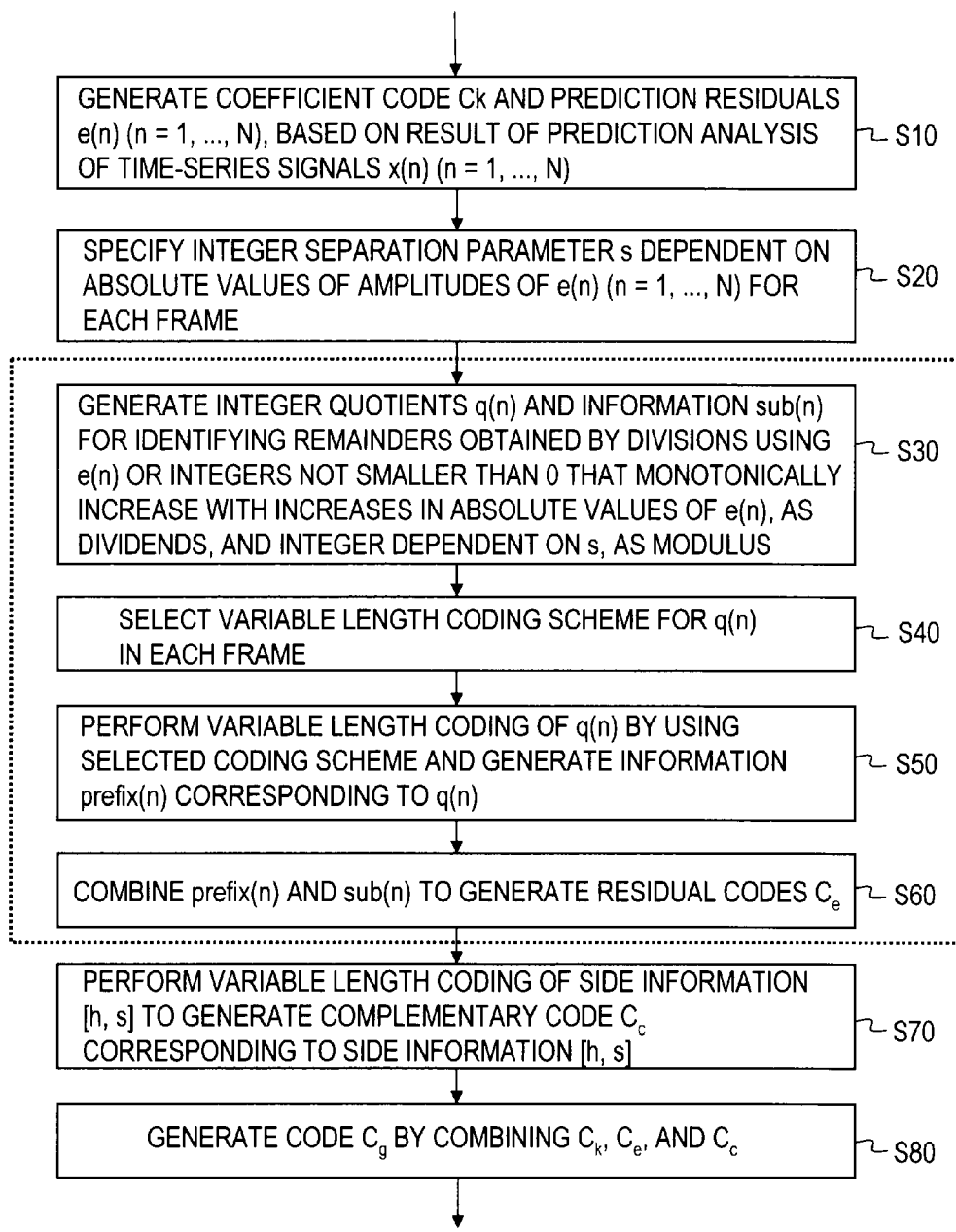
FIG. 13 is a flowchart illustrating an encoding method according to the first embodiment.
Figure 14A:
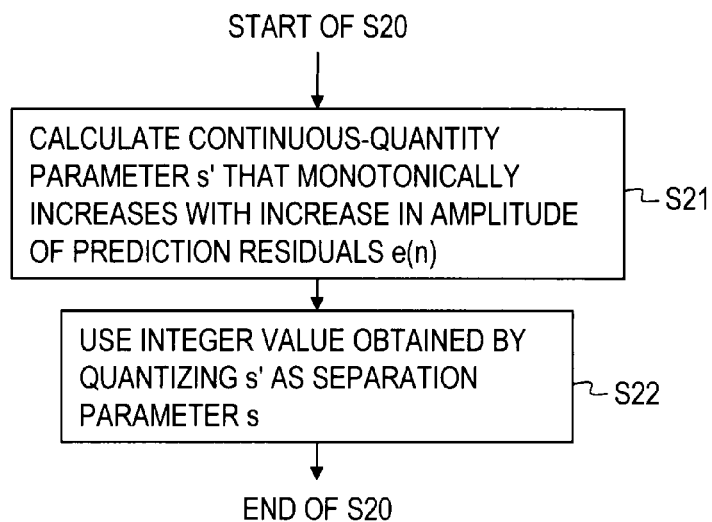
FIG. 14A is a flowchart illustrating an example of details of step S20 in FIG. 13.
Figure 14B:
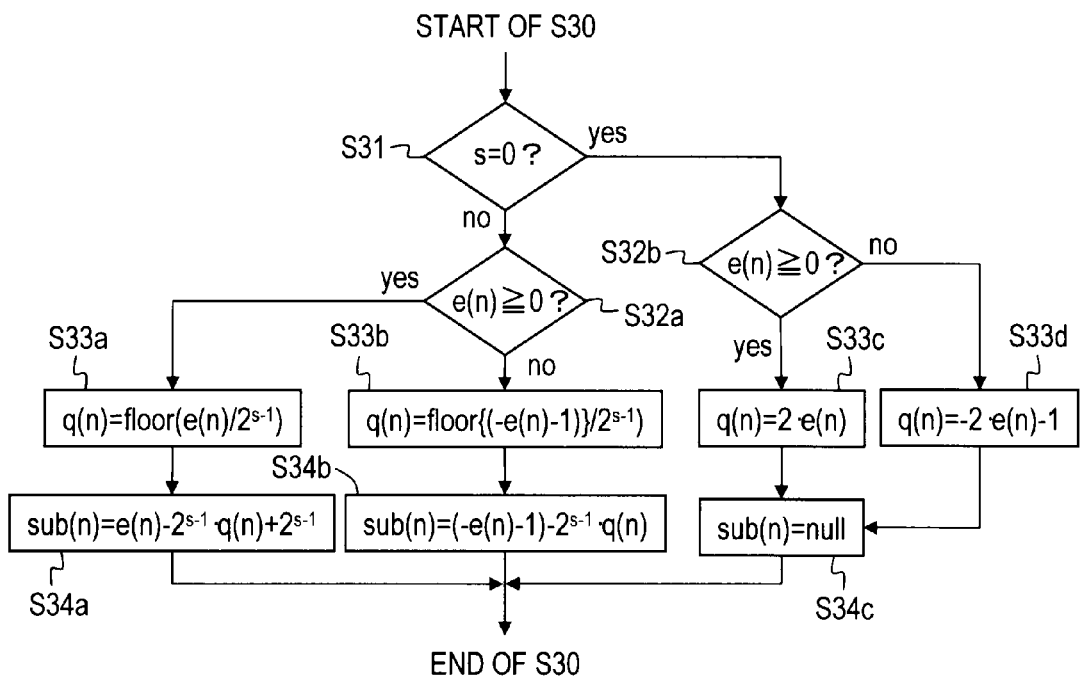
FIG. 14B is a flowchart illustrating an example of details of step S30 in FIG. 13.

FIG. 13 is a flowchart illustrating the encoding method in the first embodiment. FIG. 14A is a flowchart illustrating an example of the details of step S20 shown in FIG. 13, and FIG. 14B is a flowchart illustrating an example of the details of step S30 shown in FIG. 13. The encoding method in the embodiment will be described next with reference to those figures.

The prediction encoding unit 2110 in the encoder 100 (FIG. 6) receives sampled and quantized PCM time-series signals x(n). These time-series signals x(n) may have been subjected to linear quantization (sometimes referred to as uniform quantization) or nonlinear quantization (sometimes referred to as nonuniform quantization) such as companding quantization (refer to ITU-T Recommendation G.711, "Pulse Code Modulation (PCM) of Voice Frequencies," for example). The time-series signals x(n) need not be PCM signals and may be unquantized signals. The prediction encoding unit 2110 performs linear prediction analysis of the time-series signals x(n) (n=1, . . . , N) in each frame, as described earlier, generates prediction residuals e(n) (n=1, . . . , N) and a coefficient code $C_k$ corresponding to PAR-COR coefficients in accordance with the result of the linear prediction analysis, and outputs them (step S10). The prediction encoding unit 2110 may be configured to perform linear prediction analysis of the input time-series signals x(n) directly or may be configured to perform linear prediction analysis after mapping the input non-linearly quantized time-series signals x(n) to linearly quantized signals or other non-linearly quantized signals.

The prediction residuals e(n) (n=1, . . . , N) output from the prediction encoding unit 2110 are input to the residual encoding unit 120. The prediction residuals e(n) input to the residual encoding unit 120 are values in integer representation, such as integers ranging from $-(2^8-1)$ to $+(2^8-1)$.

The prediction residuals e(n) input to the residual encoding unit 120 (FIG. 7) are sent to the separation parameter generator 121, and the separation parameter generator 121 specifies an integer separation parameter s dependent on the amplitude of the prediction residuals e(n) for each frame and outputs the parameter (step S20).

[Example of Details of Step S20]

In this embodiment, the parameter calculator 121a in the separation parameter generator 121 calculates for each frame a continuous-quantity parameter s' that monotonically increases with increases in the amplitude of the prediction residuals e(n), in accordance with the equation given below, and outputs the parameter s' (step S21).

$$s' = \log_2\{\ln 2 \cdot (2 \cdot D/N)\} \quad (14)$$

$$D = \sum_{n=1}^{N} |e(n)|$$

The continuous-quantity parameter s' is input to the quantizer 121b, and the quantizer 121b quantizes the continuous-quantity parameter s' to generate an integer separation parameter s and outputs the parameter s (step S22). This quantization is the mapping of the continuous-quantity parameter s' in the range of $s \leq s' < s+1$, for example, to an integer separation parameter s (end of description of Example of details of step S20).

The encoding unit 122 (FIG. 7) generates residual codes $C_e$ corresponding to the prediction residuals e(n) and outputs the codes (steps S30 to S60). At least some residual codes $C_e$ include first information prefix(n) and second information sub(n). In the example, the first information prefix(n) identifies integer quotients q(n) obtained by divisions. The dividends of the divisions are the prediction residuals e(n) or integers not smaller than 0 that increase monotonically with increases in the amplitude of the prediction residuals e(n). The modulus of the divisions is an integer dependent on the separation parameter s decided for the time segment corresponding to the prediction residual e(n) (separation parameter s or an integer mapped from the separation parameter s). The second information sub(n) in this example identifies the remainders obtained when the dividends are divided by the modulus. Some of the residual codes $C_e$ may not include the second information sub(n).

The separation calculator 2122a in the encoding unit 122 is given the prediction residuals e(n) input to the residual encoding unit 120 and the separation parameter s output from the separation parameter generator 121. The separation parameter s has been decided for the frame corresponding to the input prediction residuals e(n). By using those values, the separation calculator 2122a generates integer quotients q(n) and information sub(n) for identifying the corresponding remainders (corresponding to the second information) obtained by divisions using the prediction residuals e(n) or integers not smaller than 0 that monotonically increase with increases in the amplitude of the prediction residuals e(n), as dividends, and an integer dependent on the separation parameter s, as a modulus, and outputs them (step S30).

[Example of Details of Step S30]

The separation calculator 2122a first judges whether the input separation parameter s is 0 (step S31). If it is not judged that s=0, the separation calculator 2122a judges whether the input prediction residual e(n) is 0 or greater (step S32a). If it is judged that e(n) 0, the separation calculator 2122a generates an integer quotient q(n) in accordance with Equation (1) (step S33a), also generates the information sub(n) for identifying the remainder in accordance with Equation (5), and outputs them (step S34a).

In Equation (1), "$2^{s-1}$" corresponds to the "integer (modulus) dependent on the separation parameter s." If it is not judged in step S32a that e(n) 0, the separation calculator 2122a generates an integer quotient q(n) in accordance with Equation (2) (step S33b), also generates the information sub(n) for identifying the remainder in accordance with Equation (6), and outputs them (step S34b). In Equation (2), "(−e(n)−1)" corresponds to the "integers (dividends) not smaller than 0 that monotonically increase with increases in the amplitude of the prediction residuals e(n)", and "$2^{s-1}$" corresponds to the "integer (modulus) dependent on the separation parameter s."

If it is judged in step S31 that s=0, the separation calculator 2122a judges whether the input prediction residual e(n) is 0 or greater (step S32b), and, if it is judged that e(n)≧0, generates a quotient q(n) in accordance with Equation (3) (step S33c) and outputs sub(n) as null (step S34c). In Equation (3), "$2 \cdot e(n)$" in "$q(n)=2 \cdot e(n)=2 \cdot e(n)/2^s$ (s=0)" corresponds to the integers (dividends) not smaller than 0 that monotonically increase with increases in the amplitude of the prediction residuals e(n)", and "$2^s=1$ (s=0)" corresponds to the "integer (modulus) dependent on the separation parameter s."

If it is not judged in step S32b that e(n)≧0, the separation calculator 2122a generates a quotient q(n) in accordance with Equation (4) (step S33d) and outputs sub(n) as null (step S34c). In Equation (4), "$-2 \cdot e(n)-1$" in "$q(n)=-2 \cdot e(n)-1=(-2 \cdot e(n)-1)/2^s$ (s=0)" corresponds to the "integers (dividends) not smaller than 0 that monotonically increase with increases in the amplitude of the prediction residuals e(n)", and "$2^s=1$ (s=0)" corresponds to the "integer (modulus) dependent on the separation parameter s" (end of description of Example of details of step S30).

The quotients q(n) (n=1, . . . , N) output from the separation calculator 2122a and the separation parameter s output from the separation parameter generator 121 are input to the code table selector 122d. The code table selector 122d uses the values to select a variable length coding scheme for performing variable length coding of the quotients q(n) (n=1, . . . , N) for each frame (step S40). For example, the code table selector 122d calculates the sum of the numbers of bits of the codes corresponding to the quotients q(n) (n=1, . . . , N) of a frame for each code table T[h, s] corresponding to the input separation parameter s, with reference to the code table memory 122e, and selects the code table T[h, s] that has the smallest sum. If s=2 in the example shown in FIG. 10A, for example, the code table selector 122d calculates the sum of the numbers of bits of the codes corresponding to the quotients q(n) (n=1, . . . , N) of each frame for each of the code tables T[0, 2], T[1, 2], T[2, 2], T[3, 2], and T[4, 2] and selects the code table that has the smallest sum from the code tables T[0, 2], T[1, 2], T[2, 2], T[3, 2], and T[4, 2]. The code table selector 122d outputs side information [h, s] containing an index h for identifying the variable length coding scheme selected for each frame and the input separation parameter s. The side information [h, s] may contain just the index h and the separation parameter s and may also include additional information, such as a header.

The side information [h, s] of each frame output from the code table selector 122d and the quotients q(n) (n=1, . . . , N) output from the separation calculator 2122a corresponding to the frame are input to the Huffman coding unit 122b. The Huffman coding unit 122b searches through the code table memory 122e using the side information [h, s] and extracts a code table T[h, s] corresponding to the side information [h, s]. By using the extracted code table T[h, s], the Huffman coding unit 122b generates information prefix(n) (corresponding to the first information) by performing variable length coding of each quotient q(n) corresponding to the frame and outputs the information (step S50).

The information prefix(n) output from the Huffman coding unit 122b and the information sub(n) output from the separation calculator 2122a are input to the combining unit 2122c. The combining unit 2122c outputs a code containing the information prefix(n) (corresponding to the first information) and the information sub(n) (corresponding to the second information) as a residual code $C_e$ corresponding to at least a part of the prediction residuals e(n) (step S60). If sub(n) is not null, for example, the combining unit 2122c executes a step in which the information prefix(n) and the information sub(n) are combined, and the connected bit prefix(n)|sub(n) is output as a residual code $C_e$. If sub(n) is null, a step in which the information prefix(n) is output as a residual code $C_e$ is executed. The residual code $C_e$ may include additional information, such as a header, besides the information prefix(n) and/or the information sub(n).

The side information [h, s] output from the code table selector 122d is input to the variable length coding unit 123.

The variable length coding unit 123 performs variable length coding of each piece of the side information [h, s], by using the code table decided as described earlier (see FIG. 12, for example) and outputs a generated complementary code $C_c$ corresponding to the side information [h, s] (step S70).

The coefficient code $C_k$ corresponding to the PARCOR coefficients, the residual codes $C_e$ corresponding to the prediction residuals e(n), and the complementary code $C_c$ corresponding to the side information [h, s] are input to the combining unit 1130 (FIG. 6). The combining unit 1130 generates a code $C_g$ by combining them and outputs the code (step S80).

<Decoding Method>

Figure 15:
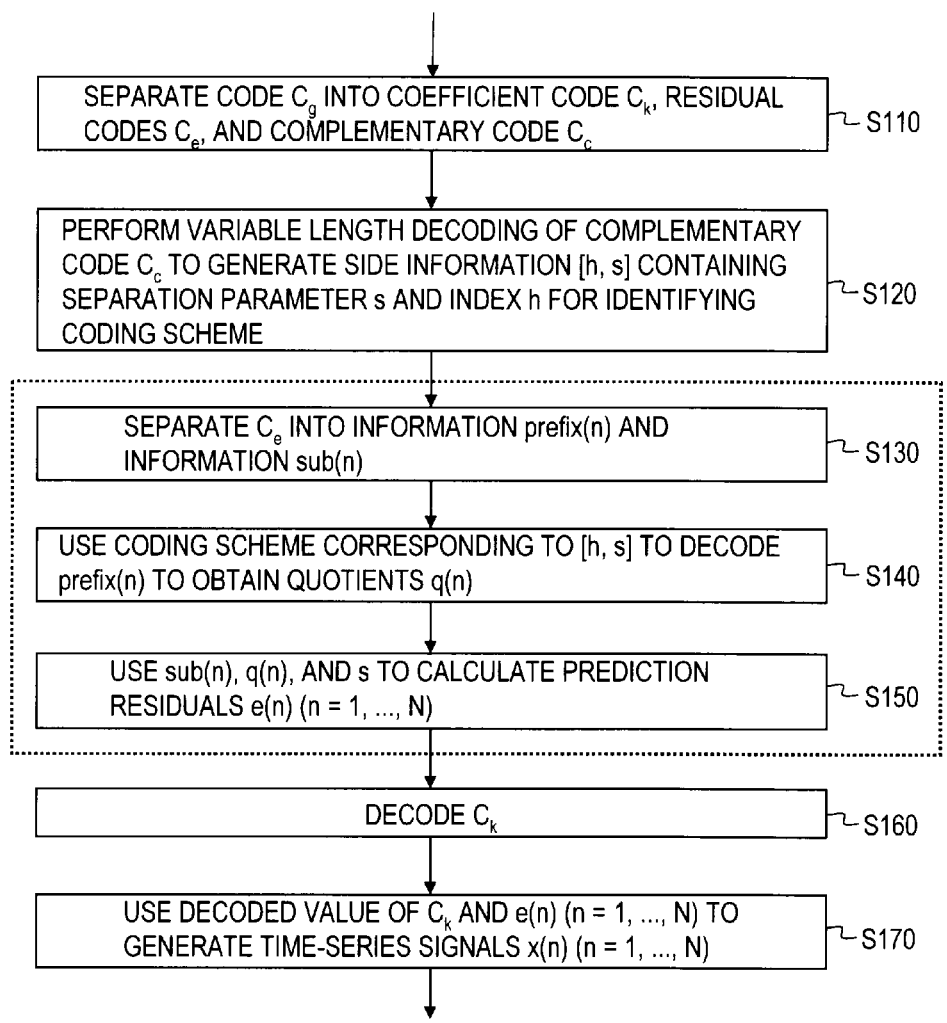
FIG. 15 is a flowchart illustrating a decoding method according to the first embodiment.
Figure 16:
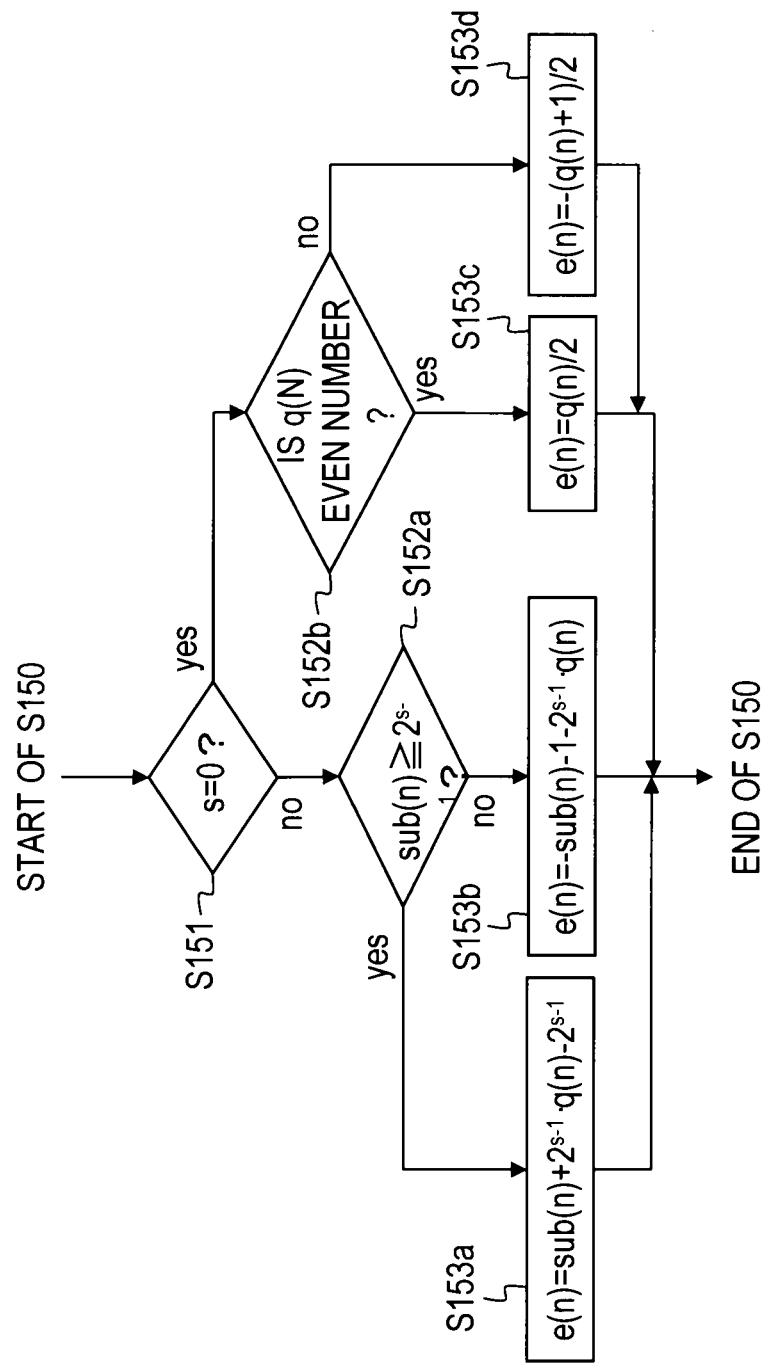
FIG. 16 is a flowchart illustrating an example of details of step S150.

FIG. 15 is a flowchart illustrating a decoding method in the first embodiment. FIG. 16 is a flowchart showing an example of details of step S150. The decoding method in this embodiment will now be described with reference to those figures.

The separator 1210 of the decoder 200 separates the code $C_g$ input to the decoder 200 into the coefficient code $C_k$ corresponding to the coefficients, the residual codes $C_e$ corresponding to the prediction residuals e(n), and the complementary code $C_c$ corresponding to the side information [h, s], and outputs them (step S110).

The complementary code $C_c$ corresponding to the side information [h, s] is input to the variable length decoding unit 222. The variable length decoding unit 222 performs variable length decoding of the complementary code $C_c$ by using the code table decided as described earlier (see FIG. 12, for example) and outputs the side information [h, s] containing the separation parameter s and the index h for identifying the variable length coding scheme (step S120).

The decoding unit 221 uses the residual codes $C_e$ corresponding to the prediction residuals e(n) and the side information [h, s] to generate and output prediction residuals e(n) (steps S130 to S150).

The residual codes $C_e$ corresponding to the prediction residuals e(n) are first input to the separator 2221a in the residual decoding unit 220 (FIG. 9). The separator 2221a separates the input residual codes $C_e$ into information prefix(n) and information sub(n) and outputs the generated information (step S130). If the input residual codes $C_e$ do not include information sub(n), the separator 2221a obtains the information prefix(n) from the input residual codes $C_e$.

The side information [h, s] output from the variable length decoding unit 222 and the information prefix(n) output from the separator 2221a are input to the Huffman decoding unit 221c. The Huffman decoding unit 221c searches through the code table memory 221e by using the side information [h, s] and extracts a code table T[h, s] corresponding to the side information [h, s]. The Huffman decoding unit 221c decodes the information prefix(n) by using the extracted code table T[h, s] to generate and output quotients q(n) (step S140).

The quotients q(n) output from the Huffman decoding unit 221c, the information sub(n) output from the separator 2221a, and the separation parameter s included in the side information [h, s] output from the variable length decoding unit 222 are input to the combination calculator 2221b. By using them, the combination calculator 2221b calculates and outputs the prediction residuals e(n) (step S150).

[Example of Details of Step S150]

The combination calculator 2221b first judges whether the input separation parameter s is 0 (step S151). If it is not judged that s=0, the combination calculator 2221b judges whether the information sub(n) is $2^{s-1}$ or greater (step S152a). This judgment corresponds to judging whether the prediction residual e(n) is 0 or greater. If it is judged in step S152a that sub(n) $2^{s-1}$, the combination calculator 2221b calculates the prediction residual e(n) in accordance with the equation given below and outputs the result (step S153a).

$$e(n)=sub(n)+2^{s-1} \cdot q(n)-2^{s-1} \quad (15)$$

If it is judged in step S152a that sub(n)<$2^{s-1}$, the combination calculator 2221b calculates the prediction residual e(n) in accordance with the equation given below and outputs the result (step S153b).

$$e(n)=-sub(n)-1-2^{s-1} \cdot q(n) \quad (16)$$

If it is judged in step S151 that s=0, the combination calculator 2221b judges whether the quotient q(n) is an even number (step S152b). This judgment corresponds to judging whether the prediction residual e(n) is 0 or greater. If it is judged in step S152b that the quotient q(n) is an even number, the combination calculator 2221b calculates the prediction residual e(n) in accordance with the equation given below and outputs it (step S153c).

$$e(n)=q(n)/2 \quad (17)$$

If it is judged in step S152b that the quotient q(n) is an odd number, the combination calculator 2221b calculates the prediction residual e(n) in accordance with the equation given below and outputs it (step S153d).

$$e(n)=-(q(n)+1)/2 \quad (18)$$

The prediction residual e(n) generated as described above is output from the combination calculator 2221b (end of description of Example of details of step S150).

The prediction residuals e(n) (n=1, ..., N) output from the residual decoding unit 220 and the coefficient code $C_k$ output from the separator 1210 are input to the prediction decoding unit 2230. A coefficient decoding unit 2231 in the prediction decoding unit 2230 decodes the coefficient code $C_k$ to generate quantized PARCOR coefficients i(m) (m=1, ..., M) and outputs them (step S160). The prediction decoding unit 2230 uses, as described above, the quantized PARCOR coefficients i(m) (m=1, ..., M) and the prediction residuals e(n) (n=1, ..., N) to generate and output time-series signals x(n) (n=1, ..., N) (step S170).

[Modification 1 of First Embodiment]

Modification 1 of the first embodiment will now be described. In this modification, the encoder maps the prediction residuals e(n) to integers e'(n) not smaller than 0, and then specifies the separation parameter and performs encoding. The decoder performs inverse conversion of the decoded integers e'(n) to restore the prediction residuals e(n). Differences from the first embodiment will be mainly described below, and a description of commonalities with the first embodiment will be omitted.

<Configuration>

Figure 17:
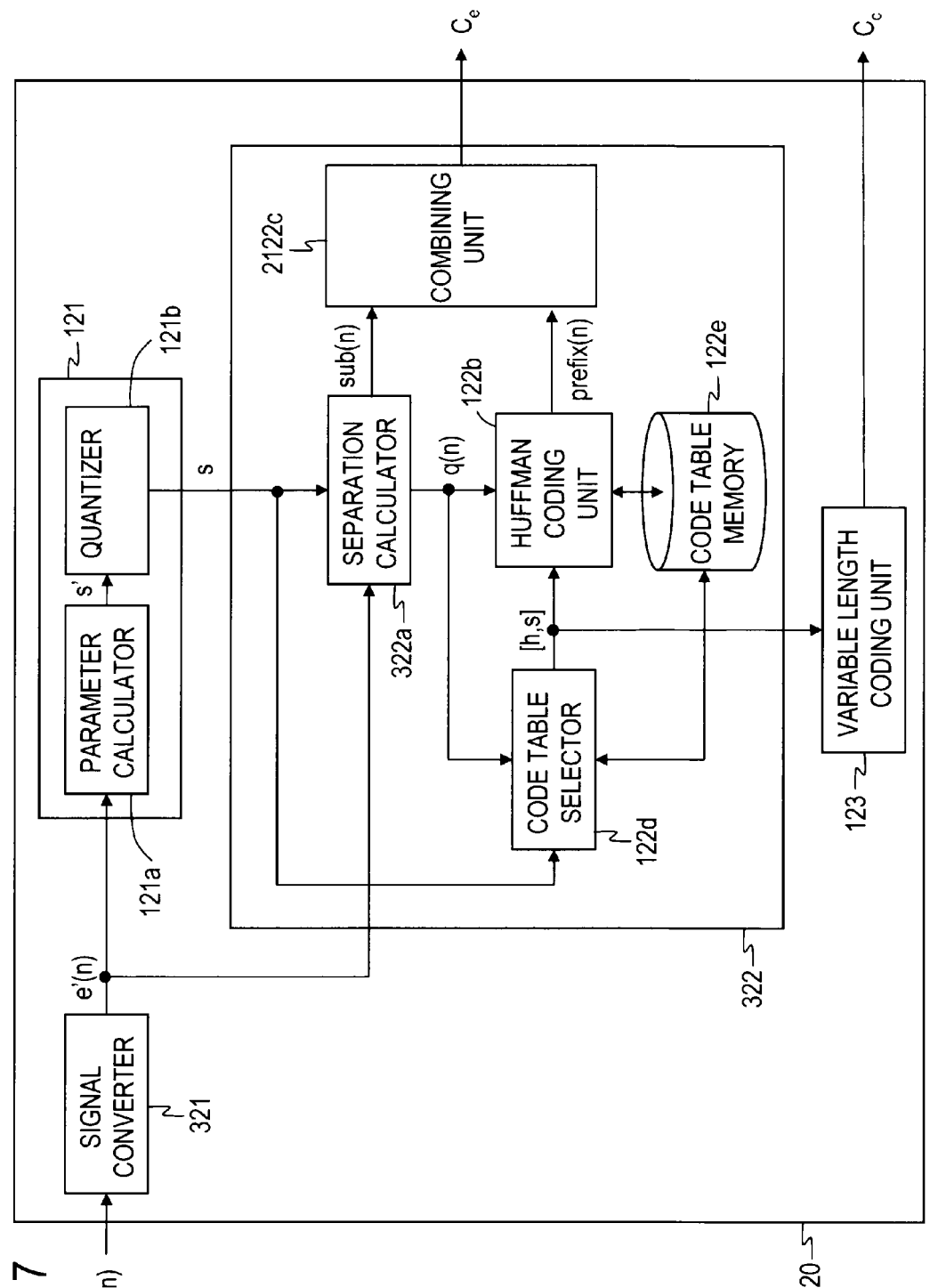
FIG. 17 is a block diagram illustrating the functional configuration of a residual encoding unit in Modification 1 of the first embodiment.
Figure 18:
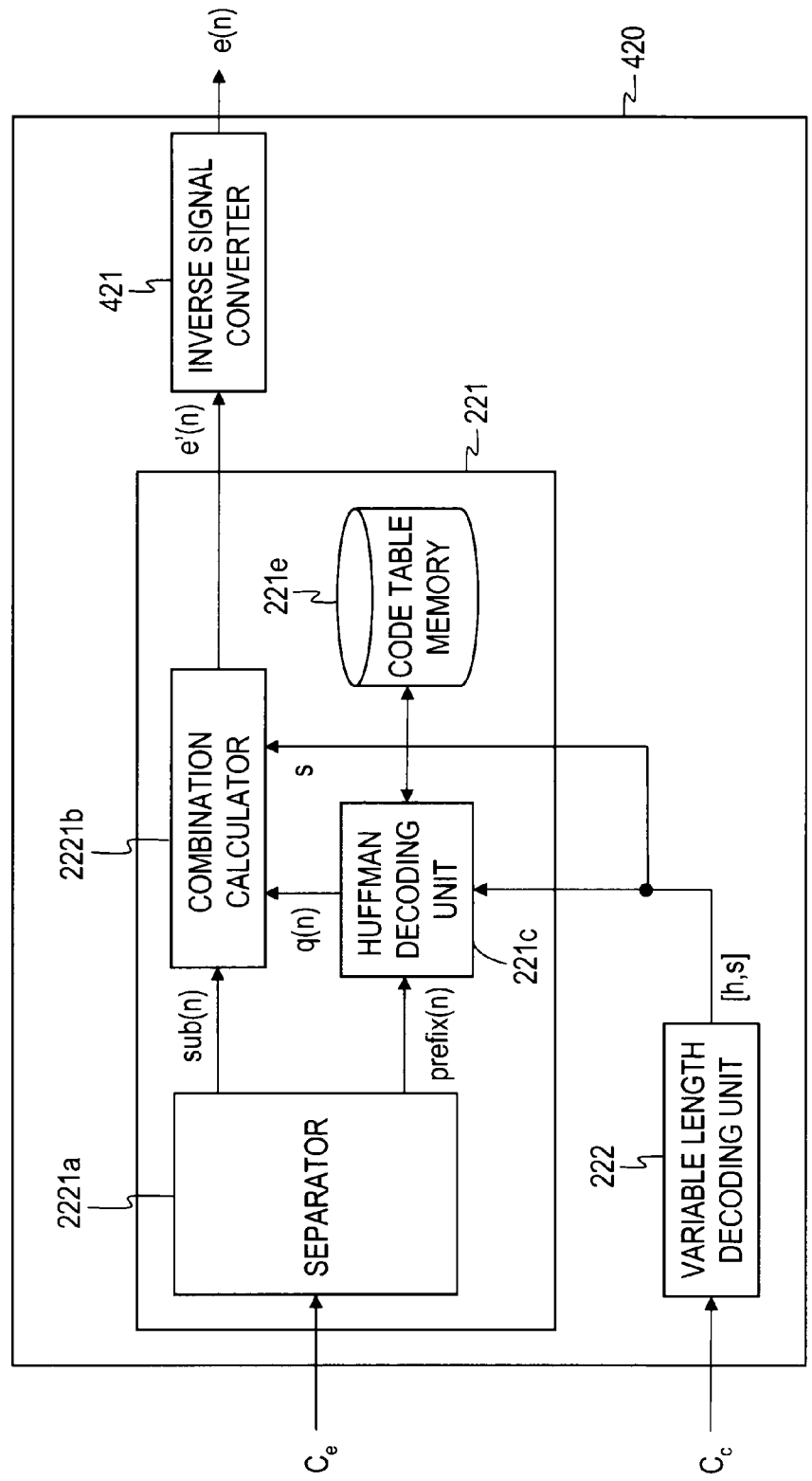
FIG. 18 is a block diagram illustrating the functional configuration of a residual decoding unit in Modification 1 of the first embodiment.

The configuration of Modification 1 differs from the configuration of the first embodiment in that the residual encoding unit 120 in the encoder 100 is replaced with a residual encoding unit 320 and that the residual decoding unit 220 in the decoder 200 is replaced with a residual decoding unit 420. FIG. 17 shows a block diagram illustrating the functional configuration of the residual encoding unit 320 in Modification 1 of the first embodiment, and FIG. 18 shows a block diagram illustrating the functional configuration of the residual decoding unit 420 in Modification 1 of the first embodiment. In those diagrams, components identical to those in the first embodiment will be denoted by the same reference numerals as used in the first embodiment, and a description of those components will be omitted.

As shown in FIG. 17, the residual encoding unit 320 includes a signal converter 321, a separation parameter generator 121, an encoding unit 322, and a variable length coding unit 123. The encoding unit 122 includes a separation calculator 322a, a combining unit 2122c, a Huffman coding unit 122b, a code table selector 122d, and a code table memory 122e. As shown in FIG. 18, the residual decoding unit 420 includes a decoding unit 221, a variable length decoding unit 222, and an inverse signal converter 421.

<Pre-Processing>

Pre-processing is the same as in the first embodiment.

<Encoding Method>

Figure 19:
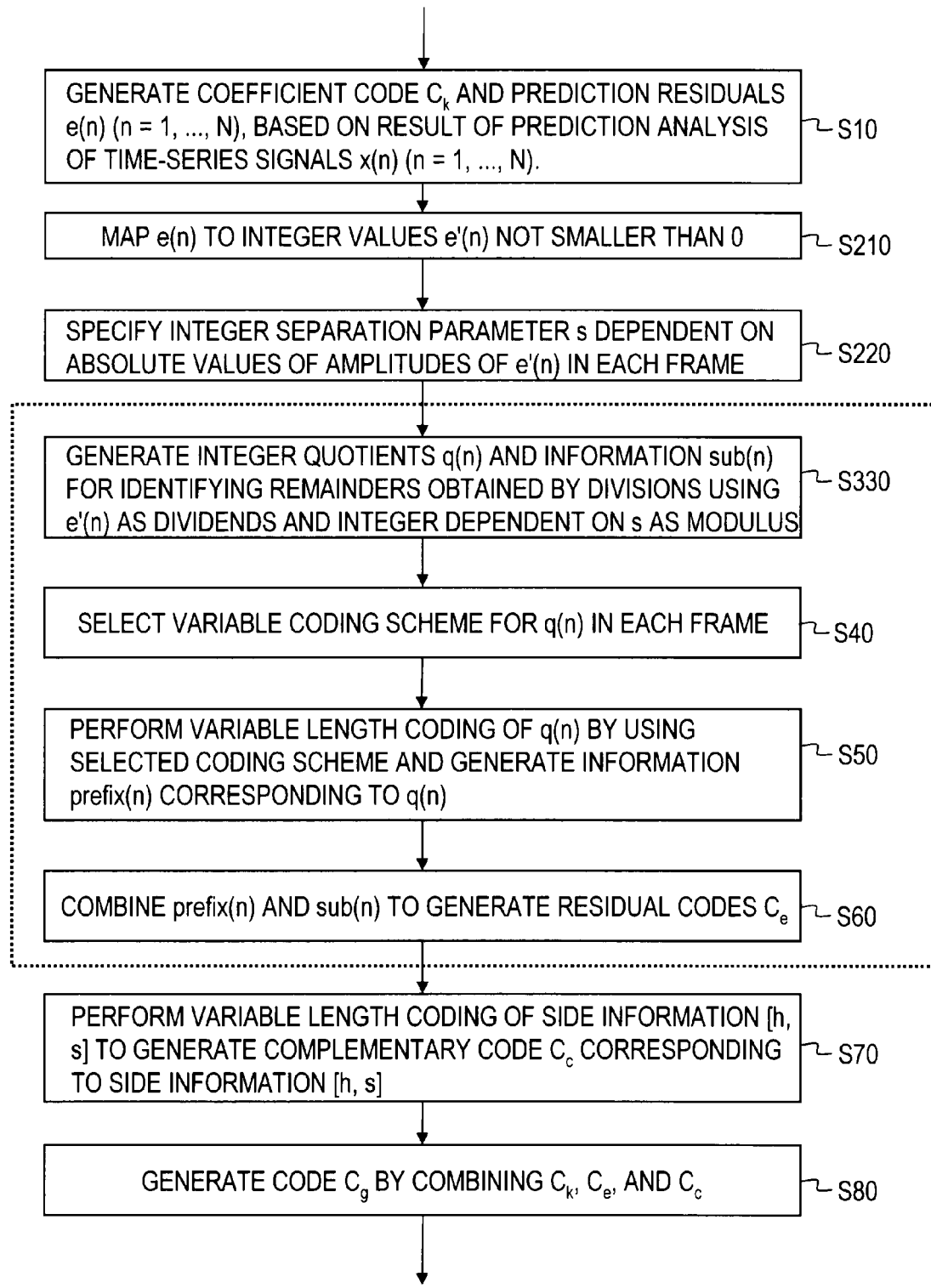
FIG. 19 is a flowchart illustrating an encoding method in Modification 1 of the first embodiment.
Figure 20:
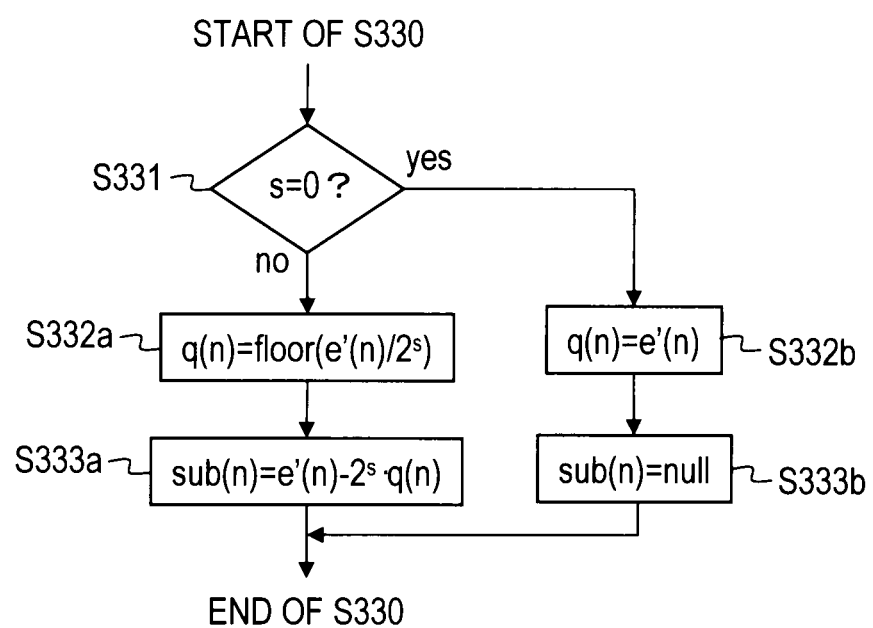
FIG. 20 is a flowchart illustrating an example of details of step S330 in FIG. 19.

FIG. 19 is a flowchart illustrating an encoding method in Modification 1 of the first embodiment. FIG. 20 is a flowchart illustrating an example of details of step S330 in FIG. 19. The encoding method of the modification will be described next with reference to those figures.

Step S10 described earlier is executed, and the prediction residuals e(n) input to the residual encoding unit 320 (FIG. 17) are input to the signal converter 321. The signal converter 321 maps the input prediction residuals e(n) to integers e'(n) not smaller than 0 (step S210). The values e'(n) are integers not smaller than 0 that increase monotonically with increases in the amplitude of the prediction residuals e(n). This mapping is performed in accordance with a predetermined rule. If the input prediction residuals e(n) are not smaller than 0, for example, they are mapped to odd integers with the order of amplitude maintained, or if the input prediction residual e(n) is smaller than 0, they are mapped to even integers with the order of amplitude maintained.

The values e'(n) (n=1, . . . , N) output from the signal converter 321 are sent to the separation parameter generator 121, and the separation parameter generator 121 decides an integer separation parameter s dependent on the amplitude of the values e'(n) (n=1, . . . , N) in each frame and outputs it (step S220). The processing in step S220 differs from the processing in step S20 only in that the prediction residuals e(n) are replaced with the values e'(n).

The encoding unit 322 (FIG. 17) generates information containing the first information prefix(n) and the second information sub(n) and outputs the information, as residual codes $C_e$ corresponding to at least some of the prediction residuals e(n) (steps S330 and S40 to S60). In this example, the first information prefix(n) identifies integer quotients q(n) obtained by divisions. The dividends of the divisions are the values e'(n) (corresponding to the "integers not smaller than 0 that monotonically increase with increases in the amplitude of the prediction residuals e(n)"). The modulus of the divisions is an integer dependent on the separation parameter s decided for the time segment to which the prediction residual e(n) corresponding to the value e'(n) belong (separation parameter s or an integer mapped from the separation parameter s). In this example, the second information sub(n) identifies the remainders obtained when the dividends are divided by the modulus. Some of the residual codes $C_e$ may not include the second information sub(n).

The separation calculator 322a in the encoding unit 322 receives the values e'(n) output from the signal converter 321 and the separation parameter s output from the separation parameter generator 121. The separation parameter s has been decided for the frame to which the prediction residuals e(n) corresponding to the input values e'(n) belong. By using them, the separation calculator 322a generates integer quotients q(n) obtained by divisions using the values e'(n) as the dividends and an integer dependent on the separation parameter s as the modulus, and information sub(n) (corresponding to the "second information") for identifying the corresponding remainders, and outputs them (step S330).

[Example of Details of Step S330]

The separation calculator 322a first judges whether the input separation parameter s is 0 (step S331). If it is not judged that s=0, the separation calculator 322a generates integer quotients q(n) in accordance with the equation given below (step S332a)

$$q(n)=\text{floor}(e'(n)/2^s) \quad (19)$$

and generates information sub(n) for identifying the remainders in accordance with the equation given below $$\text{sub}(n)=e'(n)-2^s\cdot q(n) \quad (20)$$

and outputs them (step S333a). In Equation (19), "$2^s$" corresponds to the "integer (modulus) dependent on the separation parameter s."

If s=0, the separation calculator 322a generates integer quotients q(n) in accordance with the equation given below (step S332b)

$$q(n)=e'(n) \quad (21)$$

and outputs sub(n) as null (step S333b). In Equation (21), "e'(n)" in "q(n)=e'(n)=e'(n)/$2^s$ (s=0)" corresponds to the "integers (dividends) not smaller than 0 that increase monotonically with increases in the amplitude of the prediction residuals e(n)," and "$2^s$=1 (s=0)" corresponds to the "integer (modulus) dependent on the separation parameter s (end of description of Example of details of step S330).

Then, the processing of steps S40 to S80 described in the first embodiment is executed.

<Decoding Method>

Figure 21:
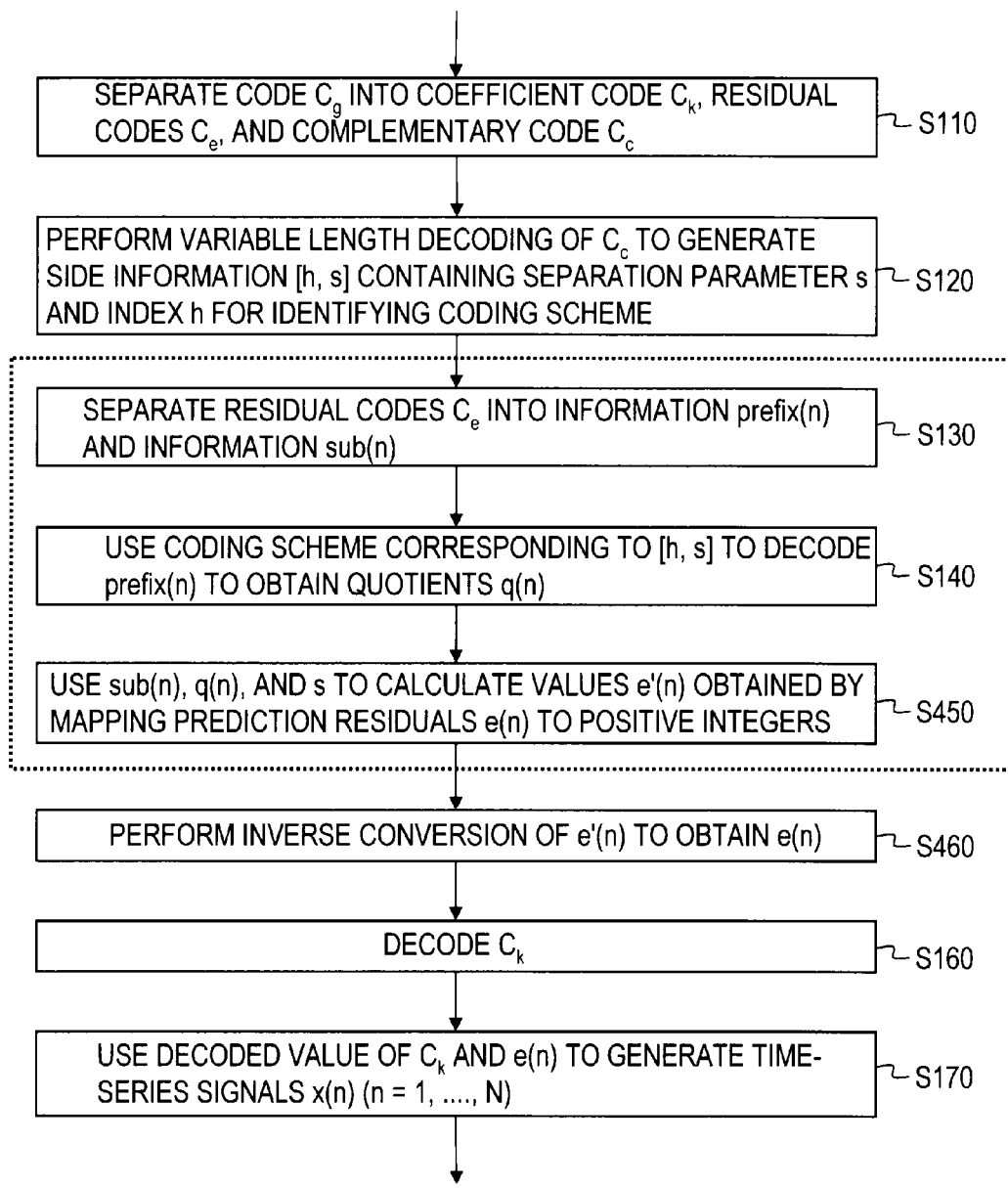
FIG. 21 is a flowchart illustrating a decoding method in Modification 1 of the first embodiment.
Figure 22:
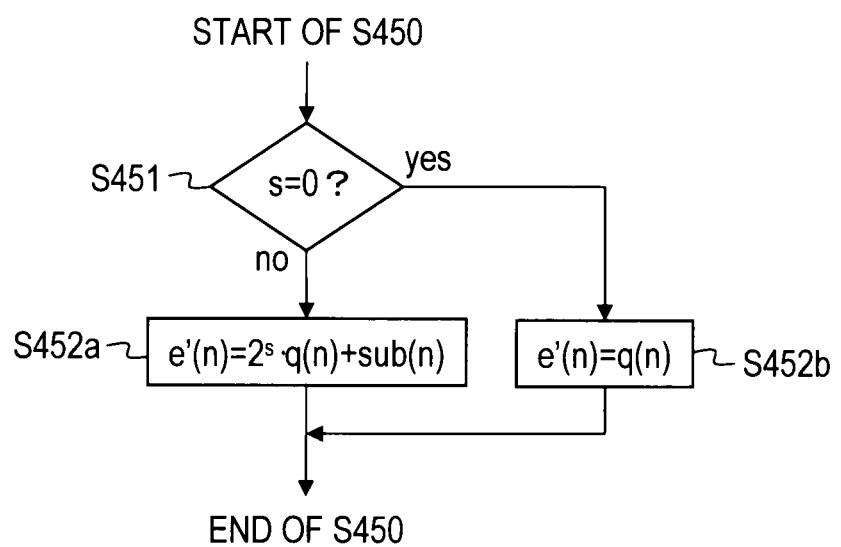
FIG. 22 is a flowchart illustrating an example of details of step S450.

FIG. 21 is a flowchart illustrating a decoding method in Modification 1 of the first embodiment. FIG. 22 is a flowchart illustrating an example of details of step S450. The decoding method in the modification will be described below with reference to those figures.

After the processing of steps S110 and S120 described in the first embodiment is executed, the decoding unit 221 uses the residual codes $C_e$ corresponding to the prediction residuals e(n) and the side information [h, s] to generate and output integer values e'(n) not smaller than 0 that monotonically increase with increases in the amplitude of the prediction residuals e(n) (steps S130, S140, S450). After the processing of steps S130 and S140 described in the first embodiment is executed, the quotients q(n) output from the Huffman decoding unit 221c, the information sub(n) output from the separator 2221a, and the separation parameter s included in the side information [h, s] output from the variable length decoding unit 222 are input to the combination calculator 2221b. By using them, the combination calculator 2221b calculates and outputs the values e'(n) (step S450).

[Example of Details of Step S450]

The combination calculator 2221b first judges whether the input separation parameter s is 0 (step S451). If it is not judged that s=0, the combination calculator 2221b calculates the values e'(n) in accordance with the following equation $$e'(n)=2^s\cdot q(n)+\text{sub}(n) \quad (22)$$

and outputs the values (step S452a).

If it is judged that s=0, the combination calculator 2221b calculates the values e'(n) in accordance with the following equation $$e'(n)=q(n) \quad (23)$$

and outputs the values (step S452b) (end of description of Example of details of step S450).

The values e'(n) output from the combination calculator 2221b are input to the inverse signal converter 421, and the inverse signal converter 421 performs inverse conversion of the values e'(n) to obtain and output the prediction residuals e(n) (step S460). The inverse conversion is the inverse conversion of the processing in the signal converter 321.

Then, the processing of steps S160 and S170 described in the first embodiment is executed. Equations (1) and (5) with e(n) replaced by e'(n) may be used instead of Equations (19) and (20), and Equation (3) with e(n) replaced by e'(n) may be used instead of Equation (21). In that case, Equation (15) with e(n) replaced by e'(n) is used instead of Equation (22), and Equation (17) with e(n) replaced by e'(n) is used instead of Equation (23). Irrespective of whether s=0, the separation calculator 322a may generate integer quotients q(n) in accordance with Equation (19) and the information sub(n) for identifying the remainders in accordance with Equation (20), and the combination calculator 2221b may calculate the values e'(n) in accordance with Equation (22).

[Modification 2 of First Embodiment]

Modification 2 of the first embodiment will be described next. This modification is associated with a combination of code tables stored in the code table memories 122e and 221e in the residual encoding unit 120 or 320 and the residual decoding unit 220 or 420. Differences from the first embodiment will be mainly described below, and a description of commonalities with the first embodiment will be omitted.

FIGS. 23A, 24A, and 24C are correspondence tables showing examples of the correspondence relationship among code tables T[h, s] stored in the code table memory 122e and the code table memory 221e, separation parameters s, and indices h. FIGS. 23B, 24B, 24D are tables showing examples of the relationship among frequencies at which the code tables included in the correspondence tables in FIGS. 23A, 24A, and 24C are selected, the separation parameters s, and the indices h.

In the modification shown in FIG. 23A, code tables T[h, s] are not set for all combination of the index h and the separation parameter s within the set ranges, respectively; and the code tables [h, s] are not set for some of the combinations. The cross in the figure indicates that the code table T[h, s] is not set for the corresponding combination of the separation parameter s and the index h (the same applies to the other figures). The example shown in FIG. 23A does not have columns of parameters s of 1 and 3; those separation parameters are not generated in the example. As in this example, all of the separation parameters s of integer values (such as 0, 1, 2, 3, 4, ..., 7) may not be allowed within the set range; and only some of integer values (such as 0, 2, 4, 6) in the set range may be allowed. In that case, the number of types of side information [h, s] to be subjected to variable length coding in the variable length coding unit 123 (FIG. 7, for example) can be reduced, and accordingly, the amount of the complementary code $C_c$ corresponding to the side information [h, s] can be reduced.

In the example shown in FIG. 24A, different code tables are not set for all different separation parameters s; instead, common code tables are set for all the separation parameters s. In the example shown in FIG. 24A, one of the five code tables T[0, A] to T[4, A] is selected irrespective of the value of the separation parameter s. In the example shown in FIG. 24C, a single code table T[0, s] is set for each of separation parameters s of 0, 1, 2, 3, and 4, and a single code table T[0, E] is set for the other separation parameters s.

[Modification 3 of First Embodiment]

Modification 3 of the first embodiment will now be described. In this modification, for at least some of the separation parameters s, different code tables (code tables for encoding quotients q(n)) are decided depending on the amplitude of continuous-quantity parameter s' corresponding to the at least some of the separator parameters. In this modification, different code tables (code tables for encoding quotients q(n)) dependent on the amplitude of the continuous-quantity parameter s' corresponding to the separation parameter s may be decided for the same combination of the separation parameter s and the index h. This makes it possible to decide a more suitable code table, allowing the amount of the codes for the quotients q(n) obtained by variable length coding to be reduced further. Differences from the first embodiment will be mainly described below, and a description of commonalities with the first embodiment will be omitted.

<Configuration>

Figure 25:
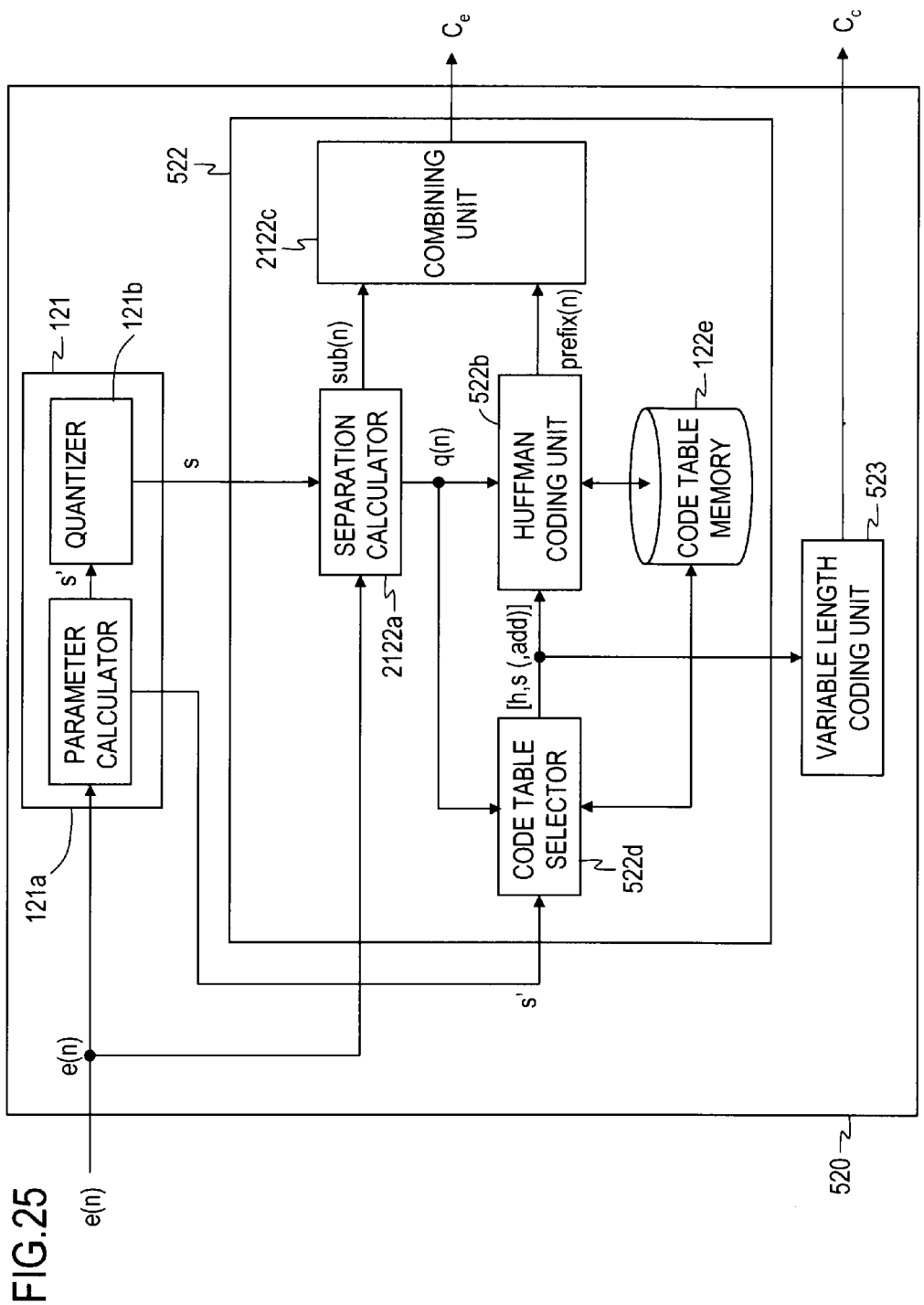
FIG. 25 is a block diagram illustrating the functional configuration of a residual encoding unit in Modification 3 of the first embodiment.
Figure 26:
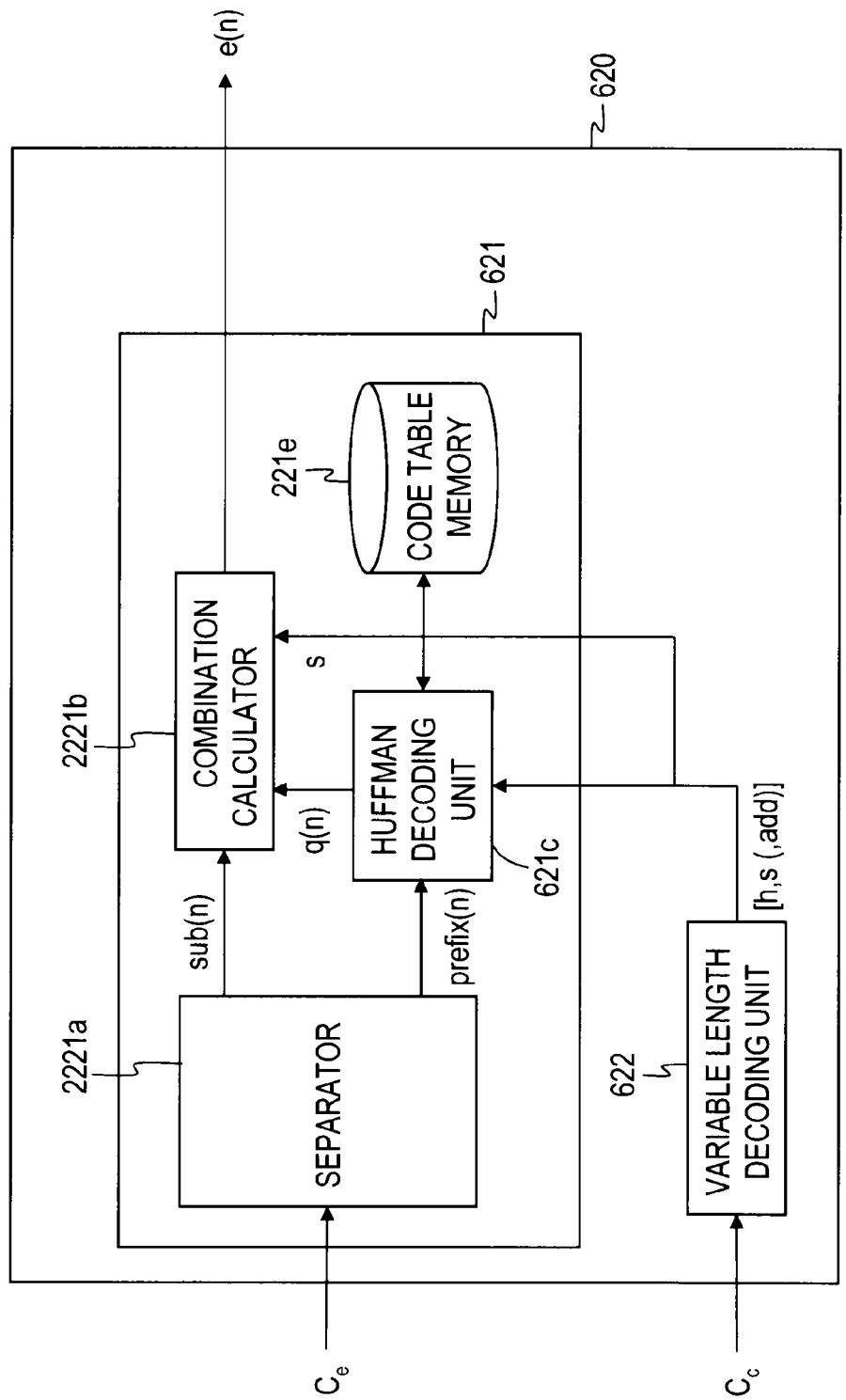
FIG. 26 is a block diagram illustrating the functional configuration of a residual decoding unit in Modification 3 of the first embodiment.

FIG. 25 is a block diagram illustrating the functional configuration of a residual encoding unit 520 in Modification 3 of the first embodiment. FIG. 26 is a block diagram illustrating the functional configuration of a residual decoding unit 620 in Modification 3 of the first embodiment. In those figures, components identical to those in the first embodiment are denoted by the same reference numerals as used in the first embodiment, and a description of those components will be omitted.

The configuration in Modification 3 of the first embodiment differs from that in the first embodiment in that the residual encoding unit 120 is replaced with the residual encoding unit 520, and the residual decoding unit 220 is replaced with the residual decoding unit 620.

The residual encoding unit 520 differs from the residual encoding unit 120 in that an encoding unit 522 and a variable length coding unit 523 are included instead of the encoding unit 122 and the variable length coding unit 123. The encoding unit 522 differs from the encoding unit 122 in that a code table selector 522d and a Huffman coding unit 522d are included instead of the code table selector 122d and the Huffman coding unit 122b.

The residual decoding unit 620 differs from the residual decoding unit 220 in that a decoding unit 621 and a variable length decoding unit 622 are included instead of the decoding unit 221 and the variable length decoding unit 222. The decoding unit 621 differs from the decoding unit 221 in that a Huffman decoding unit 621c is included instead of the Huffman decoding unit 221c.

<Pre-Processing>

FIG. 27A is a correspondence table showing an example of the correspondence relationship among code tables stored in the code table memory 122e of the residual encoding unit 520 and the code table memory 221e of the residual decoding unit 620, separation parameters, and indices.

FIG. 27B is a table showing an example of the relationship among frequencies at which the code tables listed in FIG. 27A are selected, the separation parameters s (upper and lower), and the indices h. FIGS. 28A and 28B are views showing examples of code tables listed in the correspondence table shown in FIG. 27A. In the code tables, an input value to be encoded, a corresponding code, and the bit length of the code are associated with each other. FIG. 29 shows an example of a code table corresponding to variable length coding performed by the variable length coding unit 523 in the residual encoding unit 520 and decoding performed by the variable length decoding unit 622 in the residual decoding unit 620.

Also in Modification 3 of the first embodiment, a code table (code table for performing variable length coding of quotients q(n)) is set for a combination of the separation parameter s and the index h. In this modification, for at least some of the separation parameters s, different code tables are set, depending on whether the continuous-quantity parameter s' corresponding to the separation parameter s is upper or lower. The upper continuous-quantity parameter s' corresponding to the separation parameter s means that, if the set range of the continuous-quantity parameter to be quantized to the separation parameter s is divided into two sections, the continuous-quantity parameter s' belongs to the upper section. The lower continuous-quantity parameter s' corresponding to the separation parameter s means that, if the set range of the continuous-quantity parameter to be quantized to the separation parameter s is divided into two sections, the continuous quantity-parameter s' belongs to the lower section. For example, if a continuous-quantity parameter s' within a range of s≦s'<s+1 is quantized to an integer separation parameter s, the lower continuous-quantity parameter s' is in the range not smaller than s and smaller than s+0.5, and the upper continuous-quantity parameter s' is in a range not smaller than s+0.5 and smaller than s+1.

In the example shown in FIG. 27A, when the separation parameter s is 2 and corresponds to a lower continuous-quantity parameter s', code tables T[0, 2, L], T[1, 2, L], T[2, 2, L], T[3, 2, L], and T[4, 2, L] corresponding to indices h of 0, 1, . . . , 4 are set. When the separation parameter s is 2 and corresponds to an upper continuous-quantity parameter s', code tables T[0, 2, U], T[1, 2, U], T[2, 2, U], T[3, 2, U], and T[4, 2, U] corresponding to indices h of 0, 1, . . . , 4 are set. At least some of the combinations in the code tables T[h, 2, L] and T[h, 2, U] have different code tables (example shown in FIG. 28). When the separation parameter s is 1, code tables T[0, 1], T[1, 1], T[2, 1], T[3, 1] corresponding to indices h of 0, 1, 2, 3 are set, irrespective of whether the continuous-quantity parameter s' is upper or lower.

Each code table T[h, s, add] (add="L" or "U") set as described above corresponds to a combination of the corresponding index h, the corresponding separation parameter s, and the corresponding additional information add indicating whether the continuous-quantity parameter s' is upper or lower. The code table T[h, s] corresponds to a combination of the corresponding index h and the corresponding separation parameter s. The code tables T[h, s, add] and T[h, s] are stored in the code table memory 122e of the residual encoding unit 520 and the code table memory 221e of the residual decoding unit 620. The code table T[h, s, add] identified by a combination of the separation parameter s, the index h, and the additional information add in the code table memory 122e is the same as the code table T[h, s, add] identified by a combination of the separation parameter s, the index h, and the additional information add in the code table memory 221e. The code table T[h, s] identified by a combination of the separation parameter s and the index h in the code table memory 122e is the same as the code table T[h, s] identified by a combination of the separation parameter s and the index h in the code table memory 221e.

As in the first embodiment, the distribution of frequencies at which the code tables T[h, s, add] and T[h, s] are selected (see the example shown in FIG. 27B) is trained in advance, and a code table of optimum variable length coding scheme for the side information [h, s] containing the separation parameter s and the index h or the side information [h, s, add] containing the separation parameter s, the index h, and the additional information add indicating whether the parameter is upper or lower is decided in the variable length coding unit 123 and the variable length decoding unit 222 (see the example shown in FIG. 29). The optimum variable length coding scheme for the side information [h, s, add] has been described in Principle 2 and the first embodiment.

<Encoding Method>

Differences from the first embodiment are found just in the processing in the code table selector 522d (modification of step S40 in FIG. 13), the processing in the Huffman coding unit 522b (modification of step S50), and the processing in the variable length coding unit 523 (modification of step S70). These differences will be described next.

[Processing in Code Table Selector 522d (Modification of Step S40)]

After the processing of steps S10 to S30 of the first embodiment (FIG. 13) is executed, the quotients q(n) output from the separation calculator 2122a and the continuous-quantity parameter s' output from the separation parameter generator 121 are input to the code table selector 522d. By using those items, the code table selector 522d selects a variable length coding scheme for the quotients q(n) in each frame.

By using the continuous-quantity parameter s', the code table selector 522d first obtains the separation parameter s, that is, a quantized value of the continuous-quantity parameter s', and the additional information add indicating whether the continuous-quantity parameter s' is upper or lower. With reference to the code table memory 122e, the code table selector 522d then obtains the sum of the number of bits of the codes corresponding to the quotients q(n) (n=1, . . . , N) in a single frame, for each code table T[h, s] corresponding to the separation parameter s or for each code table T[h, s, add] corresponding to the separation parameter s and the additional information add, and selects the code table T[h, s] or T[h, s, add] that has the smallest sum. The code table selector 522d outputs the side information [h, s] containing the separation parameter s and the index h for identifying the variable length coding scheme selected for each frame or the side information [h, s, add] further containing the additional information add further.

The code table selector 522d need not use the continuous-quantity parameter s' to obtain the separation parameter s, that is, a quantized value of the continuous-quantity parameter s', and the additional information add indicating whether the continuous-quantity parameter s' is upper or lower; instead, the separation calculator 2122a may obtain the additional information add. In that case, the code table selector 522d uses the separation parameter s and the additional information add output from the separation calculator 2122a to select a variable length coding scheme for the quotients q(n).

[Processing in Huffman Coding Unit 522b (Modification of Step S50)]

The side information [h, s] or [h, s, add] for each frame output from the code table selector 522d and the quotients q(n) output from the separation calculator 2122a corresponding to the frame are input to the Huffman coding unit 522b. The Huffman coding unit 522b searches through the code table memory 122e by using the side information [h, s] or [h, s, add] and extracts a code table T[h, s] or T[h, s, add] corresponding to the side information [h, s] or [h, s, add]. By using the extracted code table T[h, s] or T[h, s, add], the Huffman coding unit 122b performs variable length coding of the quotients q(n) for the frame, generates information prefix(n) (corresponding to the first information), and outputs the information.

[Processing in Variable Length Coding Unit 523 (Modification of Step S70)]

The side information [h, s] or [h, s, add] for the frame output from the code table selector 522d is input to the variable length coding unit 523. By using the code table decided as described earlier (see the example shown in FIG. 29), the variable length coding unit 523 performs variable length coding of each piece of the side information [h, s] or [h, s, add], generates a complementary code $C_c$ corresponding to the side information [h, s] or [h, s, add], and outputs the code.

<Decoding Method>

Differences from the first embodiment are found just in the processing in the variable length decoding unit 622 (modification of step S120 in FIG. 15) and the processing in the Huffman decoding unit 621c (modification of step S140). These differences will be described next.

[Processing in Variable Length Decoding Unit 622 (Modification of Step S120)]

After the processing of step S110 described in the first embodiment is executed, the complementary code $C_c$ corresponding to the side information [h, s] or [h, s, add] is input to the variable length decoding unit 622. By using the code table decided as described earlier (see FIG. 29, for example), the variable length decoding unit 622 performs variable length decoding of the complementary code $C_c$ to generate side information [h, s] or [h, s, add] and outputs the information.

[Processing in Decoding Unit 621 (Modification of Step S140)]

The side information [h, s] or [h, s, add] output from the variable length decoding unit 622 and the information prefix (n) output from the separator 2221a are input to the Huffman decoding unit 621c. By using the side information [h, s] or [h, s, add], the Huffman decoding unit 621c searches through the code table memory 221e and extracts a code table T[h, s] or T[h, s, add] corresponding to the side information [h, s] or [h, s, add]. By using the extracted code table T[h, s] or T[h, s, add], the Huffman decoding unit 621c decodes the information prefix(n), generates quotients q(n), and outputs them.

In this modification, different code tables T[h, s, add] are set for at least some of the separation parameters s, depending on whether an upper or lower continuous-quantity parameter s' corresponds to the separation parameter s. Different code tables may also be set for finer subdivisions of the amplitude of the continuous-quantity parameter s' corresponding to the separation parameter s. For example, when a continuous-quantity parameter s' in the range of $s \leq s' < s+1$ is quantized to an integer separation parameter s, different code tables may be decided, depending on whether the continuous-quantity parameter s' is in the range of not smaller than s and smaller than s+0.25, in the range of not smaller than s+0.25 and smaller than s+0.5, in the range of not smaller than s+0.5 and smaller than s+0.75, or in the range of not smaller than s+0.75 and smaller than s+1.

Second Embodiment

A second embodiment of the present invention will now be described. Prediction residuals e(n) in this embodiment are obtained from the result of prediction analysis of the time-series signals in each frame, which is a predetermined time segment. In this embodiment, a variable length coding scheme for performing variable length coding of quotients q(n), which is a time segment obtained by subdividing the frame, is selected in each subframe. Variable length coding of the quotients q(n) is performed to generate first information by using the variable length coding scheme decided for the subframe to which the prediction residuals e(n) corresponding to the quotients q(n) belong. Then, side information [H, s] containing the combination of a separation parameter s and a connected index H formed by connecting respective indices $h_i$ (i=1, 2) for identifying respective variable length coding schemes selected for respective subframes in the same frame is subjected to variable length coding. In this embodiment, the subframe is a time segment formed by dividing a single frame into two parts (i=1, 2). This, however, does not limit the present invention, and a subframe may be a time segment formed by dividing a single frame into three or more parts (i=1, 2, ..., I (I is an integer not smaller than 3)). Differences from the first embodiment will next be described, and a description of commonalities with the first embodiment will be omitted.

<Configuration>

The configuration of the second embodiment differs from the configuration of the first embodiment in that the residual encoding unit 120 of the encoder 100 is replaced with a residual encoding unit 720, and that the residual decoding unit 220 of the decoder 200 is replaced with a residual decoding unit 820.

Figure 30:
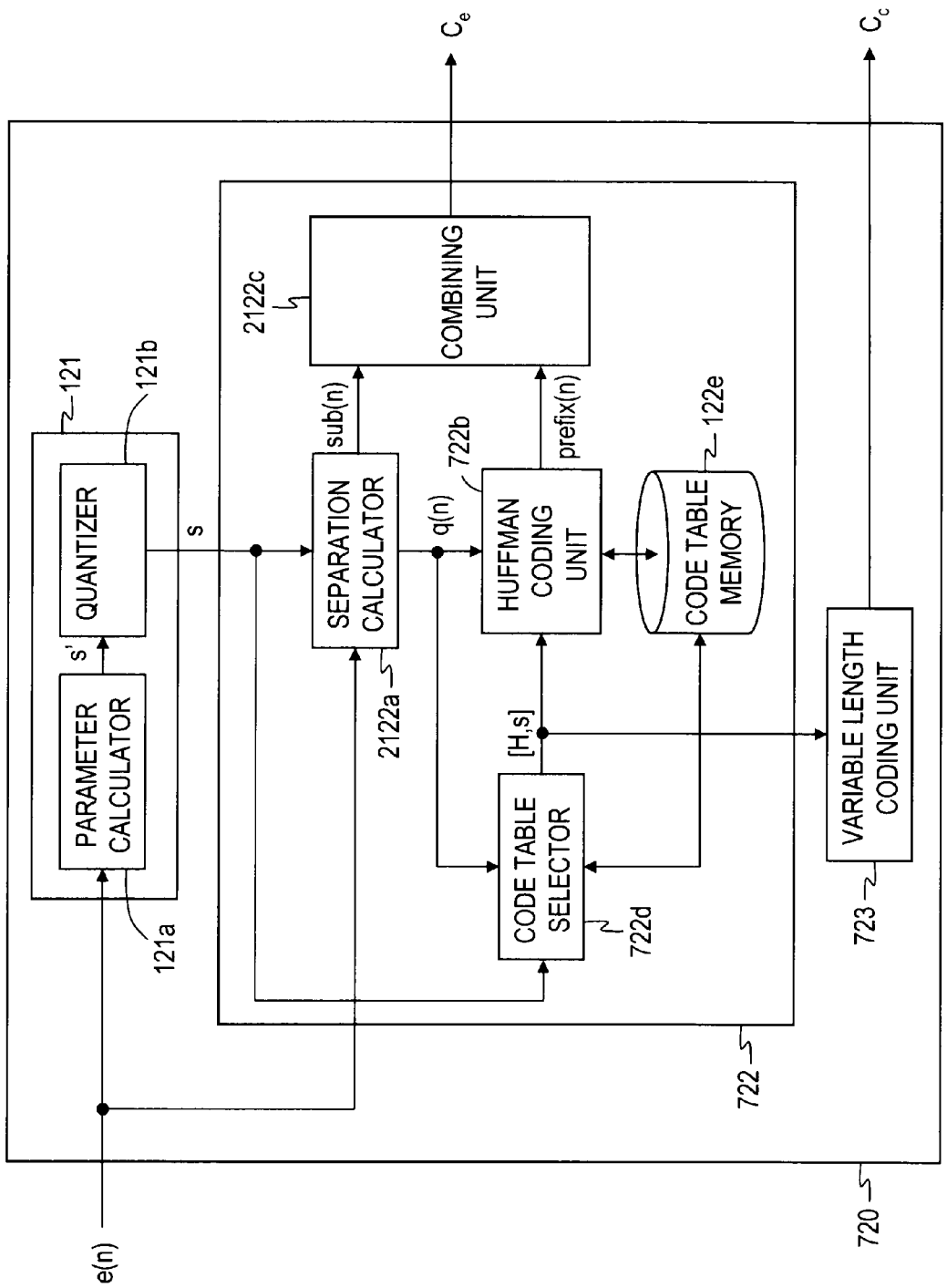
FIG. 30 is a block diagram illustrating the functional configuration of a residual encoding unit in a second embodiment.
Figure 31:
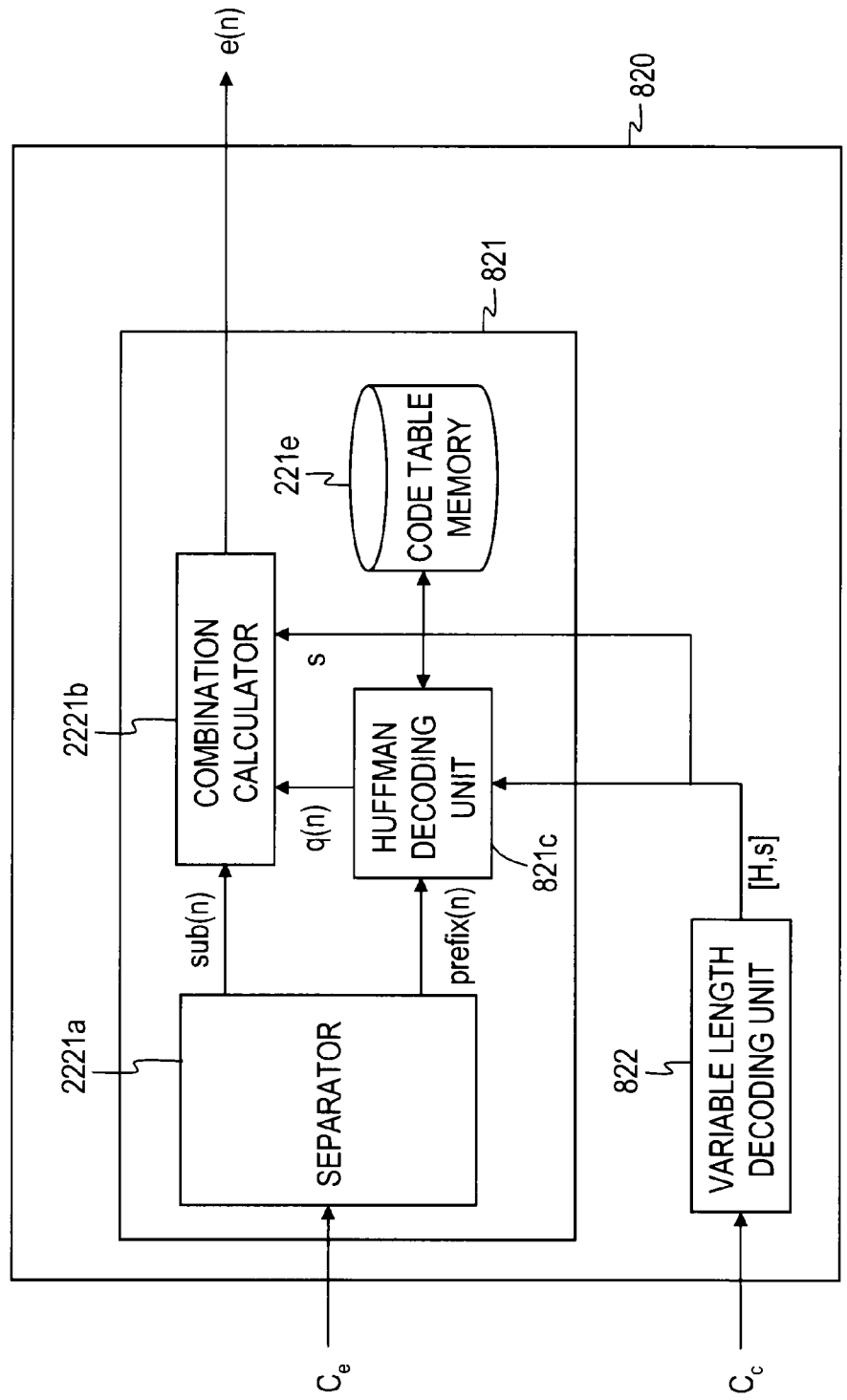
FIG. 31 is a block diagram illustrating the functional configuration of a residual decoding unit in the second embodiment.

FIG. 30 shows a block diagram illustrating the functional configuration of the residual encoding unit 720 in the second embodiment, and FIG. 31 shows a block diagram illustrating the functional configuration of the residual decoding unit 820 in the second embodiment. In the figures, components identical to those in the first embodiment are denoted by the same reference numerals as used in the first embodiment, and a description of those components will be omitted.

As shown in FIG. 30, the residual encoding unit 720 includes a separation parameter generator 121, an encoding unit 722, and a variable length coding unit 723. The encoding unit 722 includes a separation calculator 2122a, a combining unit 2122c, a Huffman coding unit 722b, a code table selector 722d, and a code table memory 122e.

As shown in FIG. 31, the residual decoding unit 820 includes a decoding unit 821 and a variable length decoding unit 822. The decoding unit 821 includes a separator 2221a, a combination calculator 2221b, a Huffman decoding unit 821c, and a code table memory 221e.

<Pre-Processing>

As described earlier, in this embodiment, side information [H, s] containing a combination of a separation parameter s and a connected index $H = h_1 | h_2$ formed by connecting respective indices $h_i$ (i=1, 2) for identifying respective variable length coding schemes selected for respective subframes in the same frame is subjected to variable length coding.

Under the rule of minimizing the total amount of codes in subframes, the frequency distribution of the variable length coding scheme selected for variable length coding of the quotients q(n) becomes uneven, making the frequency distribution of the index h, for identifying the variable length coding scheme uneven. This also makes the frequency distribution of the connected index $H = h_1 | h_2$ formed by connecting the respective indices $h_i$ for respective subframes in the same frame uneven. The frequency distribution of the separation parameter s selected under the rule of minimizing the total amount of codes in the frame also becomes uneven.

FIG. 32 is a view showing an example of the relationship among the frequency of the code table used for performing variable length coding of the quotients q(n), selected for each subframe by the code table selector 722d in the residual encoding unit 720, the separation parameter s, and the index $h_i$. In FIG. 32, the index for the first subframe in each frame is denoted by $h_1$, and the index for the second subframe is denoted by $h_2$. For example, H=01 means that the index $h_1$ for identifying the variable length coding scheme selected in the first subframe is "0", and the index $h_2$ for identifying the variable length coding scheme selected in the second subframe is "1". In FIG. 32, the frequency at which the code table $T[h_1, s]$ is selected in the first subframe and also the code table $T[h_2, s]$ is selected in the second subframe is indicated in a box determined by the connected index $H = h_1 | h_2$ and the separation parameter s. Each frequency is symbolized in the same way as in the first embodiment.

This embodiment assumes the following, for example: the dividends are integers not smaller than 0 and smaller than $2^8$ (integers expressed by eight bits); the separation parameter s can range from 0 to 7 both inclusive; and the separation parameter s that can be decided is limited to 0, 2, or 4. It is also assumed that the frequency at which the separation parameter s at a first distance (the first distance is "0" in the example shown in FIG. 32) from 2 is selected is higher than the frequency at which the separation parameter s at a second distance from 2 is selected, the second distance being greater than the first distance. It is assumed that the value of the index $h_1$ or $h_2$ in this embodiment decreases as the corresponding code table $T[h_1, s]$ or $T[h_2, s]$ gets closer to the code table for performing variable length coding identical to Alpha coding, and the value increases as the corresponding code table gets farther from the code table for performing variable length coding identical to Alpha coding.

That type of frequency distribution is trained in advance, and a code table of an optimum variable length coding scheme for encoding each side information [H, s] is set in the variable length coding unit 723 and the variable length decoding unit 822, in accordance with the frequency distribution of the side information [H, s] containing the combination of the separation parameter s and the connected index H.

The optimum variable length coding scheme for encoding the side information [H, s] assigns a shorter code to the side information [H, s] of higher frequency and assigns a longer code to the side information [H, s] of lower frequency. In the situation described earlier, that type of coding scheme should be a variable length coding scheme having the two characteristics described below.

The code length of a first code being shorter than the code length of a second code is more frequent than the code length of the first code being longer than the code length of the second code. The first code in this example is assigned to side information [H, s] that includes a separation parameter s at a first distance from 2 (corresponding to the predetermined specific value). The second code in this example is assigned to side information [H, s] that includes a separation parameter s at a second distance from 2 (corresponding to the predetermined specific value). The second distance is greater than the first distance.

When the separation parameter s is 2 or greater (corresponding to when the modulus is not smaller than a predetermined threshold), the code length of a third code being shorter than the code length of a fourth code is more frequent than the code length of the third code being longer than the code length of the fourth code. The fourth code is assigned to side information [H, s] that includes the index $h_1$ or $h_2$ for identifying a first coding scheme for performing first variable length coding that differs from Alpha coding. The third code is assigned to side information [H, s] that includes the index $h_1$ or $h_2$ for identifying a second coding scheme for performing second variable length coding that is closer to Alpha coding than the first variable length coding.

<Encoding Method>

The encoding method in the second embodiment will be described next.

Figure 33:
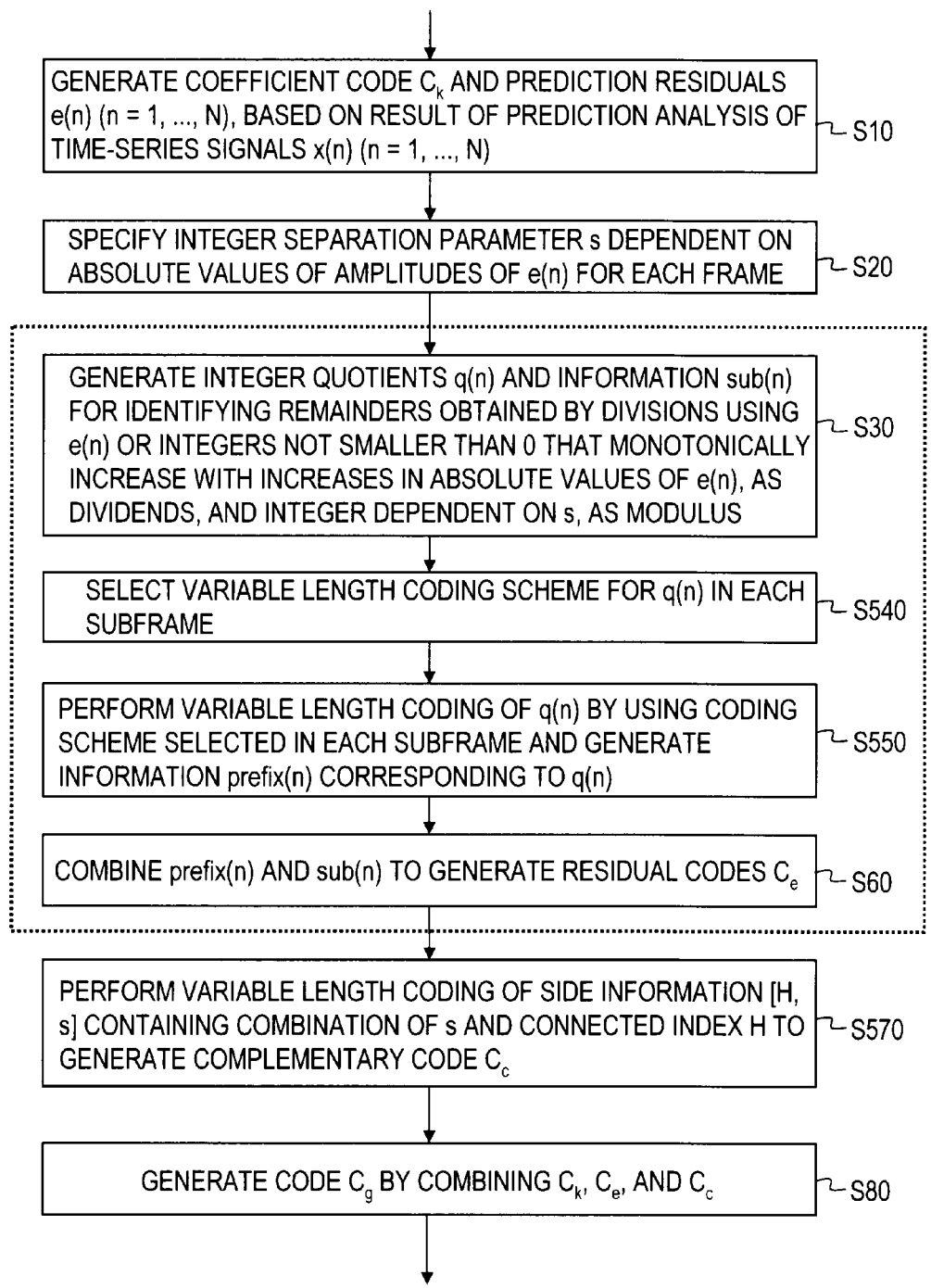
FIG. 33 is a flowchart illustrating an encoding method according to the second embodiment.

FIG. 33 is a flowchart illustrating the encoding method in the second embodiment. The encoding method in the embodiment will be described next with reference to the figure.

After the processing of steps S10 to S30 described in the first embodiment is executed, the quotients q(n) output from the separation calculator 2122*a* and the separation parameter s output from the separation parameter generator 121 are input to the code table selector 722*d*. By using those items, the code table selector 722*d* selects a variable length coding scheme for performing variable length coding of the quotients q(n) in each subframe (step S540). For example, the code table selector 722*d* obtains the sum of the numbers of bits of the codes corresponding to the quotients q(n) (n=SFS(i), . . . , SFE(i)) (i=1, 2, SFS(1)=1, SFE(1)∈{2, . . . , N−2}, SFS(2)=SFE(1)+1, SFS(2)=N) in the subframe, for each code table T[h, s] corresponding to the input separation parameter s, with reference to the code table memory 122*e*, and selects the code table T[h, s] with the smallest sum of the numbers of bits for the subframe. The code table selector 722*d* outputs the side information [H, s] containing the connected index H formed by connecting the indices $h_1$ and $h_2$ for identifying the variable length coding schemes selected for subframes in the same frame and the input separation parameter s. In this embodiment, the index $h_1$ specifies the coding scheme for performing variable length coding of each quotient q(SFS(1)), . . . , q(SFE(1)) corresponding to the first subframe. The index $h_2$ specifies the coding scheme for performing variable length coding of each quotient q(SFS(2)), . . . , q(SFE(2)) in the second subframe. The side information [H, s] may contain just the connected index H and the separation parameter s or may include additional information such as a header as well.

The side information [H, s] of the frame output from the code table selector 722*d* and the quotients q(n) (n=1, . . . , N) output from the separation calculator 2122*a*, corresponding to the frame, are input to the Huffman coding unit 722*b*. By using the side information [H, s], the Huffman coding unit 722*b* searches through the code table memory 122*e* and extracts the code tables $T[h_1, s]$ and $T[h_2, s]$ corresponding to the side information [H, s]. The Huffman coding unit 722*b* performs variable length coding of each quotient q(n) corresponding to the first subframe in the corresponding frame, by using the extracted code table $T[h_1, s]$. The Huffman coding unit 722*b* also performs variable length coding of each quotient q(n) corresponding to the second subframe in the corresponding frame, by using the extracted code table $T[h_2, s]$. Consequently, the Huffman coding unit 722*b* generates information prefix(n) (corresponding to the first information) corresponding to the frame (step S550).

The processing of step S60 described in the first embodiment is executed, and then the side information [H, s] output from the code table selector 722*d* is input to the variable length coding unit 723. By using the code table decided as described above, the variable length coding unit 723 performs variable length coding of each piece of side information [H, s] containing the combination of the generated separation parameter s and the connected index H formed by connecting the respective indices $h_i$ (i=1, 2) for identifying the respective coding schemes selected for respective subframes in the frame, and generates a complementary code $C_c$ corresponding to the side information [H, s] (step S570).

Then, step S80 described in the first embodiment is executed.

<Decoding Method>

The decoding method in the second embodiment will be described next.

Figure 34:
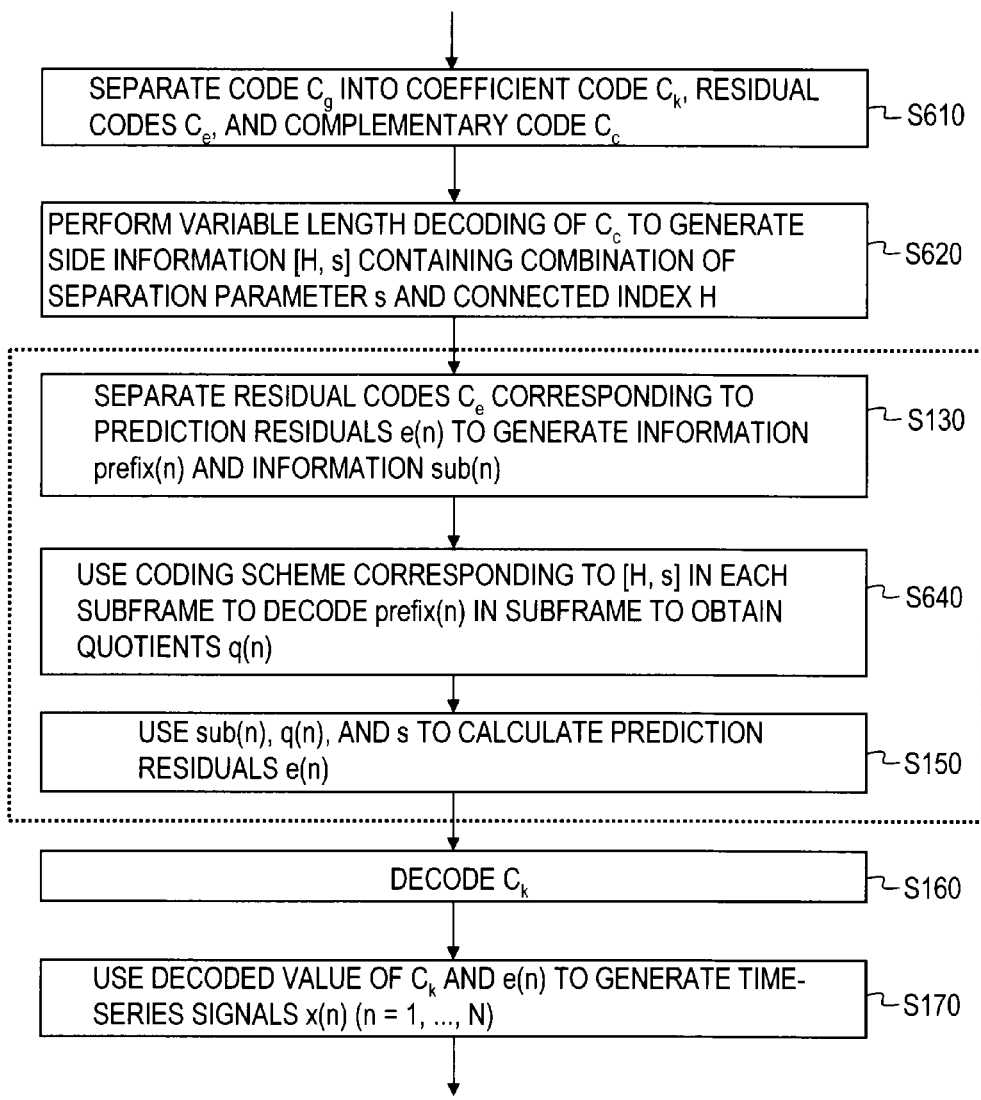
FIG. 34 is a flowchart illustrating a decoding method according to the second embodiment.

FIG. 34 is a flowchart illustrating the decoding method in the second embodiment. The decoding method in this embodiment will be described next with reference to the figure.

The separator 1210 of the decoder 200 (FIG. 8) separates the code $C_g$ input to the decoder 200 into the coefficient code $C_k$ corresponding to the coefficients, the residual codes $C_e$ corresponding to the prediction residuals e(n), and the complementary code $C_c$ corresponding to the side information [H, s] (step S610). The complementary code $C_c$ corresponding to the side information [H, s] is input to the variable length decoding unit 222, and the variable length decoding unit 822 performs variable length decoding of the complementary code $C_c$ by using the code table specified as described earlier and generates the side information [H, s] containing the combination of the separation parameter s and the connected index H (step S620).

The processing of step S130 described in the first embodiment is executed, and then the side information [H, s] output from the variable length decoding unit 822 and the information prefix(n) (n=1, ..., N) output from the separator 2221a are input to the Huffman decoding unit 821c. The Huffman decoding unit 821c searches through the code table memory 221e by using the side information [H, s] and extracts the code tables $T[h_1, s]$ and $T[h_2, s]$ corresponding to the side information [H, s]. The Huffman decoding unit 821c decodes the information prefix(n) corresponding to the first subframe by using the extracted code table $T[h_1, s]$ and generates quotients q(n), and also decodes the information prefix(n) corresponding to the second subframe by using the extracted code table $T[h_2, s]$ and generates quotients q(n) (step S640).

The processing of steps S150 to S170 described in the first embodiment is executed next.

Third Embodiment

A third embodiment of the present invention will now be described. In this embodiment, prediction residuals e(n) are obtained from the result of prediction analysis of the time-series signals in each frame, which is a predetermined time segment, and a separation parameter $s_i$ (i=1, 2) is decided in each subframe, which is a time segment formed by subdividing the frame. The codes corresponding to the prediction residuals in this embodiment include first information that specifies integer quotients obtained by divisions using the prediction residuals or integers not smaller than 0 that monotonically increase with increases in the amplitude of the prediction residuals, as dividends, and an integer dependent on the separation parameter s, decided for the subframe corresponding to the prediction residuals, as a modulus, and second information identifying the remainders obtained when the dividends are divided by the modulus. In this embodiment, each piece of side information that includes a connected parameter S formed by connecting the respective separation parameters s, decided for the respective subframes in the same frame is subjected to variable length coding. In an example in this embodiment, the subframe is a time segment formed by dividing a single frame into two parts (i=1, 2). This, however, does not limit the present invention, and the subframe may be a time segment formed by dividing a single frame into three or more parts (i=1, 2, ..., I (I is an integer not smaller than 3)). Differences from the first embodiment will be described next, and a description of commonalities with the first embodiment will be omitted.

<Configuration>

The configuration of the third embodiment differs from the configuration of the first embodiment in that the residual encoding unit 120 of the encoder 100 is replaced with a residual encoding unit 920, and that the residual decoding unit 220 of the decoder 200 is replaced with a residual decoding unit 1020.

Figure 35:
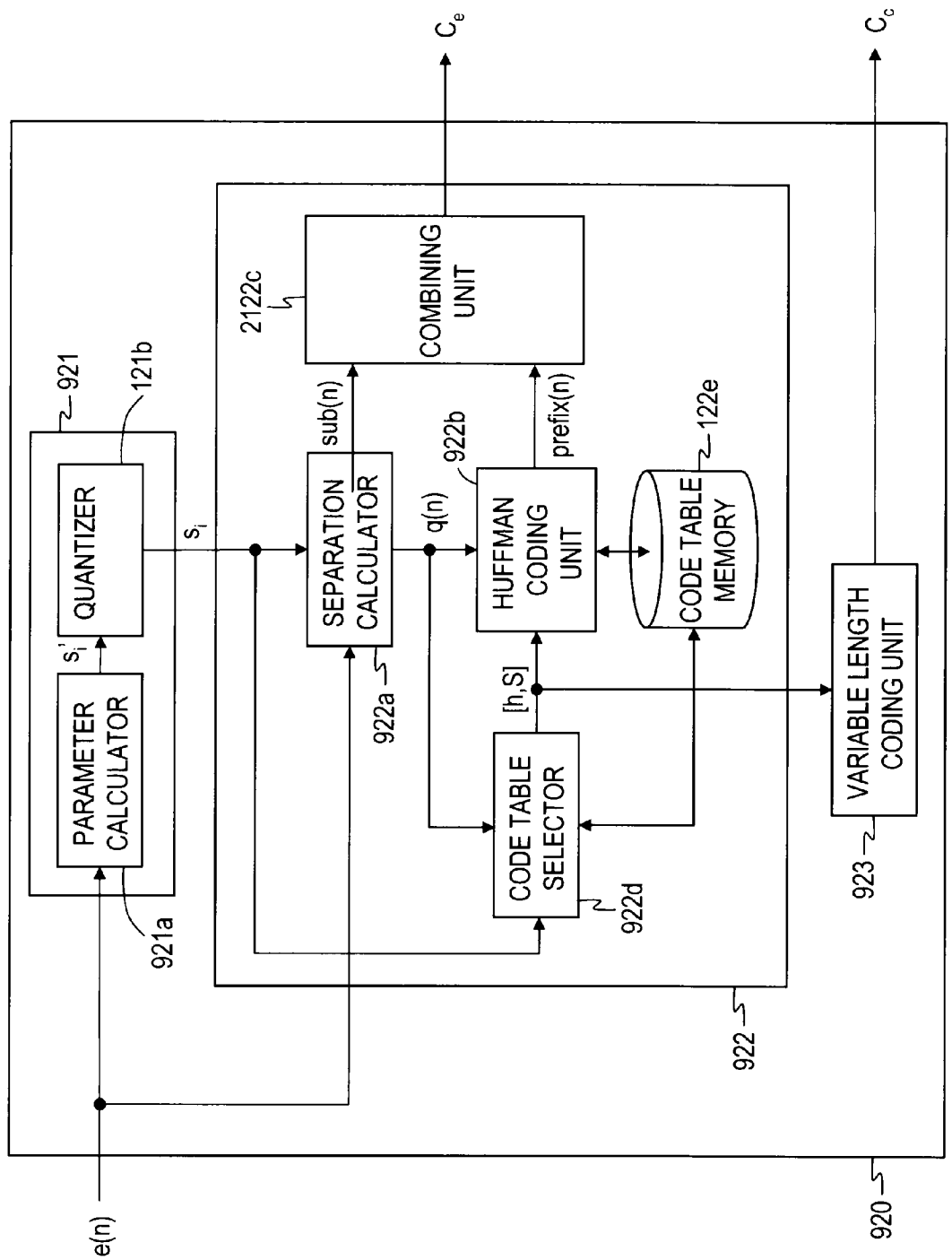
FIG. 35 is a block diagram illustrating the functional configuration of a residual encoding unit in a third embodiment.
Figure 36:
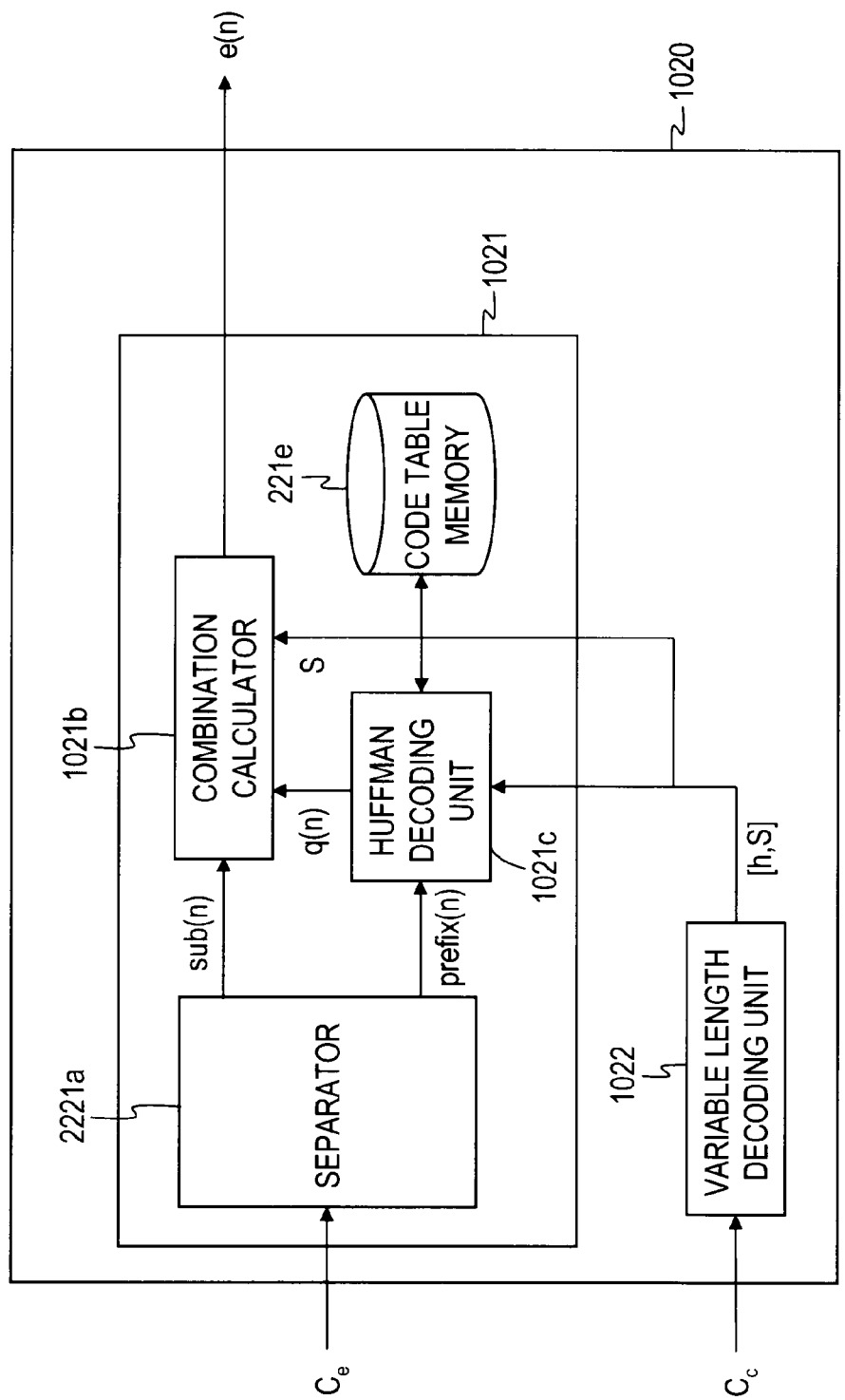
FIG. 36 is a block diagram illustrating the functional configuration of a residual decoding unit in the third embodiment.

FIG. 35 shows a block diagram illustrating the functional configuration of the residual encoding unit 920 in the third embodiment, and FIG. 36 shows a block diagram illustrating the functional configuration of the residual decoding unit 1020 in the third embodiment. In the figures, components identical to those in the first embodiment will be denoted by the same reference numerals as used in the first embodiment, and a description of those components will be omitted.

As shown in FIG. 35, the residual encoding unit 920 includes a separation parameter generator 921, an encoding unit 922, and a variable length coding unit 923. The separation parameter generator 921 includes a parameter calculator 921a and a quantizer 121b. The encoding unit 922 includes a separation calculator 922a, a combining unit 2122c, a Huffman coding unit 922b, a code table selector 922d, and a code table memory 122e.

As shown in FIG. 36, the residual decoding unit 1020 includes a decoding unit 1021 and a variable length decoding unit 1022. The decoding unit 1021 includes a separator 2221a, a combination calculator 1021b, a Huffman decoding unit 1021c, and a code table memory 221e.

[Pre-Processing]

As described earlier, in this embodiment, the side information [h, S] containing the combination of the connected parameter $S=s_1|s_2$ formed by connecting the respective separation parameters $s_i$ (i=1, 2) decided for the respective subframes in the same frame and the index h for identifying the coding scheme selected for the frame is subjected to variable length coding.

Under the rule of minimizing the total code amount in the frame, the frequency distribution of the coding scheme selected for variable length coding of the quotients q(n) becomes uneven, making the frequency distribution of the index h for identifying the coding scheme uneven. The frequency distribution of the separation parameter s, selected under the rule of minimizing the total amount of codes in the subframe also becomes uneven. This also makes the frequency distribution of the connected parameter $S=s_1|s_2$ formed by connecting the respective separation parameters s, of the respective subframes in the same frame uneven.

Figure 37:
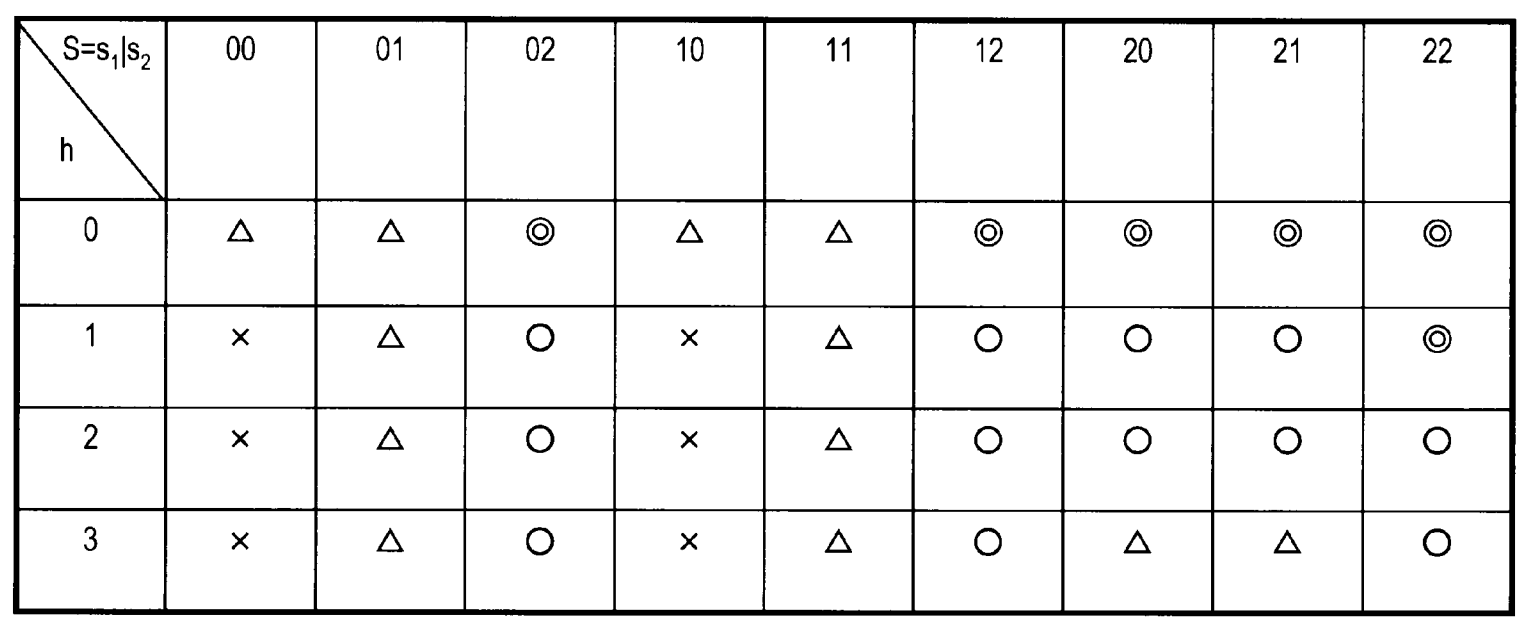

FIG. 37 is a view showing an example of the relationship among the frequency of the code table used for performing variable length coding of the quotients q(n), selected for each subframe by the code table selector 922d in the residual encoding unit 920, the separation parameter $s_i$, and the index h. In FIG. 37, the separation parameter for the first subframe in the frame is denoted by $s_1$, and the separation parameter for the second subframe is denoted by $s_2$. For example, S=01 means that the separation parameter $s_1$ corresponding to the first subframe is "0", and the separation parameter $s_2$ corresponding to the second subframe is "1". In FIG. 37, the frequency at which the code table $T[h, s_1]$ (or $T[h, s_2]$) is selected in the frame is indicated in a box determined by the index h and the connected parameter S=Each frequency is symbolized in the same way as in the first embodiment.

This embodiment assumes the following, for example: the dividends are integers not smaller than 0 and smaller than $2^8$ (integers expressed by eight bits); the separation parameter $s_i$ can range from 0 to 7 both inclusive; and the separation parameter $s_i$ that can be decided is limited to 0, 1, or 2. It is also assumed that the frequency at which the separation parameter $s_i$ at a first distance from 2 is selected is higher than the frequency at which the separation parameter at a second distance from 2 is selected, the second distance being greater than the first distance. It is assumed that the value of the index h in this embodiment decreases as the corresponding code table $T[h, s_1]$ (or $T[h, s_2]$) gets closer to the code table for performing variable length coding identical to Alpha coding, and the value increases as the corresponding code table gets farther from the code table for performing variable length coding identical to Alpha coding.

That type of frequency distribution is trained in advance, and a code table of an optimum variable length coding scheme for encoding the side information [h, S] is set in the variable length coding unit 923 and the variable length decoding unit 1022, in accordance with the frequency distribution of the side information [h, S] containing the combination of the connected parameter S and the index h.

The optimum variable length coding scheme for encoding the side information [h, S] assigns a shorter code to the side information [h, S] of higher frequency and assigns a longer code to side information [h, S] of lower frequency. In the situation as described earlier, that type of coding scheme should be a variable length coding scheme having the two characteristics described below.

The code length of a first code being shorter than the code length of a second code is more frequent than the code length of the first code being longer than the code length of the second code. The first code in this example is assigned to side information [h, S] that includes a separation parameter $s_1$ or $s_2$ at a first distance from 2 (corresponding to a predetermined specific value). The second code in this example is assigned to side information [h, S] that includes a separation parameter $s_1$ or $s_2$ at a second distance from 2 (corresponding to the predetermined specific value). The second distance is greater than the first distance.

When the separation parameter s is 2 or greater (corresponding to when the modulus is not smaller than a predetermined threshold), the code length of a third code being shorter than the code length of a fourth code is more frequent than the code length of the third code being longer than the code length of the fourth code. The fourth code is assigned to side information [h, S] that includes the index h for identifying a first coding scheme for performing first variable length coding that differs from Alpha coding. The third code is assigned to side information [h, S] that includes the index h for identifying a second coding scheme for performing second variable length coding that is closer to Alpha coding than the first variable length coding.

<Encoding Method>

The encoding method in the third embodiment will be described next.

Figure 38:
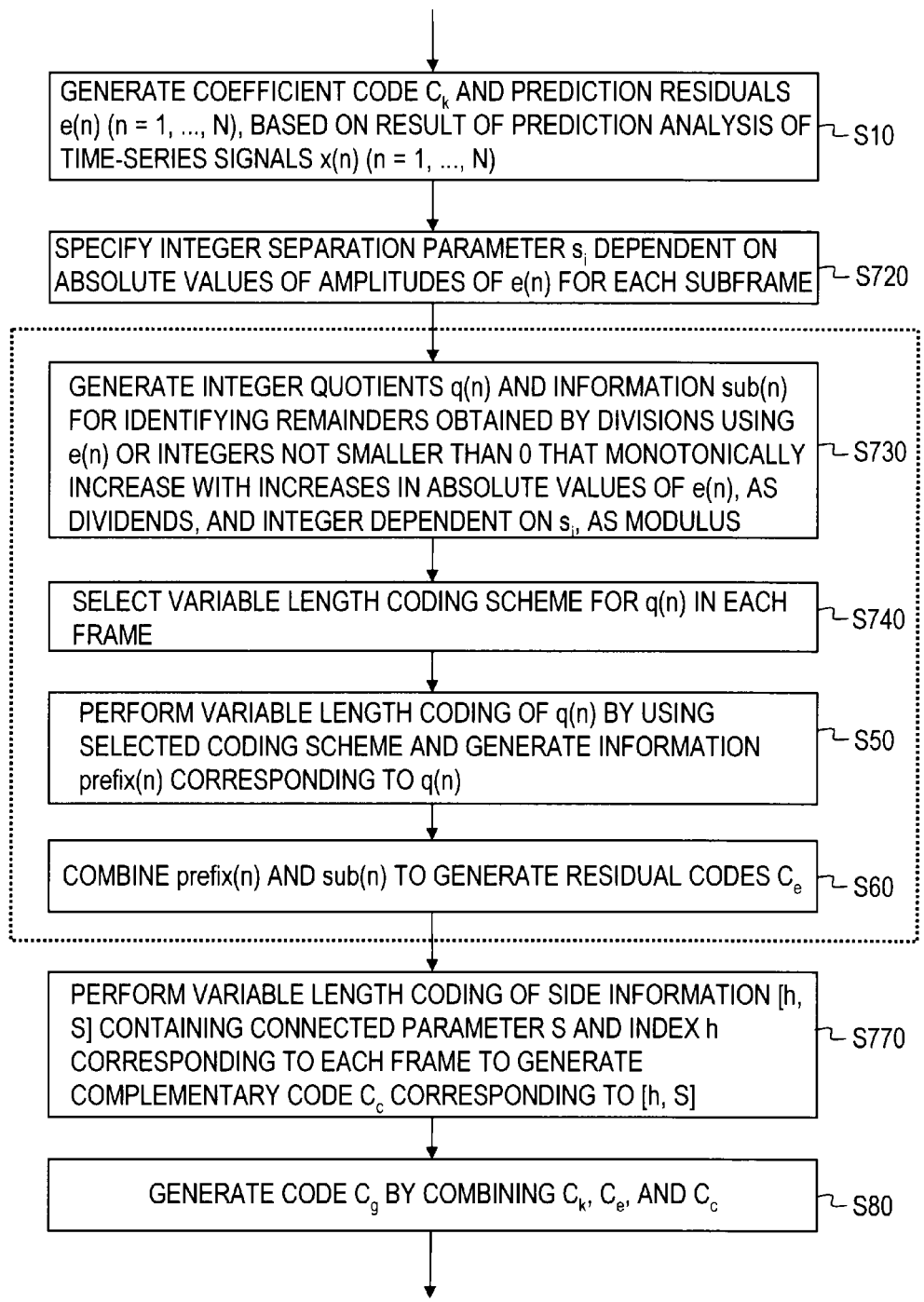
FIG. 38 is a flowchart illustrating an encoding method according to the third embodiment.

FIG. 38 is a flowchart illustrating the encoding method in the third embodiment. The encoding method in the embodiment will be described next with reference to the figure.

After the processing of step S10 described in the first embodiment is executed, the prediction residuals e(n) input to the residual encoding unit 920 (FIG. 35) are sent to the separation parameter generator 921. The separation parameter generator 921 specifies each integer separation parameter 5, (i=1, 2) dependent on the amplitude of the prediction residuals e(n) in each subframe and outputs it (step S720). This processing can be implemented by performing the processing in step 20 in each subframe, the processing described in the first embodiment being executed in each frame. More specifically, for example, the parameter calculator 921a calculates a continuous-quantity parameter $s_i'$ in each subframe in accordance with the equation obtained by replacing N in Equation (14) with the number of samples in the subframe, and the quantizer 121b quantizes the calculated continuous-quantity parameter $s_i'$ to an integer value, thereby generating a separation parameter $s_i$ in each subframe.

The prediction residuals e(n) input to the residual encoding unit 920 and the separation parameter $s_i$ in each subframe, output from the separation parameter generator 921, are input to the separation calculator 922a in the encoding unit 922. The separation parameter $s_i$ is decided for the subframe corresponding to the input prediction residuals e(n). By using those items, the separation calculator 922a generates integer quotients q(n) and information sub(n) (corresponding to the second information) for identifying the corresponding remainders obtained by divisions using the prediction residuals e(n) or integers not smaller than 0 that monotonically increase with increases in the amplitude of the prediction residuals e(n), as dividends, and an integer dependent on the separation parameter $s_i$, as the modulus (step S730). Details of step S730 are the same as the example details of step S30 described earlier, for example.

The quotients q(n) output from the separation calculator 922a and the separation parameter $s_1$ (or $s_2$) output from the separation parameter generator 921 are input to the code table selector 922d. By using them, the code table selector 922d selects a coding scheme for performing variable length coding of the quotients q(n) in each frame (step S740). In this embodiment, the separation parameter $s_i$ is decided in each subframe, and the coding scheme for performing variable length coding of the quotients q(n) is selected in each frame. For example, the code table selector 922d obtains the sum of the number of bits of the codes corresponding to the quotients q(n) in a single frame for each code table T[h, $s_1$] corresponding to the input separation parameter $s_1$, with reference to the code table memory 122e, and selects a code table T[h, $s_1$] with the smallest sum in each frame. Alternatively, for example, the code table selector 922d obtains the sum of the number of bits of the codes corresponding to the quotients q(n) in a single frame for each table T[h, $s_2$] corresponding to the input separation parameter $s_2$, with reference to the code table memory 122e, and selects a code table T[h, $s_2$] with the smallest sum in each frame. The code table selector 922d outputs the side information [h, S] containing the connected parameter S formed by connecting the respective separation parameters $s_i$ generated for the respective subframes included in the same frame and the index h for identifying the coding scheme selected for the frame.

The processing of steps S50 and S60 described in the first embodiment is executed, and then the side information [h, S] output from the code table selector 922d is input to the variable length coding unit 923. By using the code table decided as described earlier, the variable length coding unit 923 performs variable length coding of each piece of the side information [h, S], generates a complementary code $C_c$ corresponding to the side information [h, S], and outputs the code (step S770).

Then, the processing of step S80 described in the first embodiment is executed.

<Decoding Method>

Figure 39:
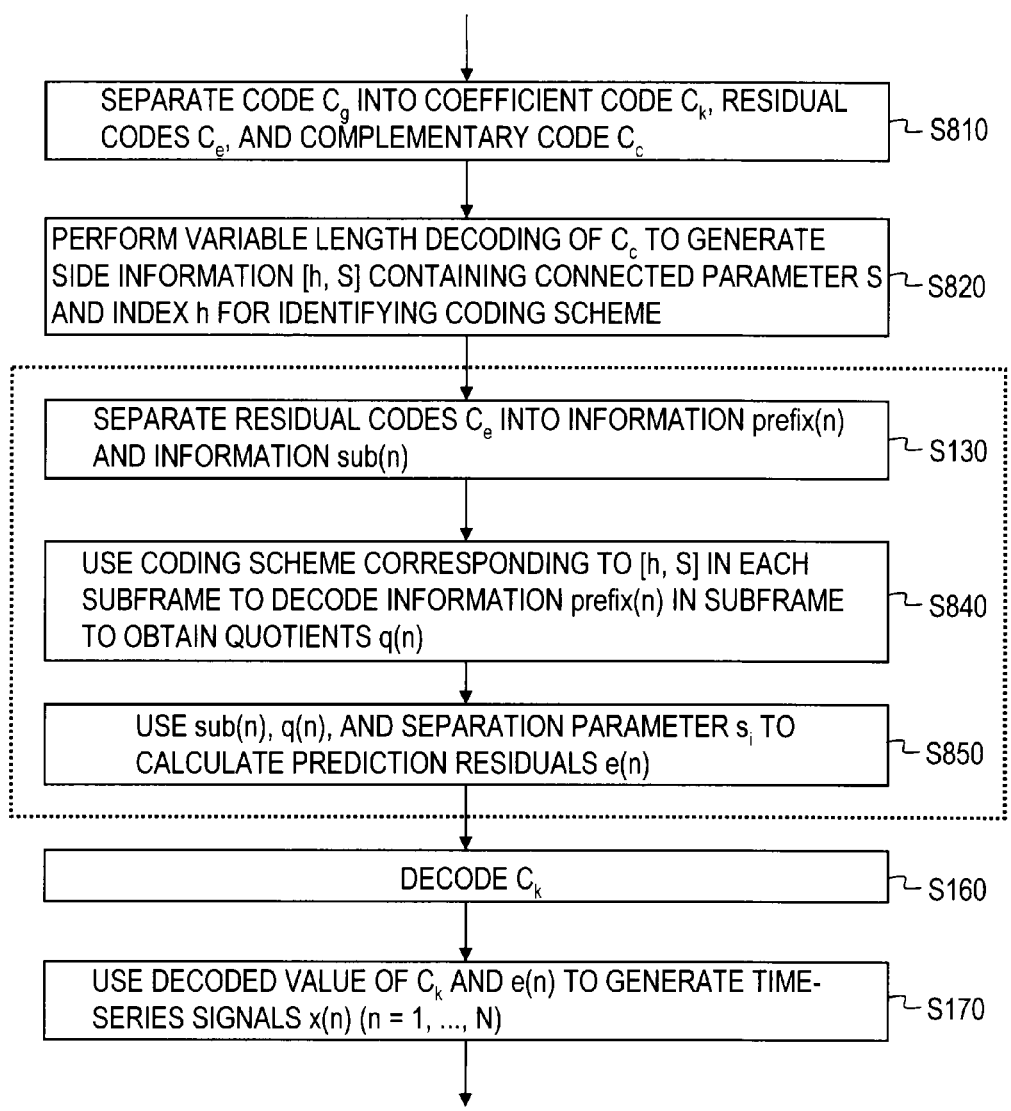
FIG. 39 is a flowchart illustrating a decoding method according to the third embodiment.

FIG. 39 is a flowchart illustrating the decoding method in the third embodiment. With reference to the figure, the decoding method in this embodiment will be described next.

The separator 1210 of the decoder 200 (FIG. 8) separates the code $C_g$ input to the decoder 200 into the coefficient code $C_k$ corresponding to the coefficients, the residual codes $C_e$ corresponding to the prediction residuals e(n), and the complementary code $C_c$ corresponding to the side information [h, S] (step S810).

The complementary code $C_c$ corresponding to the side information [h, S] is input to the variable length decoding unit 1022. Using the code table set as described earlier, the variable length decoding unit 1022 performs variable length decoding of the complementary code $C_c$, generates the side information [h, S] containing the connected parameter S and the index h for identifying the coding scheme, and outputs it (step S820).

After the processing of step S130 described in the first embodiment is executed, the side information [h, S] output from the variable length decoding unit 1022 and the information prefix(n) output from the separator 2221a are input to the Huffman decoding unit 1021c. Using the side information [h, S], the Huffman decoding unit 1021c searches through the code table memory 221e and extracts a code table T[h, $s_1$] (or T[h, $s_2$]) corresponding to the side information [h, S]. The Huffman decoding unit 1021c then decodes the information prefix(n) by using the extracted code table T[h, $s_1$] (or T[h, $s_2$]), and generates quotients q(n) (step S840).

The quotients q(n) output from the Huffman decoding unit 1021c, the information sub(n) output from the separator 2221a, and the separation parameters $s_i$ included in the side information [h, S] output from the variable length decoding unit 1022 are input to the combination calculator 1021b. Using those items, the combination calculator 1021b calculates prediction residuals e(n) and outputs them (step S850). To calculate the prediction residuals e(n), the quotients q(n) and the separation parameter $s_i$ corresponding to the subframe to which the information sub(n) belongs are used.

The processing of steps S160 and S170 described in the first embodiment is then executed.

Fourth Embodiment

A fourth embodiment of the present invention will be described next.

This embodiment is a combination of the second embodiment and the third embodiment. In this embodiment, prediction residuals e(n) are obtained from the result of prediction analysis of the time-series signals in each frame, which is a predetermined time segment; a separation parameter $s_i$ (i=1, 2) is decided in each subframe, which is a time segment subdivided from the frame; and a coding scheme for performing variable length coding of the quotients q(n) is selected in each subframe. Then, variable length coding of the quotients q(n) is performed by using the coding scheme decided for the subframe to which the prediction residuals e(n) corresponding to the quotients q(n) belong, and first information is generated. Side information [H, S] containing the combination of a connected parameter s=$s_1|s_2$ formed by connecting the respective separation parameters $s_i$ decided for respective subframes in the same frame and a connected index H=$h_1|h_2$ formed by connecting respective indices $h_i$ (i=1, 2) for identifying the respective coding schemes selected for the respective subframes in the same frame is subjected to variable length coding. In this embodiment, the subframe is a time segment formed by dividing a single frame into two parts (i=1, 2), for example. This, however, does not limit the present invention, and the subframe may be a time segment formed by dividing a single frame into three or more parts (i=1, 2, ..., I (I is an integer not smaller than 3)). Differences from the first to third embodiments will be described below, and a description of commonalities with the first to third embodiments will be omitted.

<Configuration>

The configuration of the fourth embodiment differs from the configuration of the first embodiment in that the residual encoding unit 120 of the encoder 100 is replaced with a residual encoding unit 1120, and that the residual decoding unit 220 of the decoder 200 is replaced with a residual decoding unit 1220.

Figure 40:
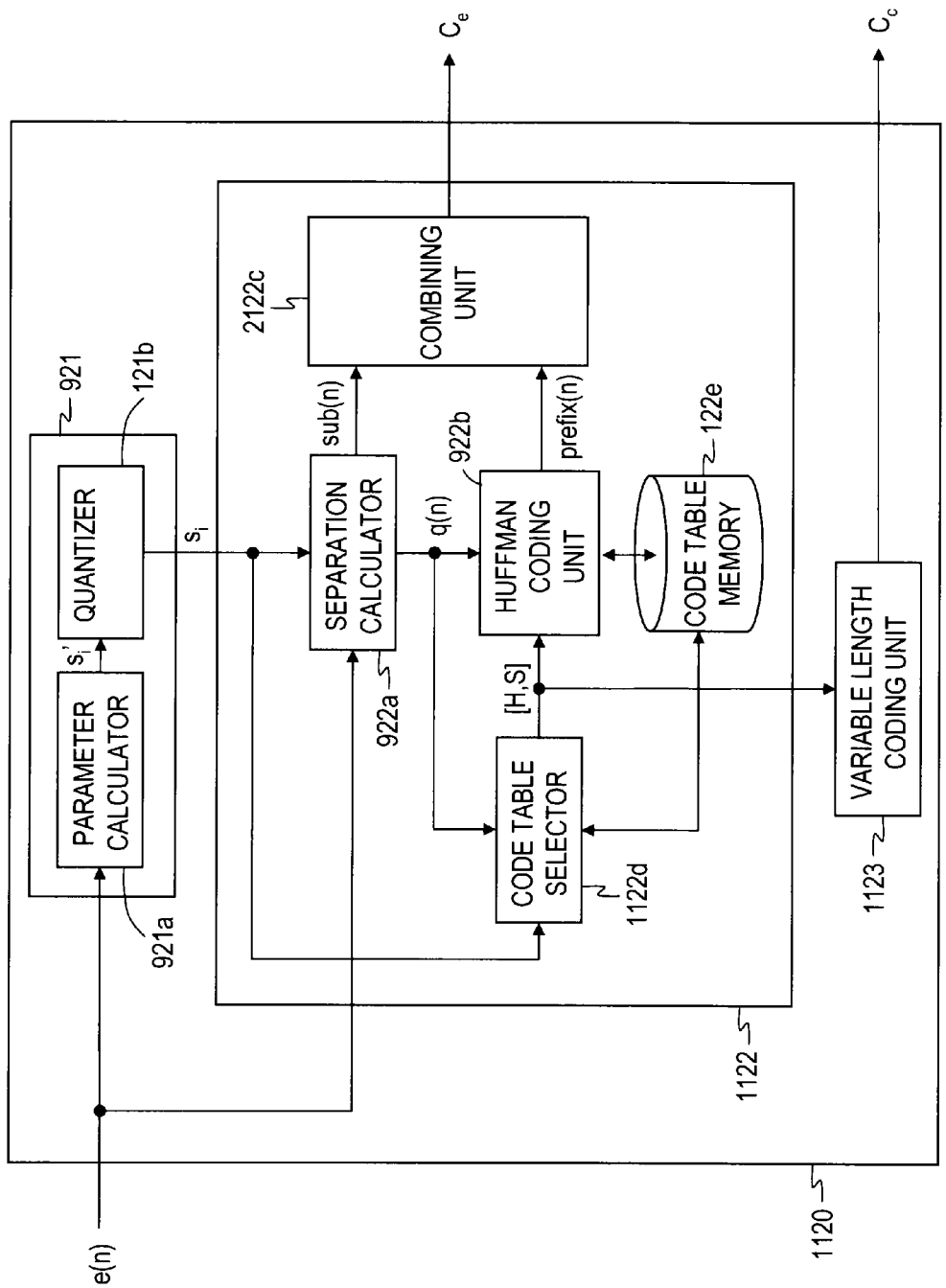
FIG. 40 is a block diagram illustrating the functional configuration of a residual encoding unit in a fourth embodiment.
Figure 41:
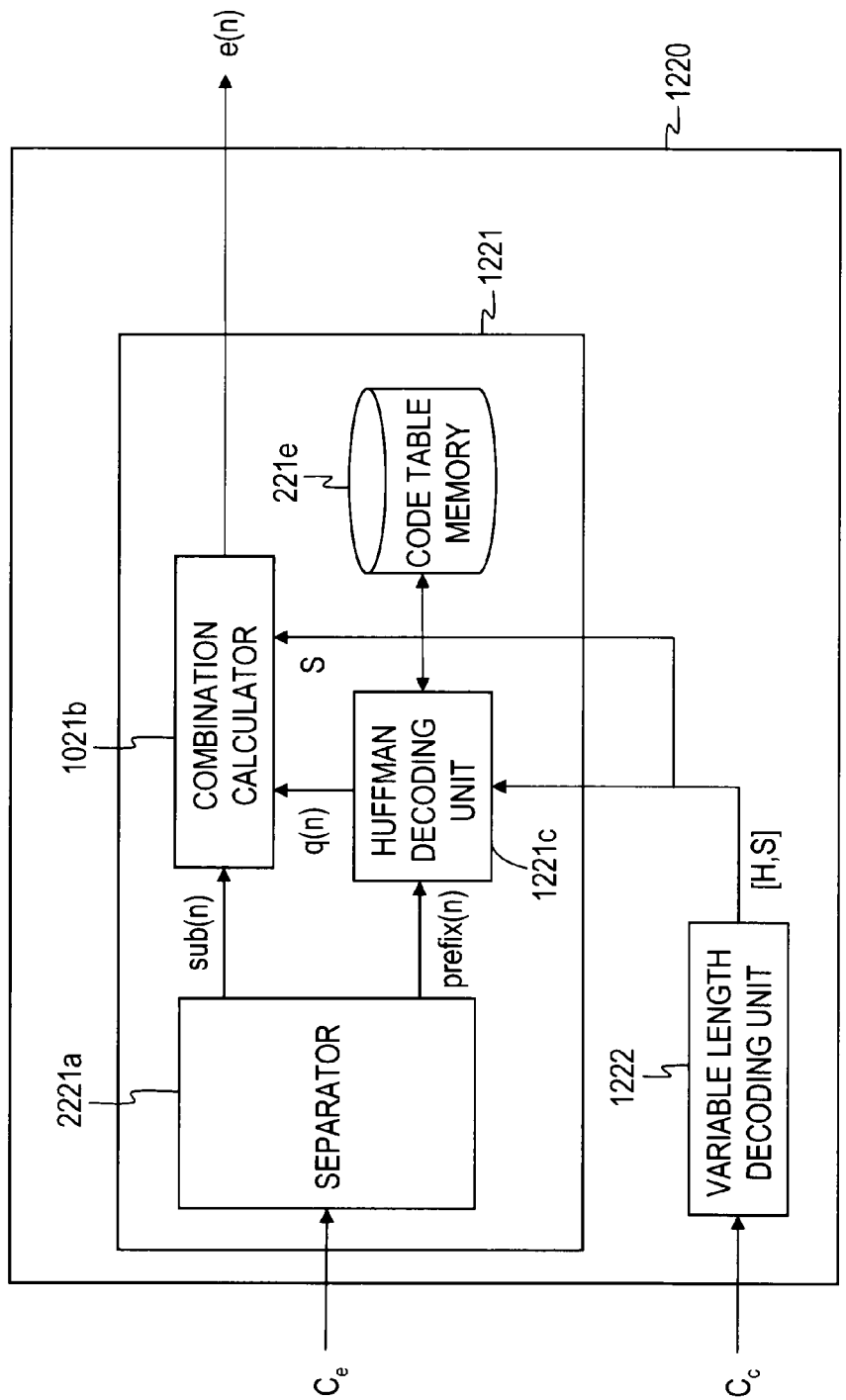
FIG. 41 is a block diagram illustrating the functional configuration of a residual decoding unit in the fourth embodiment.

FIG. 40 shows a block diagram illustrating the functional configuration of the residual encoding unit 1120 in the fourth embodiment, and FIG. 41 shows a block diagram illustrating the functional configuration of the residual decoding unit 1220 in the fourth embodiment. In those figures, components identical to those in the first to third embodiments are denoted by the same reference numerals as used in the first to third embodiments, and a description of those components will be omitted.

As shown in FIG. 40, the residual encoding unit 1120 includes a separation parameter generator 921, an encoding unit 1122, and a variable length coding unit 1123. The encoding unit 1122 includes a separation calculator 922a, a combining unit 2122c, a Huffman coding unit 922b, a code table selector 1122d, and a code table memory 122e.

As shown in FIG. 41, the residual decoding unit 1220 includes a decoding unit 1221 and a variable length decoding unit 1222. The decoding unit 1221 includes a separator 2221a, a combination calculator 1021b, a Huffman decoding unit 1221c, and a code table memory 221e.

<Pre-Processing>

As described earlier, in this embodiment, the side information [H, S] containing the combination of the connected parameter S=$s_1|s_2$, formed by connecting the respective separation parameters $s_i$ (i=1, 2) decided in the respective subframes in the same frame and the connected index H=$h_1|h_2$, formed by connecting the respective indices $h_i$ (i=1, 2) for identifying the respective coding schemes selected for the respective subframes in the same frame is subjected to variable length coding.

As described in the second and third embodiments, the frequency distribution of each of the connected parameter S and the connected index is uneven.

FIG. 42 is a view showing an example of the relationship among the frequency of the code table used for performing variable length coding of the quotients q(n), selected by the code table selector 1122d of the residual encoding unit 1120 in each subframe, the separation parameter $s_i$, and the index $h_i$. In FIG. 42, the frequency at which the code table T[$h_1$, $s_1$] is selected in the first subframe and also the code table T[$h_2$, $s_2$] is selected in the second subframe is indicated in a box determined by the connected index H=$h_1|h_2$ and the connected parameter S. Each frequency is symbolized in the same way as in the first embodiment.

This embodiment assumes the following, for example: the dividends are integers not smaller than 0 and smaller than $2^8$ (integers expressed by eight bits); the separation parameter $s_i$ can range from 0 to 7 both inclusive; and the separation parameter $s_i$ that can be decided is limited to 0, 1, or 2. It is also assumed that the frequency at which the separation parameter $s_i$ at a first distance from 2 is selected is higher than the frequency at which the separation parameter at a second distance from 2 is selected, the second distance being greater than the first distance. It is assumed that the value of the index $h_i$ in this embodiment decreases as the corresponding code table T[$h_i$, $s_1$] gets closer to the code table for performing variable length coding identical to Alpha coding, and the value increases as the corresponding code table gets farther from the code table for performing variable length coding identical to Alpha coding.

That type of frequency distribution is trained in advance, and a code table for an optimum variable length coding scheme for encoding the side information [H, S] is set in the variable length coding unit 1123 and the variable length decoding unit 1222, in accordance with the frequency distribution of the side information [H, S] containing the combination of the connected parameter S and the connected index H.

The optimum variable length coding scheme for encoding the side information [H, S] assigns a shorter code to side information [H, S] of higher frequency and assigns a longer code to side information [H, S] of lower frequency. In the situation described earlier, that type of coding scheme is a variable length coding scheme having the two characteristics described below.

The code length of a first code being shorter than the code length of a second code is more frequent than the code length of the first code being longer than the code length of the second code. The first code in this example is assigned to side information [H, S] that includes the separation parameter $s_i$ at a first distance from 2 (corresponding to a predetermined specific value). The second code in this example is assigned to side information [H, S] that includes a separation parameter $s_i$ at a second distance from 2 (corresponding to the predetermined specific value). The second distance is greater than the first distance.

When the separation parameter $s_i$ is 2 or greater (corresponding to when the modulus is not smaller than a predetermined threshold), the code length of a third code being shorter than the code length of a fourth code is more frequent than the code length of the third code being longer than the code length of the fourth code. The fourth code is assigned to side information [H, S] that includes the index $h_1$ or $h_2$ for identifying a first coding scheme for performing first variable length coding that differs from Alpha coding. The third code is assigned to the side information [H, S] that includes the index $h_1$ or $h_2$ for identifying a second coding scheme for performing second variable length coding that is closer to Alpha coding than the first variable length coding.

<Encoding Method>

Figure 43:
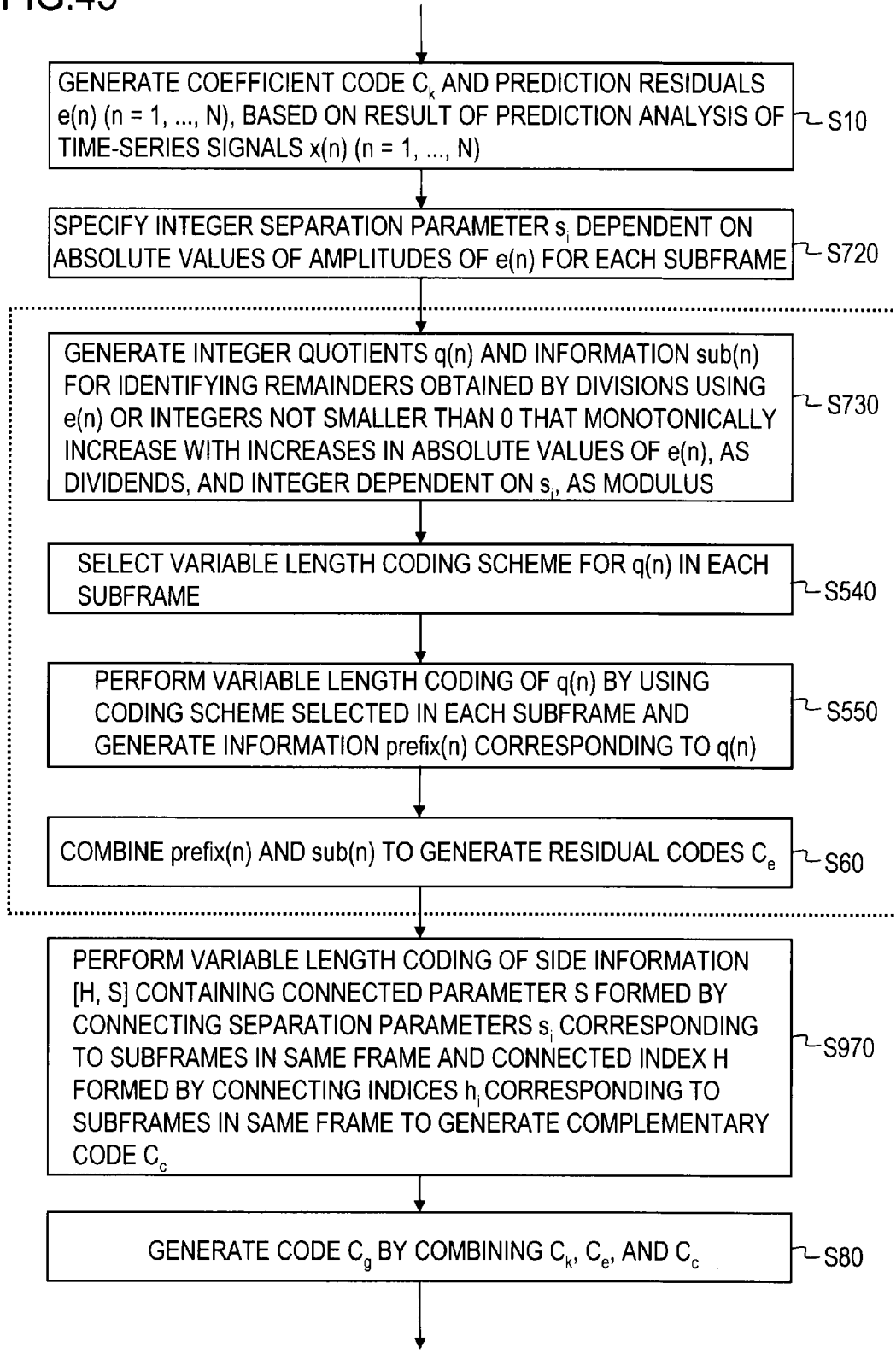
FIG. 43 is a flowchart illustrating an encoding method according to the fourth embodiment.

FIG. 43 is a flowchart illustrating the encoding method in the fourth embodiment. The encoding method in the embodiment will be described next with reference to the figure.

First the processing of step S10 described in the first embodiment is executed, and then the processing of steps S720 and S730 described in the third embodiment is executed. Next the processing of steps S540 and S550 described in the second embodiment is executed, and then the processing of step S60 described in the first embodiment is executed. The connected parameter S formed by connecting the respective separation parameters $s_i$ generated for the respective subframes in the same frame and the connected index H formed by connecting the respective indices $h_i$ for identifying the respective coding schemes selected for the respective subframes in the same frame are output from the code table selector 1122d and input to the variable length coding unit 1123. The variable length coding unit 1123 performs variable length coding of each piece of the side information [H, S] containing the connected parameter S and the connected index H, generates a complementary code $C_c$ corresponding to the side information [H, S], and outputs the code (step S970). Then, the processing of step S80 described in the first embodiment is executed.

<Decoding Method>

Figure 44:
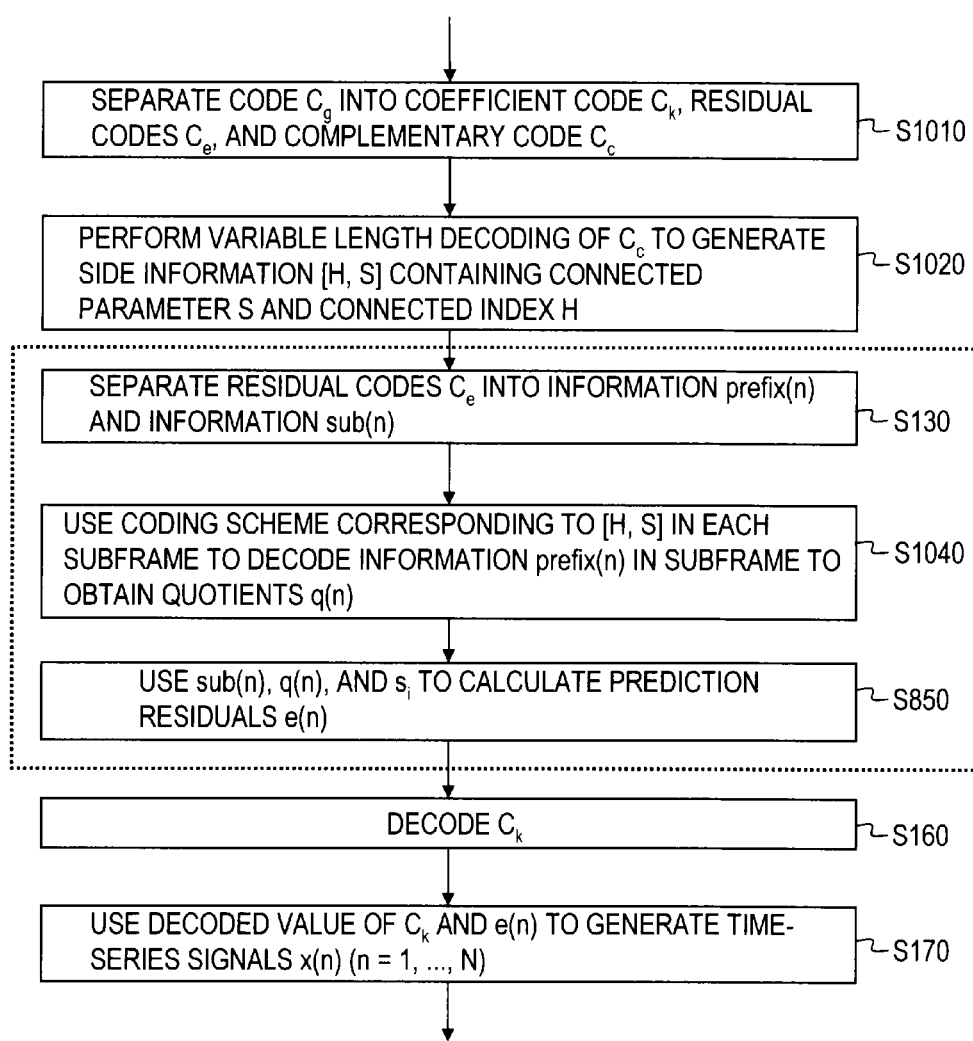
FIG. 44 is a flowchart illustrating a decoding method according to the fourth embodiment.

FIG. 44 is a flowchart illustrating the decoding method in the fourth embodiment. The decoding method in this embodiment will be described next with reference to the figure.

The separator 1210 of the decoder 200 (FIG. 8) separates the code $C_g$ input to the decoder 200 into the coefficient code $C_k$ corresponding to the coefficients, the residual codes $C_e$ corresponding to the prediction residuals e(n), and the complementary code $C_c$ corresponding to the side information [H, S] (step S1010). The complementary code $C_c$ corresponding to the side information [H, S] is input to the variable length decoding unit 1222. The variable length decoding unit 1222 performs variable length decoding of the complementary code $C_c$ by using the code table set as described earlier, generates the side information [H, S] including the connected parameter S and the connected index H, and outputs it (step S1020).

The processing of step S130 described in the first embodiment is executed, and then the side information [H, S] output from the variable length decoding unit 1222 and the information prefix(n) output from the separator 2221a are input to the Huffman decoding unit 1221c. The Huffman decoding unit 1221c searches through the code table memory 221e by using the side information [H, S] and extracts code tables $T[h_1, s_1]$ and $T[h_2, s_2]$ corresponding to the side information [H, S]. The Huffman decoding unit 1021c decodes the information prefix(n), by using the extracted code tables $T[h_1, s_1]$ and $T[h_2, s_2]$ to generate quotients q(n) and output them (step S1040). The information prefix(n) of the first subframe is decoded by using the code table $T[h_i, s_1]$ to generate quotients q(n); and the information prefix(n) of the second subframe is decoded by using the code table $T[h_2, s_2]$ to generate quotients q(n). Then, the processing of step S850 described in the third embodiment is executed, and the processing of steps S160 and S170 described in the first embodiment is executed.

[Other Modifications]

The present invention is not limited to the embodiments described above. In the embodiments described above, each piece of the side information containing the combination of the separation parameter and the index, the side information containing the combination of the separation parameter and the connected index, the side information containing the connected parameter and the index, the side information containing the combination of the connected parameter and the connected index, and the like is subjected to variable length coding. However, each piece of side information that includes a separation parameter and no index, side information that includes the index and no separation parameter, or the like may be subjected to variable length coding. For example, a Huffman code of the separation parameter and a Huffman code of the index may be generated separately, and the combination of the Huffman codes may be used as a code corresponding to the side information. If the frame is divided into subframes, the combination of a Huffman code of the separation parameter and a Huffman code of the index generated separately for the first subframe may be used as the code corresponding to the side information for the first subframe, and the combination of a Huffman code of the separation parameter and a Huffman code of the index generated separately for the second subframe may be used as the code corresponding to the side information for the second subframe.

The embodiments described above and their modifications may be combined. For example, the first to third modifications of the first embodiment may be applied to the second to fourth embodiments; the first to third modifications may be combined; or the combination may be applied to the second to fourth embodiments.

In the embodiments described above, the side information that includes the index for identifying a code table, such as a Huffman code table, is subjected to variable length coding. However, if the quotients q(n) are encoded by a variable length coding scheme that does not require a code table, such as Alpha coding, side information that includes an index for identifying the encoding scheme may be subjected to variable length coding, instead of the side information that includes the index for identifying the code table.

In the embodiments described above, a Rice parameter is used as the separation parameter. Since the system allows the quotients q(n) to be encoded by a variable length coding scheme that has higher flexibility than Alpha coding, the amount of code corresponding to the prediction residuals e(n) may be reduced by using, as the separation parameter, a value smaller than the Rice parameter of the Golomb-Rice coding scheme, which limits the coding scheme of the quotients q(n) to Alpha coding. Therefore, the separation parameters decided in some time segments, at least, may have smaller values than the optimum Rice parameters for the same time segments. For example, the separation parameters may be obtained by subtracting a predetermined integer (such as "1") from the Rice parameter. Conversely, the separation parameter may be obtained by adding a predetermined integer (such as "1") to the Rice parameter.

In the embodiments described above, when the separation parameter is s, the modulus of the divisions in the separation calculator is $2^s$ or $2^{s-1}$. However, the separation parameter may be $2^s$ or $2^{s-1}$, and the separation parameter may be the modulus of the divisions in the separation calculator. In the embodiments described above, the separation parameter s is an integer. However, the separation parameter s may be a real value that can take a value other than an integer. For example, the continuous-quantity parameter s' may be handled as a separation parameter. The processing illustrated in FIG. 14B or FIG. 16 may be executed by using the continuous-quantity parameter s' instead of the integer separation parameter s. If the separation parameter s is a real value that can take a value other than an integer, sg=floor(s) may be decided, and $2^{sg}$ or $2^{sg-1}$ may be used as the modulus of the divisions in the separation calculator.

In the embodiments described above, in encoding, an optimum separation parameter is decided first, and then by using the decided separation parameter, the separation calculator performs divisions to obtain quotients q(n) and information sub(n) that identifies the remainders. However, a configuration may be used in which each separation parameter is selected one after another from a predetermined set of integers, the separation calculator performs divisions by using each separation parameter to obtain quotients q(n) and information sub(n) for identifying the remainders, the sum of the information amount of the quotients q(n) and the information sub(n) is obtained for each separation parameter, and the separation parameter with the smallest sum is adopted.

In the embodiments described above, the present invention is applied when the prediction residuals obtained from the result of linear prediction analysis of the time-series signals are encoded. The present invention may be applied when encoding prediction residuals obtained from the result of long-term prediction analysis, such as pitch prediction analysis, inter-channel prediction analysis, a combination of linear prediction analysis and long-term prediction analysis, a combination of linear prediction analysis, long-term prediction analysis, and inter-channel prediction analysis, and a combination of linear prediction analysis and inter-channel prediction analysis (refer, for example, to Yutaka Kamamoto, Takehiro Moriya, Takuya Nishimoto, and Shigeki Sagayama, "Lossless Compression of Multi-Channel Signals Using Inter-Channel Correlation," IPSJ Journal, Vol. 46, pp. 1118-1128, May 2005, and Yutaka Kamamoto, Takehiro Moriya, Noboru Harada, Takuya Nishimoto, and Shigeki Sagayama, "Intra- and Inter-Channel Long-Term Prediction in ISO/IEC MPEG-4 Audio Lossless Coding (ALS)," IEICE Trans. on Communications, Vol. J89-B, No. 2, pp. 214-222, 2006).

The processing described above may be executed in the order described above not only time sequentially but also in parallel or independently, depending on necessity or on the processing capability of the device executing the processing. It is a matter of course that other suitable modifications can be made within the scope of the present invention.

When the configuration described above is implemented by a computer, the processing of the function to be provided by each unit is written as a program. When the program is executed on the computer, the processing function is implemented on the computer.

The program describing the processing can be recorded on a computer-readable recording medium. The computer-readable recording medium can be a magnetic recording device, an optical disc, a magneto-optical recording medium, a semiconductor memory, and the like.

The program is distributed by selling, transferring, lending, or the like of a transportable recording medium such as a DVD or a CD-ROM on which the program is recorded. The program may be stored in a storage device of a server computer and distributed by transferring the program from the server computer to another computer through a network.

The computer that executes the program temporarily stores in its storage the program, recorded on the transportable recording medium or transferred from the server computer, for example. When executing the processing, the computer reads the program stored in its storage device and executes the processing in accordance with the read program. The computer may also read the program directly from the transportable recording medium and execute the processing in accordance with the program. Each time part of the program is transferred from the server computer, the computer may also execute the processing in accordance with that part of the program. The processing may be executed by a so-called application service provider (ASP) service, in which the server computer does not transfer the program but the processing function is implemented just by giving an execution instruction of the program and obtaining the result. The program here includes information prepared for use in processing by a computer and similar to a program (such as data that is not a direct command to the computer but define the processing performed by the computer).

The device is implemented here by executing a predetermined program on a computer. Part of the processing may also be implemented by hardware.

INDUSTRIAL APPLICABILITY

The range of industrial application of the present invention includes technologies for lossless compression coding and decoding of audio signals, for example. The present invention can also be applied to technologies for lossless coding and decoding of video signals, biological signals, seismic signals, and so on.

DESCRIPTION OF REFERENCE NUMERALS

100, 2100: Encoders
200, 2200: Decoders

What is claimed is:

1. An encoding method for encoding prediction residuals in integer representation generated on the basis of the result of prediction analysis of time-series signals, the encoding method comprising:
(A) a step of deciding, using a processor, a separation parameter for each given time segment;
(B) a step of outputting, as a code corresponding to the prediction residuals, information that includes first information identifying integer quotients obtained by divisions using the prediction residuals or integers not smaller than 0 that monotonically increase with increases in the amplitude of the prediction residuals, as dividends, and the separation parameter decided for the time segment corresponding to the prediction residuals or a mapped integer value of the separation parameter, as a modulus, and second information identifying the remainders obtained when the dividends are divided by the modulus; and (C) a step of outputting a code obtained by performing variable length coding of each piece of side information that includes the separation parameter;

wherein the separation parameter is a mapped value of a Rice parameter for performing Golomb-Rice coding of the prediction residuals corresponding to the time segment or mapped values of the prediction residuals;

the separation parameter decided for the time segment is smaller than the Rice parameter for performing Golomb-Rice coding of the prediction residuals corresponding to the time segment or of the mapped values of the prediction residuals; and the first information has codes each of which is obtained by performing variable length coding of each of the quotients with a variable length coding scheme selected from a plurality of variable length coding schemes, and the plurality of variable length coding schemes include variable length coding schemes other than an Alpha coding scheme.

2. An encoding method for encoding prediction residuals in integer representation generated on the basis of the result of prediction analysis of time-series signals, the encoding method comprising:

(A) a step of deciding, using a processor, a separation parameter for each given time segment;

(B) a step of outputting, as a code corresponding to the prediction residuals, information that includes first information identifying integer quotients obtained by divisions using the prediction residuals or integers not smaller than 0 that monotonically increase with increases in the amplitude of the prediction residuals, as dividends, and the separation parameter decided for the time segment corresponding to the prediction residuals or a mapped integer value of the separation parameter, as a modulus, and second information identifying the remainders obtained when the dividends are divided by the modulus; and (C) a step of outputting a code obtained by performing variable length coding of each piece of side information that includes the separation parameter, wherein conditions are satisfied in which the separation parameter is an integer that weakly increases with increases in amplitude of the prediction residuals, and the modulus is an integer that increases monotonically with an increase in the separation parameter, or conditions are satisfied in which the separation parameter is an integer that weakly decreases with increases in the amplitude of the prediction residuals, and the modulus is an integer that increases monotonically with a decrease in the separation parameter; and the step (C) has a step of performing variable length coding of the side information, by using a variable length coding scheme in which code length of a first code being shorter than code length of a second code is more frequent than the code length of the first code being longer than the code length of the second code, where the first code is assigned to side information that includes a separation parameter whose distance from a predetermined specific value is a first distance, and the second code is assigned to side information that includes a separation parameter whose distance from the predetermined specific value is a second distance being greater than the first distance.

3. The encoding method according to claim 2, wherein the predetermined specific value is within a possible range of the separation parameter that brings the modulus to a value not smaller than 1 and not greater than the maximum value of the dividends; and the predetermined specific value is a value other than the lower limit value or the upper limit value in the possible range of the separation parameter.

4. The encoding method according to claim 3, wherein the dividends are integers not smaller than 0 and smaller than $2^B$ where B is an integer not smaller than 3; and the possible range of the separation parameter is from 0 to B−1 both inclusive.

5. The encoding method according to claim 2, wherein the predetermined specific value is within a possible range of the separation parameter that brings the modulus to a value not smaller than 1 and not greater than the maximum value of the dividends; and the predetermined specific value is closer to an intermediate value between the lower limit value and the upper limit value in the possible range of the separation parameter than the lower limit value or the upper limit value.

6. The encoding method according to claim 5, wherein the dividends are integers not smaller than 0 and smaller than $2^B$ where B is an integer not smaller than 3; and the possible range of the separation parameter is from 0 to B−1 both inclusive.

7. The encoding method according to claim 2, wherein the possible range of the separation parameter is from 0 to 7 both inclusive; and the predetermined specific value is 2 or 3.

8. The encoding method according to any one of claims 1 to 7, wherein the prediction residuals are obtained from the result of prediction analysis of the time-series signals in each frame, which is a predetermined time segment;

the step (A) is a step of deciding respective separation parameters in respective subframes, which are time segments subdivided from the frame;

the modulus of the divisions is each of the separation parameters decided for the subframes corresponding to the prediction residuals or each mapped integer value of each of the separation parameters; and the side information includes a connected parameter formed by connecting the separation parameters decided for different subframes included in the same frame.

9. The encoding method according to any one of claims 1 to 7, wherein the first information has codes which are obtained by performing variable length coding of the quotients;

the step (B) comprises:

(B-1) a step of obtaining the quotients;

(B-2) a step of selecting each coding scheme for performing variable length coding of the quotients for each predetermined time segment; and (B-3) a step of generating the first information through variable length coding of the quotients, by using the coding scheme selected for the time segment to which the prediction residuals corresponding to the quotients belong; and the side information includes a combination of the separation parameter and an index for identifying the coding scheme selected in the step (B-2).

10. The encoding method according to claim 9, wherein the step (C) comprises a step of performing variable length coding of a plurality of pieces of side information having the separation parameter of an identical value, by using a specific variable length coding scheme;

the specific variable length coding scheme assigns a code having smallest length among codes assigned respectively to the plurality of pieces of the side information having the separation parameter of the identical value, to specific side information among the plurality of pieces of the side information having the separation parameter of the identical value; and the specific side information includes an index for identifying a coding scheme for performing Alpha coding or variable length coding closest to Alpha coding.

11. The encoding method according to claim 10, wherein given variable length coding is closer to Alpha coding as the sum of (bu(k)−bx(k))(fu(k)−(fx(k)) corresponding to values k to be encoded is smaller, where bu(k) is bit length of a code assigned to a value k to be encoded by Alpha coding, bx(k) is bit length of a code assigned to a value k to be encoded by the given variable length coding, fu(k) equals $0.5^{bu(k)}$, and fx(k) equals $0.5^{bx(k)}$.

12. The encoding method according to claim 9, wherein the step (C) has a step of performing variable length coding of the side information by using a variable length coding scheme in which code length of a third code being smaller than code length of a fourth code is more frequent than the code length of the third code being longer than the code length of the fourth code, when the separation parameter brings the modulus to a value not smaller than a predetermined threshold;

the fourth code is assigned to side information that includes an index for identifying a first coding scheme for performing first variable length coding differing from Alpha coding; and the third code is assigned to side information that includes an index for identifying a second coding scheme for performing second variable length coding closer to Alpha coding than the first variable encoding.

13. The encoding method according to claim 12, wherein given variable length coding is closer to Alpha coding as the sum of (bu(k)−bx(k))(fu(k)−fx(k)) corresponding to values k to be encoded is smaller, where bu(k) is bit length of a code assigned to a value k to be encoded by Alpha coding, bx(k) is bit length of a code assigned to a value k to be encoded by the given variable length coding, fu(k) equals $0.5^{bu(k)}$, and fx(k) equals $0.5^{bx(k)}$.

14. The encoding method according to claim 9, wherein the prediction residuals are obtained from the result of prediction analysis of the time-series signals in each frame, which is a predetermined time segment;

the step (B-2) is a step of selecting each coding scheme for each subframe, which is a time segment subdivided from the frame;

the step (B-3) is a step of generating the first information through variable length coding of the quotients by using the coding scheme decided for the subframe to which the prediction residuals corresponding to the quotients belong; and the side information includes a combination of the separation parameter and a connected index, the connected index being formed by connecting indices for identifying coding schemes selected for different subframes included in the same frame.

15. The encoding method according to claim 14, wherein the step (C) comprises a step of performing variable length coding of side information having the separation parameter of an identical value, by using a variable length coding scheme which assigns a code having the smallest length among codes assigned respectively to pieces of side information having the separation parameter of the identical value, to side information having an index for identifying a coding scheme for performing Alpha coding or variable length coding closest to Alpha coding, among the side information having the separation parameter of the identical value.

16. The encoding method according to claim 14, wherein the step (C) has a step of performing variable length coding of the side information by using a variable length coding scheme in which code length of a third code being shorter than code length of a fourth code is more frequent than the code length of the third code being longer than the code length of the fourth code, when the separation parameter brings the modulus to a value not smaller than a predetermined threshold;

the fourth code is assigned to side information that includes an index for identifying a first coding scheme for performing first variable length coding differing from Alpha coding; and the third code is assigned to side information that includes an index for identifying a second coding scheme for performing second variable length coding closer to Alpha coding than the first variable length coding.

17. An encoding method for encoding prediction residuals in integer representation generated on the basis of the result of prediction analysis of time-series signals, the encoding method comprising:

a step of deciding, using a processor, a separation parameter for each given time segment; and a step of outputting a code obtained by performing variable length coding of each piece of side information that includes the separation parameter, wherein the separation parameter decided for the time segment is smaller than a Rice parameter for performing Golomb-Rice coding of the prediction residuals corresponding to the time segment or of mapped values of the prediction residuals.

18. An encoder for encoding prediction residuals in integer representation generated on the basis of the result of prediction analysis of time-series signals, the encoder comprising:

an encoding unit for deciding an integer separation parameter for each given time segment, and outputting, as a code corresponding to the prediction residuals, information that includes first information identifying integer quotients obtained from divisions using the prediction residuals or integers not smaller than 0 that monotonically increase with increases in the amplitude of the prediction residuals, as dividends, and the separation parameter decided for the time segment corresponding to the prediction residuals or a mapped integer value of the separation parameter, as a modulus, and second information identifying the remainders obtained when the dividends are divided by the modulus; and a variable length coding unit for outputting a code obtained by performing variable length coding of each piece of side information that includes the separation parameter:

wherein the separation parameter is a mapped value of a Rice parameter for performing Golomb-Rice coding of the prediction residuals corresponding to the time segment or mapped values of the prediction residuals;

the separation parameter decided for the time segment is smaller than the Rice parameter for performing Golomb-Rice coding of the prediction residuals corresponding to the time segment or of the mapped values of the prediction residuals; and the first information has codes each of which is obtained by performing variable length coding of each of the quotients with a variable length coding scheme selected from a plurality variable length coding schemes, and the plurality variable length coding schemes include variable length coding schemes other than an Alpha coding scheme.

19. An encoder for encoding prediction residuals in integer representation generated on the basis of the result of prediction analysis of time-series signals, the encoder comprising:
an encoding unit for deciding a separation parameter for each given time segment; and
a variable length coding unit for outputting a code obtained by performing variable length coding of each piece of side information that includes the separation parameter, wherein the separation parameter decided for the time segment is smaller than a Rice parameter for performing Golomb-Rice coding of the prediction residuals corresponding to the time segment or of mapped values of the prediction residuals.

20. An encoding method for encoding prediction residuals in integer representation generated on the basis of the result of prediction analysis of time-series signals, the encoding method comprising:
(A) a step of deciding, using a processor, a separation parameter for each given time segment;
(B) a step of outputting, as a code corresponding to the prediction residuals, information that includes first information identifying integer quotients obtained by divisions using the prediction residuals or integers not smaller than 0 that monotonically increase with increases in the amplitude of the prediction residuals, as dividends, and the separation parameter decided for the time segment corresponding to the prediction residuals or a mapped integer value of the separation parameter, as a modulus, and second information identifying the remainders obtained when the dividends are divided by the modulus; and
(C) a step of outputting a code obtained by performing variable length coding of each piece of side information that includes the separation parameter, wherein the first information has codes which are obtained by performing variable length coding of the quotients;
the step (B) comprises:
(B-1) a step of obtaining the quotients;
(B-2) a step of selecting each coding scheme for performing variable length coding of the quotients for each predetermined time segment; and
(B-3) a step of generating the first information through variable length coding of the quotients, by using the coding scheme selected for the time segment to which the prediction residuals corresponding to the quotients belong; and
the side information includes a combination of the separation parameter and an index for identifying the coding scheme selected in the step (B-2).

21. The encoding method according to claim 20, wherein the step (C) comprises a step of performing variable length coding of a plurality of pieces of side information having the separation parameter of an identical value, by using a specific variable length coding scheme;
the specific variable length coding scheme assigns a code having smallest length among codes assigned respectively to the plurality of pieces of the side information having the separation parameter of the identical value, to specific side information among the plurality of pieces of the side information having the separation parameter of the identical value; and
the specific side information includes an index for identifying a coding scheme for performing Alpha coding or variable length coding closest to Alpha coding.

22. The encoding method according to claim 21, wherein given variable length coding is closer to Alpha coding as the sum of $(bu(k)-bx(k))(fu(k)-(fx(k))$ corresponding to values k to be encoded is smaller, where bu(k) is bit length of a code assigned to a value k to be encoded by Alpha coding, bx(k) is bit length of a code assigned to a value k to be encoded by the given variable length coding, fu(k) equals $0.5^{bu(k)}$, and fx(k) equals $0.5^{bx(k)}$.

23. The encoding method according to claim 20, wherein the step (C) has a step of performing variable length coding of the side information by using a variable length coding scheme in which code length of a third code being smaller than code length of a fourth code is more frequent than the code length of the third code being longer than the code length of the fourth code, when the separation parameter brings the modulus to a value not smaller than a predetermined threshold;
the fourth code is assigned to side information that includes an index for identifying a first coding scheme for performing first variable length coding differing from Alpha coding; and
the third code is assigned to side information that includes an index for identifying a second coding scheme for performing second variable length coding closer to Alpha coding than the first variable encoding.

24. The encoding method according to claim 23, wherein given variable length coding is closer to Alpha coding as the sum of $(bu(k)-bx(k))(fu(k)-fx(k))$ corresponding to values k to be encoded is smaller, where bu(k) is bit length of a code assigned to a value k to be encoded by Alpha coding, bx(k) is bit length of a code assigned to a value k to be encoded by the given variable length coding, fu(k) equals $0.5^{bu(k)}$, and fx(k) equals $0.5^{bx(k)}$.

25. The encoding method according to claim 20, wherein the prediction residuals are obtained from the result of prediction analysis of the time-series signals in each frame, which is a predetermined time segment;
the step (B-2) is a step of selecting each coding scheme for each subframe, which is a time segment subdivided from the frame;
the step (B-3) is a step of generating the first information through variable length coding of the quotients by using the coding scheme decided for the subframe to which the prediction residuals corresponding to the quotients belong; and
the side information includes a combination of the separation parameter and a connected index, the connected index being formed by connecting indices for identifying coding schemes selected for different subframes included in the same frame.

26. The encoding method according to claim 25, wherein the step (C) comprises a step of performing variable length coding of side information having the separation parameter of an identical value, by using a variable length coding scheme which assigns a code having the smallest length among codes assigned respectively to pieces of side information having the separation parameter of the identical value, to side information having an index for identifying a coding scheme for performing Alpha coding or variable length coding closest to Alpha coding, among the side information having the separation parameter of the identical value.

27. The encoding method according to claim 25, wherein the step (C) has a step of performing variable length coding of the side information by using a variable length coding scheme in which code length of a third code being shorter than code length of a fourth code is more frequent than the code length of the third code being longer than the code length of the fourth code, when the separation parameter brings the modulus to a value not smaller than a predetermined threshold;
  the fourth code is assigned to side information that includes an index for identifying a first coding scheme for performing first variable length coding differing from Alpha coding; and
  the third code is assigned to side information that includes an index for identifying a second coding scheme for performing second variable length coding closer to Alpha coding than the first variable length coding.

28. A non-transitory computer-readable recording medium having stored a program for making a computer execute the steps of the encoding method according to claim 1, 17 or 20.

* * * * *